United States Patent [19]

Asano et al.

[11] Patent Number: 5,572,710
[45] Date of Patent: Nov. 5, 1996

[54] HIGH SPEED LOGIC SIMULATION SYSTEM USING TIME DIVISION EMULATION SUITABLE FOR LARGE SCALE LOGIC CIRCUITS

[75] Inventors: Shigehiro Asano; Shouzou Isobe; Jiro Amemiya; Hirofumi Muratani, all of Kanagawa-ken, Japan

[73] Assignee: Kabushiki Kaisha Toshiba, Kawasaki, Japan

[21] Appl. No.: 120,220

[22] Filed: Sep. 13, 1993

[30] Foreign Application Priority Data

Sep. 11, 1992 [JP] Japan .................................. 4-243755
Mar. 31, 1993 [JP] Japan .................................. 5-073988

[51] Int. Cl.$^6$ .............................. G06F 17/00; G06F 9/455
[52] U.S. Cl. .......................... 395/500; 395/920; 395/921; 364/488; 364/491; 371/22.2
[58] Field of Search .................................. 364/488, 489, 364/490, 491, 578; 340/825.83, 825.86, 825.87, 826; 371/22.2, 16.2, 21.5, 21.6; 395/908, 919, 920, 921, 500

[56] References Cited

U.S. PATENT DOCUMENTS

| | | | |
|---|---|---|---|
| 4,697,241 | 9/1987 | Lavi | 364/488 |
| 5,036,473 | 7/1991 | Butts et al. | 364/489 |
| 5,109,353 | 4/1992 | Sample et al. | 364/578 |
| 5,282,147 | 1/1994 | Goetz et al. | 364/489 |
| 5,311,442 | 5/1994 | Fukushima | 364/488 |
| 5,329,470 | 7/1994 | Sample et al. | 364/578 |
| 5,381,343 | 1/1995 | Bamji et al. | 364/491 |

FOREIGN PATENT DOCUMENTS 2-245831  10/1990  Japan .

OTHER PUBLICATIONS

Gutberlet et al., "Automatic Module Allocation in High Level Synthesis", IEEE 1992, pp. 328–333.
Lauwereins et al., "Parallel Processing Enables the Real-Time Emulation of DSP", IEEE 1991, pp. 65–74.
Thaler et al.,"A data flow Technique for the Efficient Design of a Class of Parallel Non–Data Flow Signal Processors". IEEE 1990, pp. 2162–2173.

Primary Examiner—Kevin J. Teska
Assistant Examiner—Tan Nguyen
Attorney, Agent, or Firm—Foley & Lardner

[57] ABSTRACT

A logic simulation system capable of handling a very large scale circuit while realizing a high speed simulation by retaining the parallelism of the simulation targets. The system includes: a host computer having data of the simulation target divided into a plurality of sections defining different simulation phases to be executed sequentially in time division; an emulator for emulating the simulation target, including: a plurality of programmable emulation chips for mapping the simulation target, each emulation chip having a memory with a plurality of memory banks provided in correspondence to the plurality of sections for registering mapping data specifying a function to be realized by each emulation chip in emulating each of the plurality of sections; a programmable network for interconnecting the plurality of emulation chips; and an emulation control unit for controlling the plurality of emulation chips and the network by sequentially switching the memory banks of the memory of each emulation chip and changing connections among the plurality of emulation chips provided by the network in emulating each of the plurality of sections; and an interface unit for interfacing the host computer and the emulator.

26 Claims, 55 Drawing Sheets

FIG.1
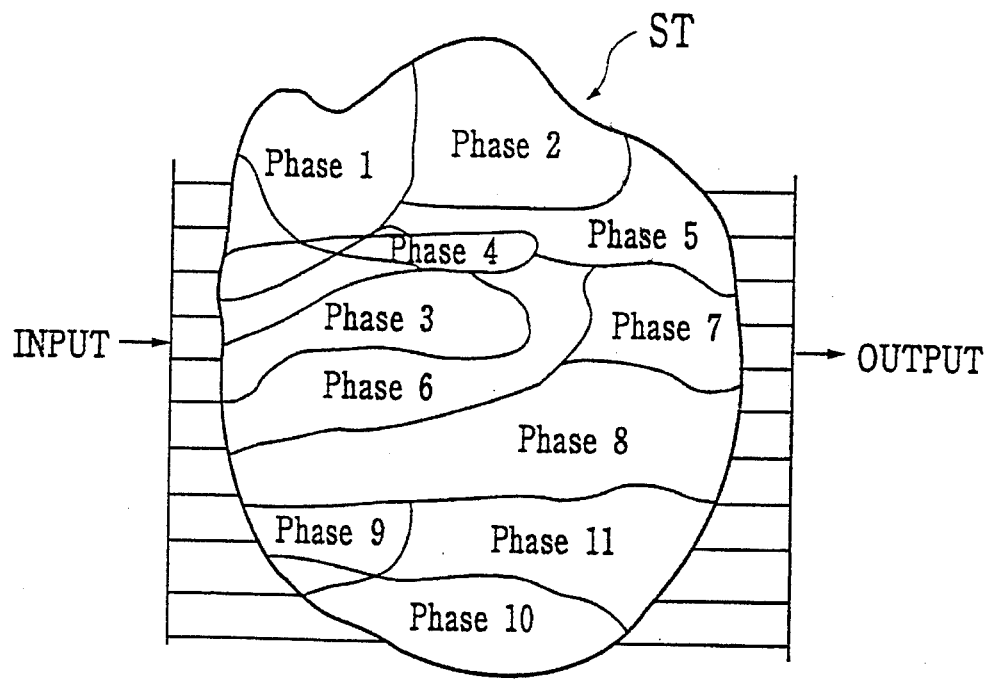
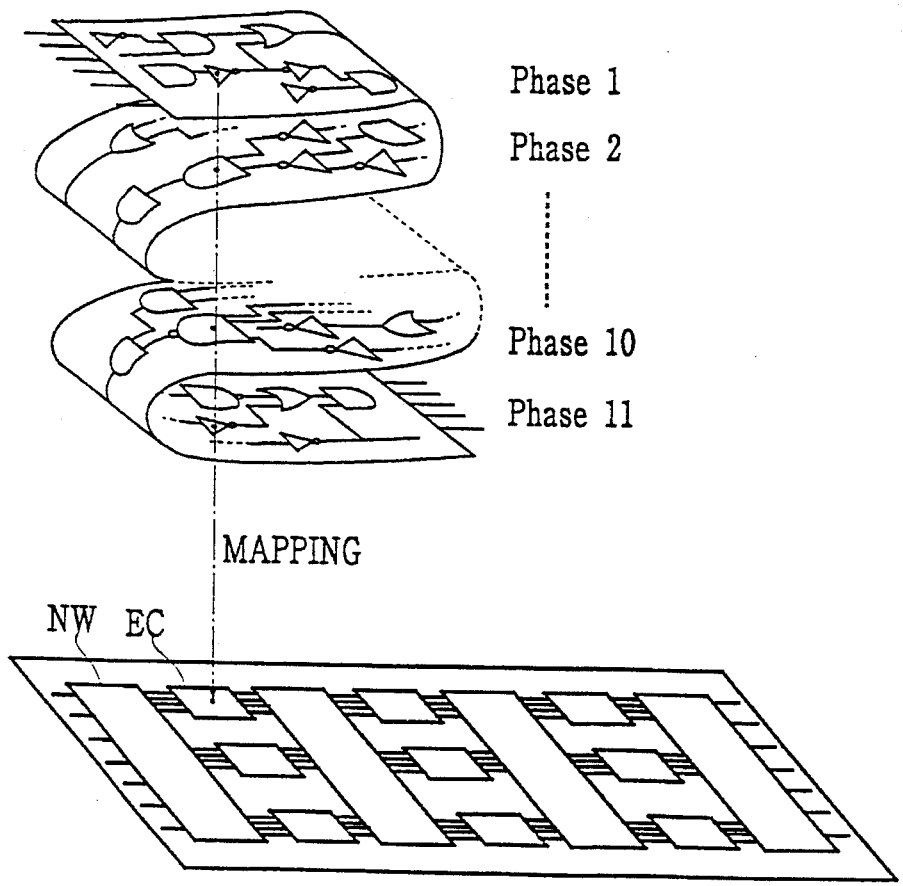

$F = (A \cdot B) \div (\overline{B+C})$
$G = I \cdot D \cdot (E+F)$

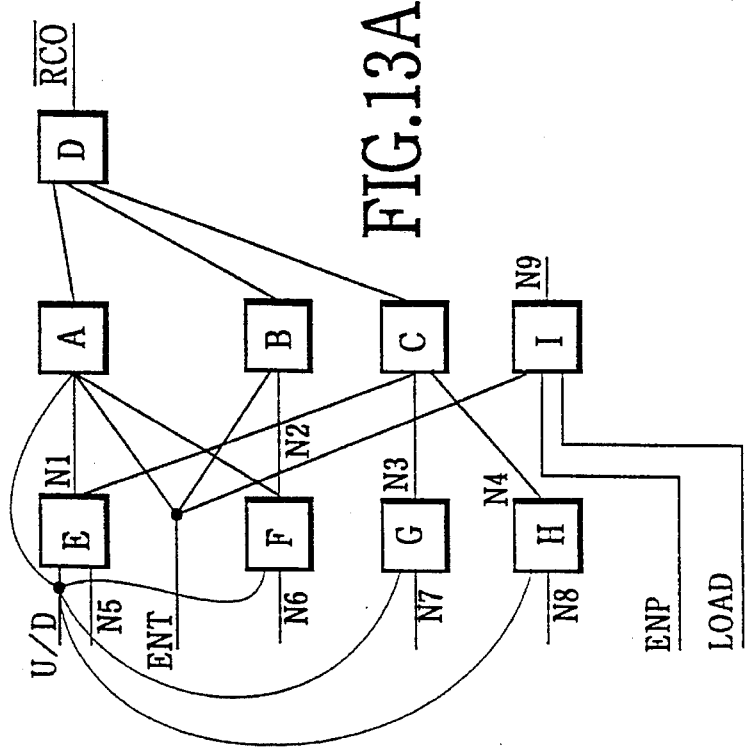
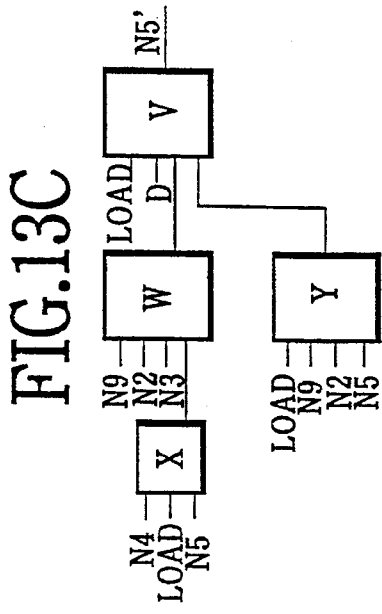
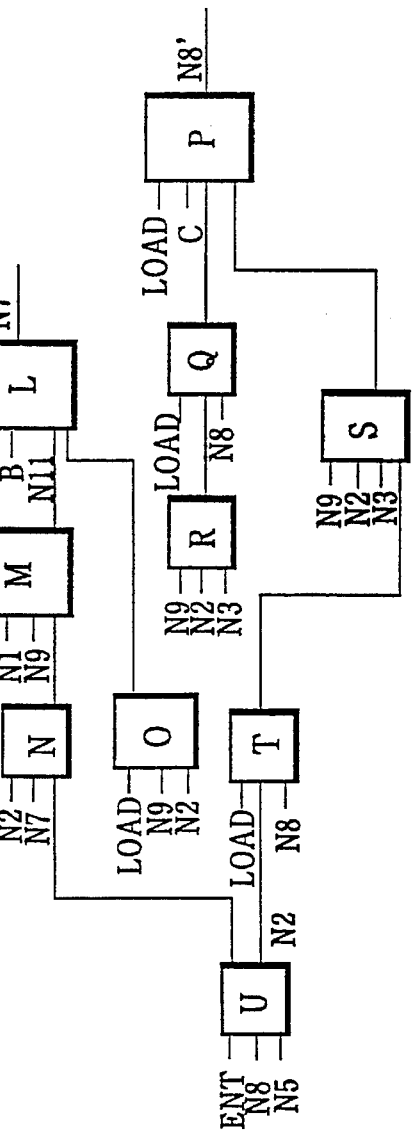

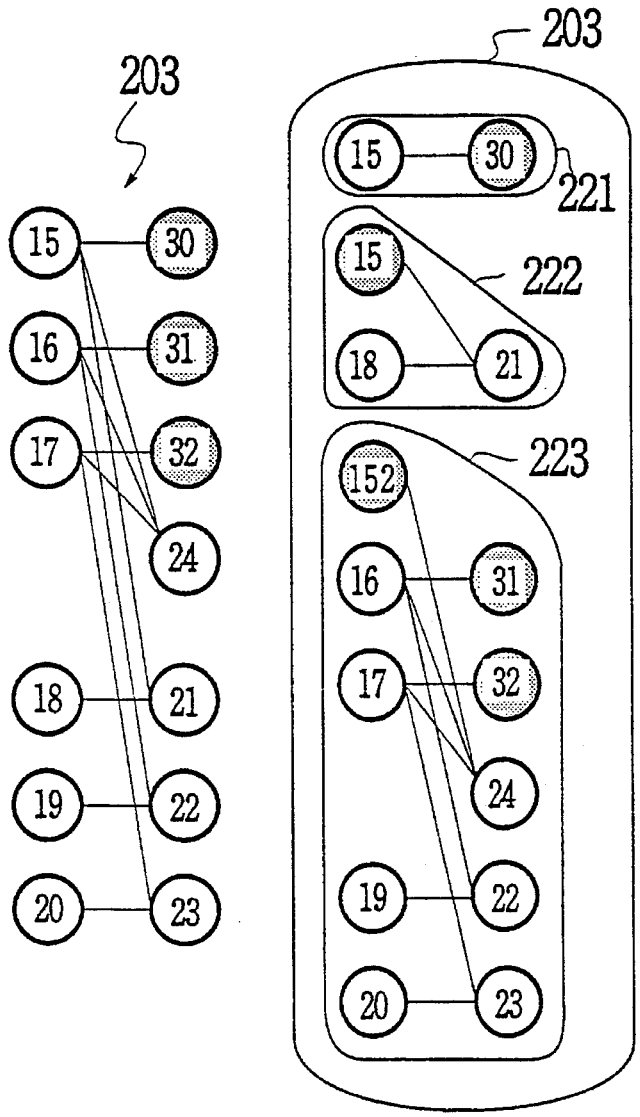
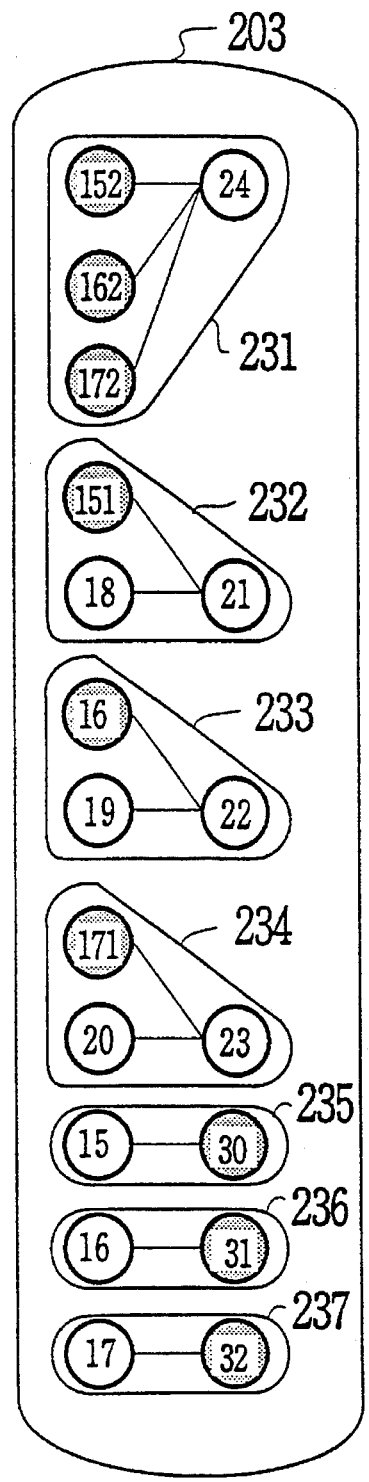
FIG. 37A  FIG. 37B  FIG. 37C

STRONGLY
CONNECTED
COMPONENTS of Invention

The present invention relates to a logic simulation system to be used for a simulation of logic circuits in designing and a verification of a digital system using logic circuits.

2. Description of the Background Art

In a large scale computer development project, the reduction of time and cost required for the development is becoming an increasingly important issue, and to this end, the verification of the functions and the performance of the developed system by the simulation plays a crucially important role.

In this regard, in the designing of a digital system using logic circuits, it has become almost indispensable to carry out the simulation of logic circuits in order to shorten the time required for developing the system as well as to achieve a high level of perfection.

For such simulation of logic circuits, a simulation by software has been utilized conventionally, but this approach has a drawback that it requires a considerable amount of time for executing an enormous amount of calculations required, such that the turn-around time of the simulation has been considerably long, especially for a large scale circuit.

In order to resolve this problem, there has been a development of a dedicated hardware simulation engine for facilitating such a simulation of the logic circuits.

In general, the simulation engine can be classified into two types including: an event driven type simulation engine in which the simulation is achieved by processing events in the logic circuits by a dedicated simulation processor; and an emulator for carrying out an emulation in which the logic circuits are mapped onto programmable elements such as field programmable gate arrays. This type of a conventional hardware emulator has been disclosed in Japanese Patent Application Laid Open No. 2-245831 (1990), for example.

Now, the conventional event driven type simulation engine has an advantage that it can handle a very large scale circuit, but it has been associated with a problem that it is difficult to realize a high speed simulation as the parallelism of the simulation target can be retained only limitedly because of a limited number of processors that can be provided in such an event driven type simulation engine.

On the contrary, the hardware emulator has an advantage that it can realize a high speed simulation as the parallelism of the simulation target can be retained completely, but it has been associated with a problem that it cannot handle a very large scale circuit because the size of the circuit that can be simulated in the hardware emulator is limited by the size of the hardware emulator itself.

In further detail, the hardware emulator generally comprises a plurality of mutually connected logic blocks in which a high speed logic simulation can be achieved by mapping the simulation target logic circuits onto logic blocks such that each logic block can execute the same operation as the mapped part of the logic circuits. Such a logic block can be realized for example by a field programmable gate array (FPGA) formed by a plurality of programmable elements in which each programmable element simulates the operation of one or more of the circuit elements of the simulation target logic circuits.

In such a hardware emulator, the mapping of the simulation target logic circuits onto the programmable elements and the determination of the connections among the programmable elements have been achieved by a compiler. The program data obtained as a result of the mapping by the compiler are usually loaded into a memory provided in the emulator before the simulation takes place, and utilized by the emulator to determine the operations of the programmable elements during the simulation.

Now, one of the major problem associated with such a hardware emulator is the enormous time required for the compiling by the compiler. This problem is caused by the following reason. Namely, a typical conventionally used is emulator architecture in the form of a mesh structure in which only the adjacent FPGAs are interconnected has a very limited degrees of freedom concerning the wirings among the FPGAs. In addition, most of the FPGAs are manufactured for the implementation purpose, so that they also have only a limited degrees of freedom concerning their wirings. Consequently, in order to increase the circuit filling rate (an average number of circuit elements allocated to each programmable element) for the FPGAs, a key problem is the manner of realizing the mapping of the simulation target when only the limited degrees of freedom concerning the wirings is available.

For this key problem, the most efficient solution conventionally known is the probabilitistic algorithm such as the simulated annealing in which the optimization is repeated until the desired mapping can be realized. However, in such a probabilitistic approach, the time required for the mapping becomes enormous as the size of the logic circuit to be simulated increases, such that there are cases in which several days are required for the compiling of the logic circuit in the size of 1M gates, For example. Thus, it has been difficult to realize a truly efficient mapping scheme in the hardware emulator having only limited degrees of freedom concerning the wirings.

The increase of the time required for the compiling in turn increases the turn-around time of the simulation, so that the realization of a high speed mapping algorithm is extremely important.

Moreover, for the emulator with a given number of programmable elements, the size of the logic circuit that can be simulated Is proportional to the circuit filling rate realizable, so that the low circuit filling rate implies a severe limitation on the size of the logic circuit that can be simulated. Consequently, it is important to improve the circuit filling rate for the programmable elements by realizing a highly effective mapping scheme.

On the other hand, one of many conventionally known propositions for the realization of a high speed simulation is the level sort scheme.

This level sort scheme is a scheme for determining an order of evaluations of gates in advance such that the evaluations during the actual simulation can be carried out in accordance with this predetermined static order. Here, the evaluation order in the level sort scheme is determined by the rule that "the evaluation of a gate g is carried out only after the evaluation of the gate on the input side of this gate g is finished", and it is aimed at the calculation of a final value for a combinational circuit portion of a synchronous circuit in a stable circuit operation state.

Now, such a conventional level sort scheme assumes that the combinational circuit portion is designed to contain no loop so that the model of the combinational circuit portion also contains no loop. However, in practice, there are cases in which the combinational circuit portion is designed to contain some loops for various practical reasons, and in such cases the evaluation order cannot be determined by the simple rule of the conventional level sort scheme as mentioned above, so that the conventional level sort scheme has actually been inapplicable to such cases.

SUMMARY OF THE INVENTION

It is therefore an object of the present invention to provide a logic simulation system capable of handling a very large scale circuit while at the same time realizing a high speed simulation by retaining the parallelism of the simulation targets.

It is another object of the present invention to provide a logic simulation system capable of improving the circuit filling rate for the programmable elements such that the size of a logic circuit that can be simulated can be increased.

It is another object of the present invention to provide a logic simulation system capable of dealing with a logic circuit containing a loop, and detecting the occurrence of an oscillation of the loop in the simulation.

According to one aspect of the present invention there is provided a logic simulation system for simulating a simulation target logic circuit, comprising: a host computer having data of the simulation target divided into a plurality of sections defining different simulation phases to be executed sequentially in time division; an emulator for emulating the simulation target, including: a plurality of programmable emulation chip means for mapping the simulation target, each emulation chip means having memory means with a plurality of memory banks provided in correspondence to said plurality of sections for registering mapping data specifying a function to be realized by said each emulation chip means in emulating each of said plurality of sections; programmable network means for interconnecting said plurality of emulation chip means; and emulation control means for controlling said plurality of emulation chip means and the network means by sequentially switching the memory banks of the memory means of said each emulation chip means and changing connections among said plurality of emulation chip means provided by the network means in emulating each of said plurality of sections; and interface means for interfacing the host computer and the emulator.

According to another aspect of the present invention there is provided a logic simulation system for simulating a simulation target logic circuit, comprising: input conversion means for converting the simulation target logic circuit into a primitive graph formed by a plurality of primitives connected by branches; separation means for separating a combinational circuit portion and a state memory portion of the simulation target logic circuit in the primitive graph obtained by the input conversion means; loop detection means for decomposing the primitive graph of the combinational circuit portion separated by the separation means into strongly connected components, and detecting those strongly connected components containing more than one primitives as loop circuit portions; loop conversion means for converting each loop circuit portion detected by the loop detection means into an equivalent loopless circuit; and simulator means for executing a simulation operation on an equivalent circuit model of the simulation target logic circuit in which said each loop circuit portion detected by the loop detection means is replaced by the equivalent loopless circuit obtained by the loop conversion means.

According to another aspect of the present invention there is provided a method for simulating a simulation target logic circuit, comprising the steps of: dividing the simulation target into a plurality of sections defining different simulation phases; mapping the simulation target onto an emulator formed by a plurality of programmable emulation chip means interconnected by a programmable network means; and executing the different simulation phases sequentially in time division, by sequentially controlling said plurality of emulation chip means and the network means to emulate each of said plurality of sections.

Other features and advantages of the present invention will become apparent from the following description taken in conjunction with the accompanying drawings.

BRIEF DESCRIPTION OF THE DRAWINGS

FIG. 1 is a conceptual diagram for Illustrating a basic concept of the first embodiment of a logic simulation system according to the present invention.

FIG. 13A to 13D are diagrams of exemplary primitive net lists for the circuit of FIG. 12 obtained by the system of FIG. 2.

FIGS. 37A, 37B, and 37C are diagrams showing results of the further division of a connected component in the primitive graph of FIG. 35 by duplicating some primitives according to the mapping scheme (4).

DETAILED DESCRIPTION OF THE PREFERRED EMBODIMENTS

Now, the first embodiment of a logic simulation system according to the present invention will be described in detail.

First, the essential features of this first embodiment can be outlined briefly as follows.

In this first embodiment, the system generally comprises a host computer having data of a simulation target, an emulator including a plurality of programmable emulation chips interconnected by a programmable network, and an I/O (input/output) interface for interfacing the host computer and the emulator.

In this general configuration, as depicted conceptually in FIG. 1, the simulation target ST is divided into a plurality of sections defining different phases of the simulation, and each divided section is mapped onto the emulation chips EC of the emulator. Here, each emulation chip EC can be mapped with a plurality of circuits belonging to different divided sections.

Then, before the execution of the simulation takes place, the mapping data specifying the function to be realized by each emulation chip EC and the connections among the emulation chips EC to be realized by the network NW in order to simulate each divided section in each phase of the simulation are set up in memory elements provided in each emulation chip EC and the network NW, where each memory element has a plurality of banks corresponding to a plurality of divided sections such that each bank registers the mapping data for each phase of the simulation.

Then, in the execution of the simulation, the banks of the memory elements are sequentially switched such that the emulator emulates each of the divided sections sequentially, in time division, according to the mapping data for each phase registered in each bank of each memory element. The end result of each phase obtained at an output side of the network NW is fed back to an input side of the network as an input for a next phase, by means of the I/O interface. In this manner, the emulation in time division can be achieved by simply switching the banks of the memory elements provided in each emulation chip EC and the network NW sequentially, without requiring any operation by the host computer for the purpose of switching from a state of emulating one divided section to a state of emulating another divided section, during the simulation.

As a result, it becomes possible in this logic simulation system to retain the parallelism of the simulation target during the simulation, and therefore this logic simulation system can handle the simulation of a larger scale circuit at a higher speed, for a given size of the emulator.

Figure 2:
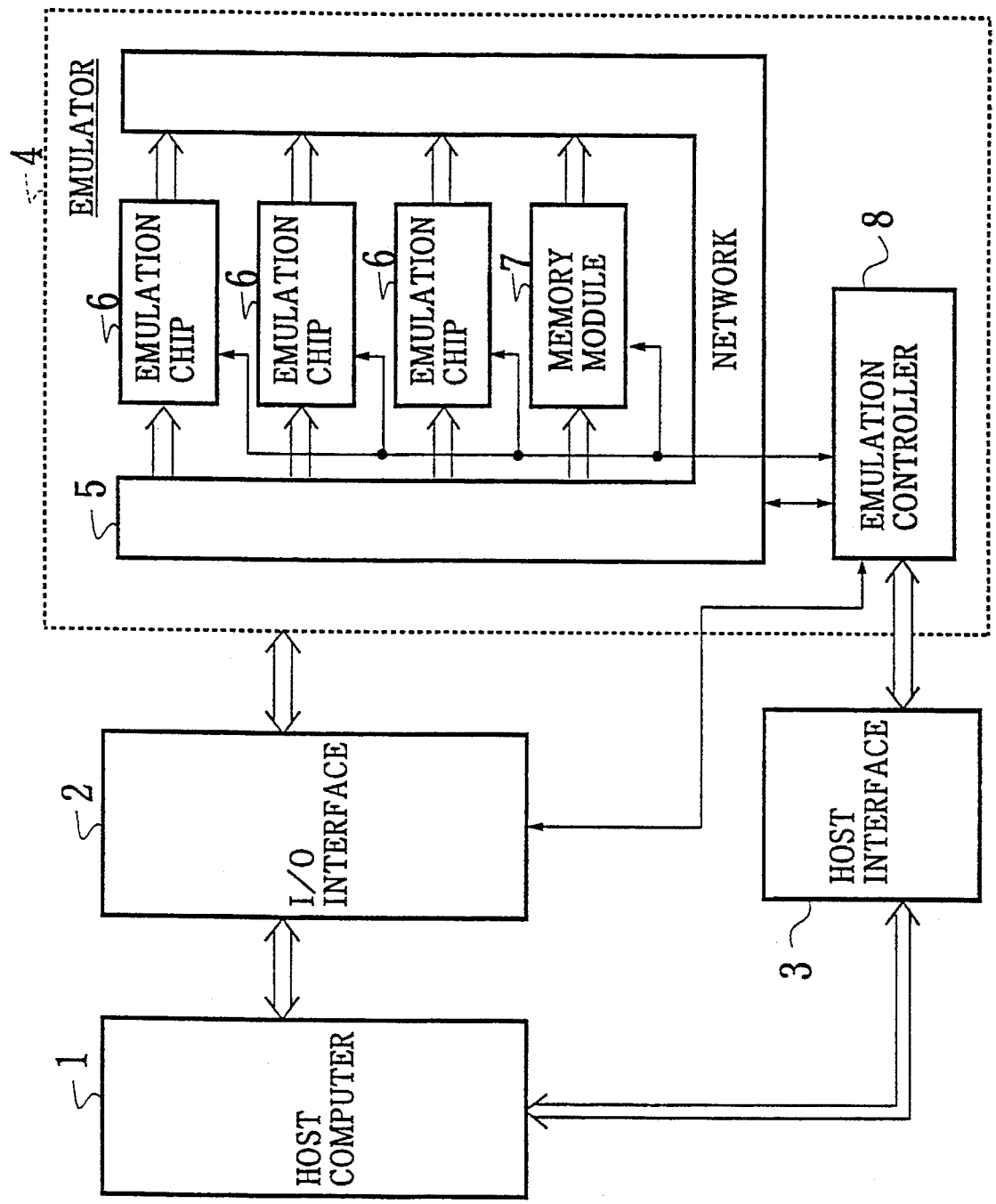
FIG. 2 is a schematic block diagram of the first embodiment of a logic simulation system according to the present invention.

Referring now to FIG. 2, this first embodiment of a logic simulation system according to the present invention outlined above will be described in further detail.

As shown in FIG. 2, in this first embodiment, the logic simulation system comprises: a host computer 1 and an emulator 4 interfaced by an I/O interface 2 and a host interface 3. The emulator 4 further comprises a network 5 connected with the host computer 1 through the I/O interface 2, a plurality of emulation chips 6 and a memory module 7 interconnected by the network 5, and an emulation controller 8 connected with the host computer 1 through the host interface 3, for specifying various execution conditions to the I/O interface 2, the network 5, the emulation chips 6, and the memory module 7.

Here, the simulation target is going to be mapped onto logic blocks formed by a plurality of the emulation chips 6, each of which is realized by a field programmable gate array (FPGA) comprising a plurality of programmable elements in forms of universal elements representing universal functions called primitives, so that the mapping of the simulation target onto the emulator 4 can be achieved by converting the simulation target into sets of primitives and generating primitive net lists.

In this configuration, the mapping data are down loaded from the host computer i through the host interface 3 and the emulation controller 8 to the network 5, the emulation chips 6, and the memory module 7 of the emulator 4. Here, the emulation chips 6 and the memory module 7 are mutually interconnected by the network 5 to emulate the simulation target, where the memory module 7 is used for emulating the memory portion such as SRAM, DRAM, etc. contained in the simulation target.

Then, when the input vector (input pattern) for the simulation target are given to the emulator 4 from the host computer 1 through the I/O interface 2, the emulator 4 executes each phase of the simulation of the simulation target under the execution conditions specified from the host controller 1 through the host interface 3 and the emulation controller 8, and outputs the result obtained by this simulation as the output vector through the I/O interface 2.

The I/O interface 2 supplies the output vector obtained at each phase of the simulation back to the network 5 as the input vector for next phase of the simulation, so as to effectively function as a memory element of the simulation target. The host interface 3 is used for monitoring and controlling the internal state of the emulator 4 from the host computer 1.

Figure 3:
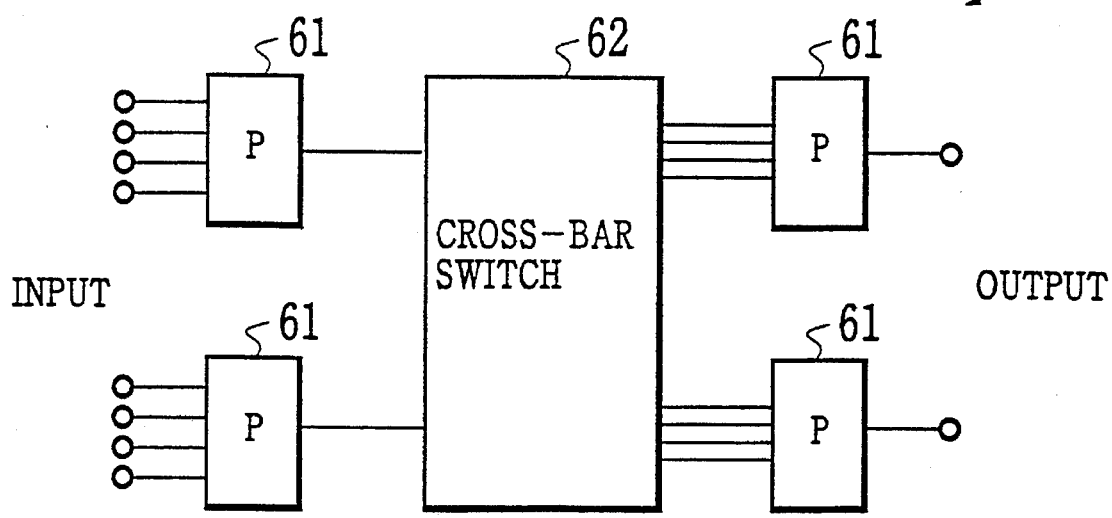
FIG. 3 is a block diagram of an emulation chip in the system of FIG. 2.

Each emulation chip 6 has a configuration as shown in FIG. 3, which comprises a plurality of primitives (P) 61 interconnected by a cross-bar switch 62. In FIG. 3, each primitive 61 is of four inputs and one output type, although in general, each primitive can be of M inputs and N outputs type, where M and N are positive integers. Also, In FIG. 3, each emulation chip 6 has a single stage cross-bar connection, although in general each emulation chip 6 can have a multi-stage cross-bar connection. In addition, the cross-bar switch 62 can be either a complete cross-bar switch or a partial cross-bar switch. Here, each one of the primitives 61 and the cross-bar switch 62 is provided with a built-in memory element having a plurality of banks for registering the mapping data for a plurality of phases of the simulation, where the banks can be switched from one to another by the bank signal supplied from the emulation controller 8.

Figure 4:
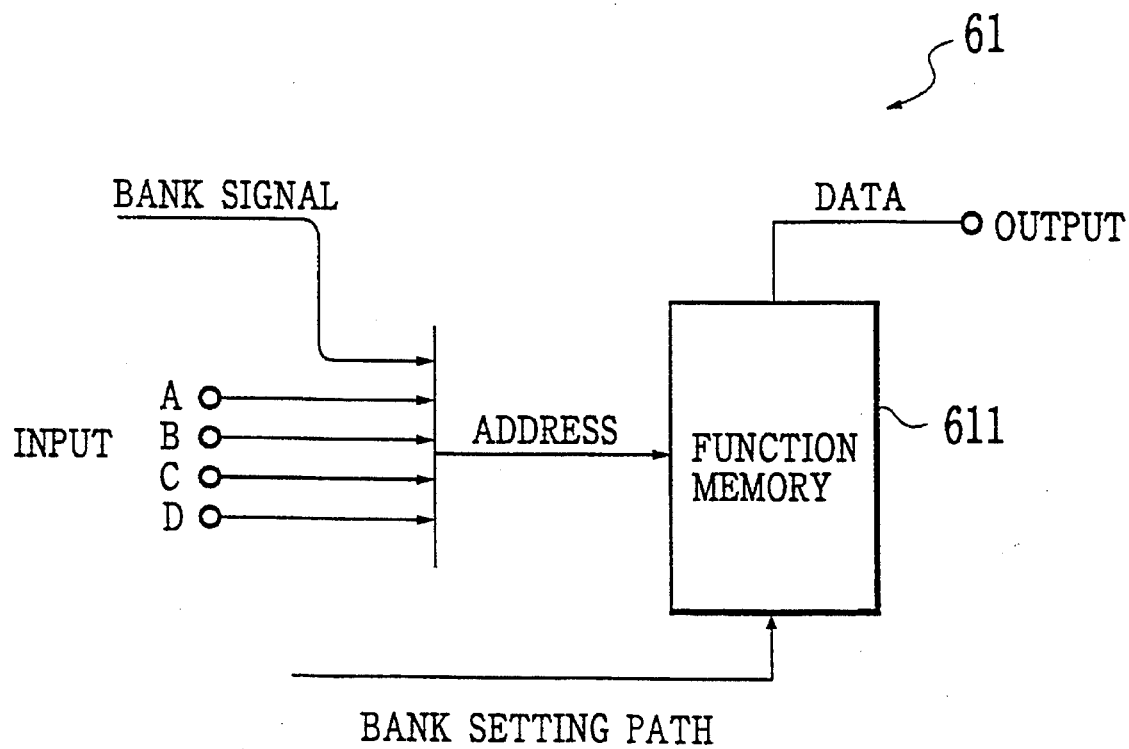
FIG. 4 is a block diagram of a primitive in the emulation chip of FIG. 3.

In this case, each primitive 61 has a configuration as shown in FIG. 4, which comprises a function memory 611 as a memory element of the primitive 61, which can be accessed by using an address specified by four inputs A, B, C, D and the bank signal supplied from the emulation controller 8, and outputs one bit data as a function output. Here, the mapping data registered in the function memory 611 are set up by the host computer 1 through a bank setting path provided from the emulation controller 8 to the emulation chips 6, the network 5, and the I/O interface 2.

Figure 5:
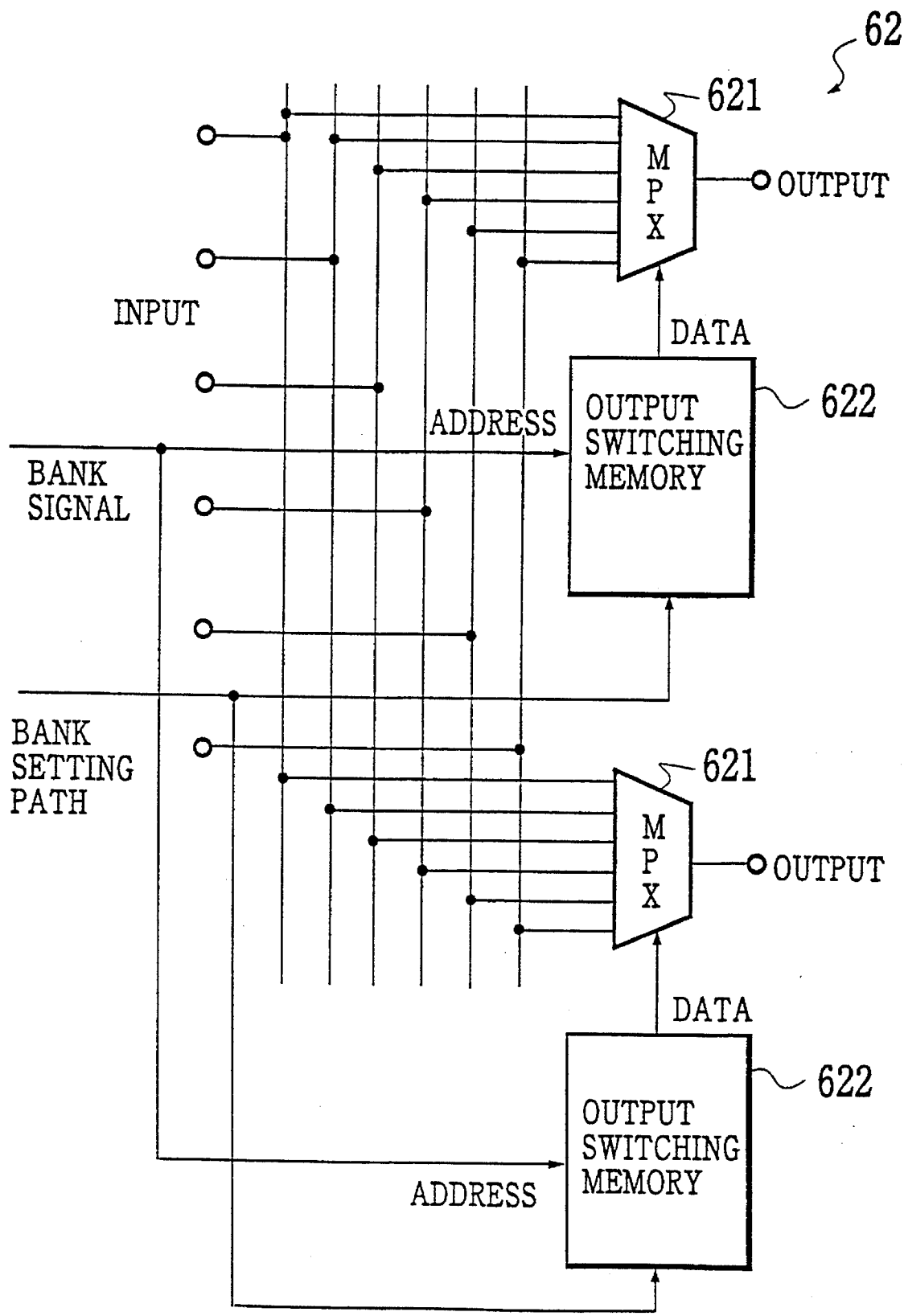
FIG. 5 is a block diagram of a cross-bar switch in the emulation chip of FIG. 3.

Also, in this case, the cross-bar switch 62 has a configuration as shown in FIG. 5 which comprises a plurality of multiplexers 621 each of which is receiving a plurality of inputs and outputting one output, and an output switching memory 622 associated with each multiplexer 621 as a memory element of the cross-bar switch 62 for switching the output of each multiplexer 621 according to the bank signal and the mapping data set up through the bank setting path for specifying the internal connections among the primitives 61 expressing the functions of the primitives 61, which are supplied from the emulation controller 8. In FIG. 5, the cross-bar switch 62 is depicted as six inputs and two output type, but it can be extended by increasing a number of inputs and a number of multiplexers 621.

Figure 6:
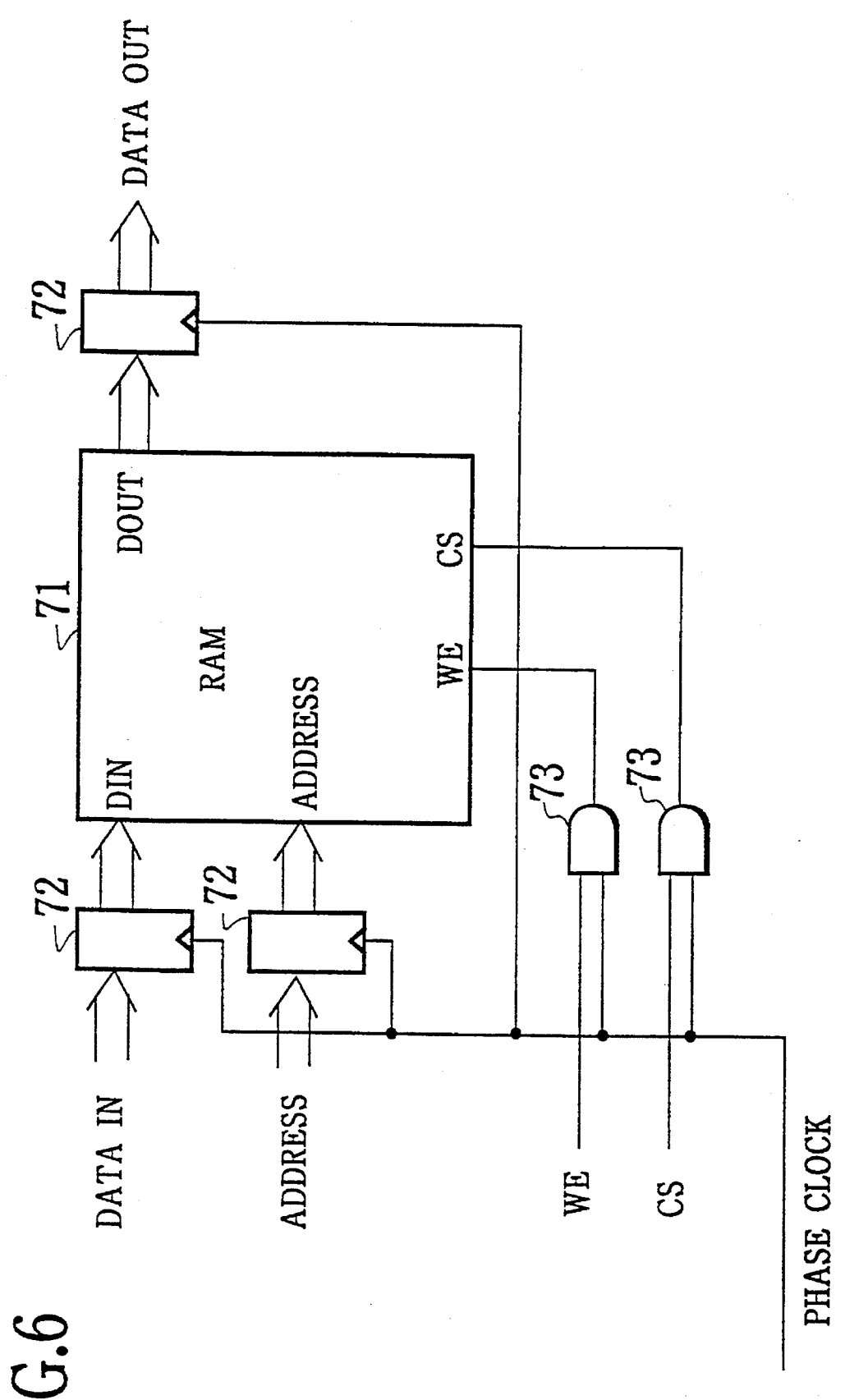
FIG. 6 is a block diagram of a memory module in the system of FIG. 2.

The memory module 7 has a configuration as shown in FIG. 6, which comprises a RAM 71, and latches 72 and AND gates 73 which are operated according to a phase clock supplied from the emulation controller 8. In this memory module 7, the reading from the memory module 7 is realized by supplying an address given in a certain phase through the latch 72 and a CS (chip select) signal given by the emulation controller 8 through the AND gate 73 to the respective terminals of the RAM 71 at a timing of a phase clock for that certain phase, in response to which appropriate output data (DATA OUT) are outputted from a DOUT terminal of the RAM 71 at a timing of a next phase clock. On the other hand, the writing into the memory module 7 is realized by supplying input data (DATA IN) and an address through the latches 72 and a CS (chip select) signal and a WE (write enable) signal given by the emulation controller 8 through the AND gates 73 to the respective terminals of the RAM 71 at a timing of the phase clock. Here, the phase clock is utilized for controlling the latches 72 and the AND gate 73 in order to stabilize the inputs and outputs of the RAM 71.

Figure 7:
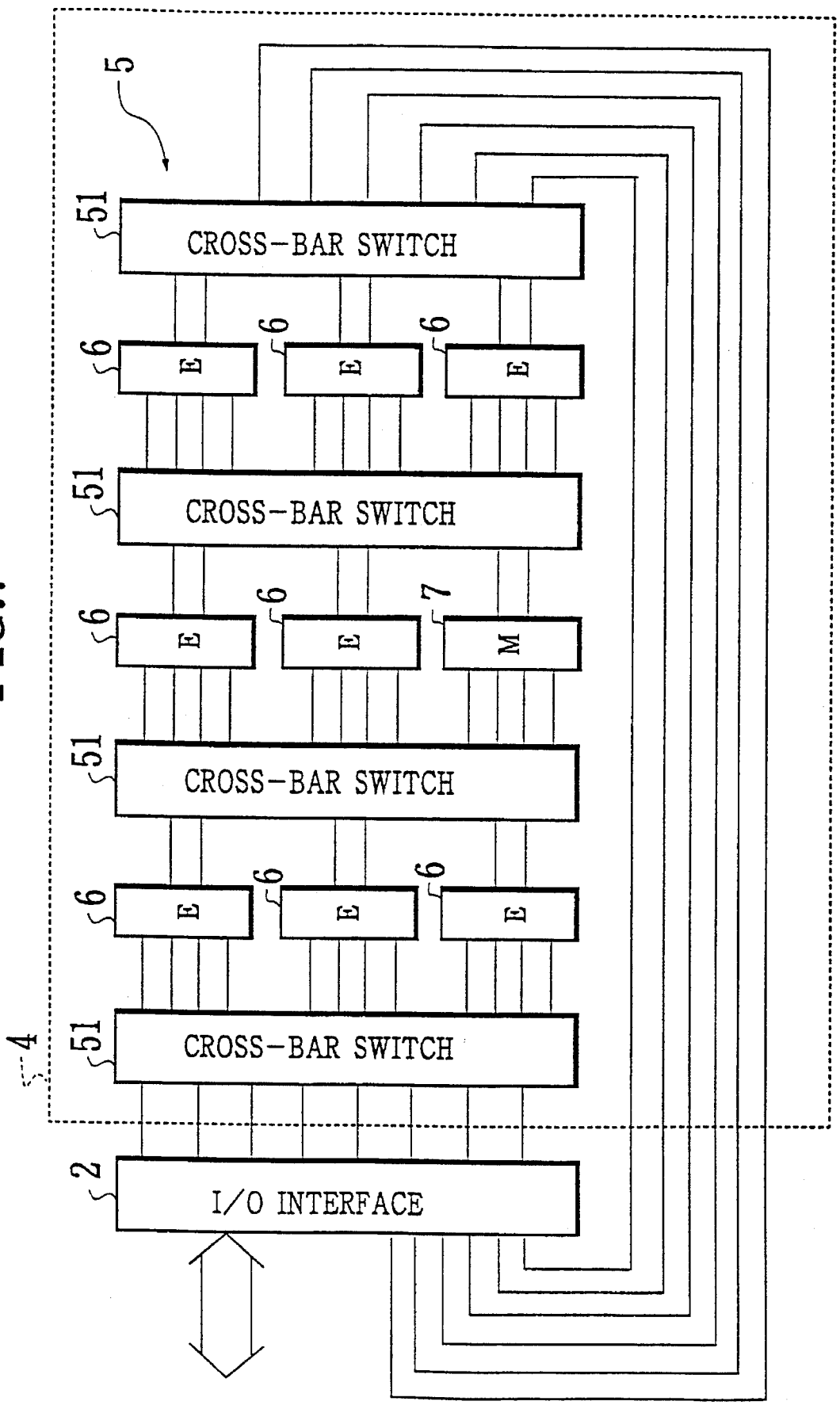
FIG. 7 is a block diagram of a network in the system of FIG. 2.

The network 5 has a schematic configuration as shown in FIG. 7 in which the emulation chips 6 and the memory module 7 are interconnected by cross-bar switches 51 in a multi-stage cross-bar connection. Here, the network 5 is formed such that, in response to the input entered from the host computer 1 through the I/O interface 2 to the first stage of the network 5, the output is returned from the last stage of the network 5 to the host computer 1 through the I/O interface 2. Here, between consecutive phases of the simulation, the I/O interface 2 feeds the end result of a currently executed phase obtained at an output side of the network 5 to an input side of the network 5 as an input for a next phase. Also, similarly to the cross-bar switch 62 of each emulation chip 6 shown in FIG. 4, each cross-bar switch 51 of the network 5 has a plurality of multiplexers and an output switching memory associated with each multiplexer as a memory element of the cross-bar switch for switching the output of each multiplexer according to the bank signal supplied from the emulation controller 8 and the mapping data set up through the bank setting path by the emulation controller 8 which specify the connections among the emulation chips 6.

Figure 8:
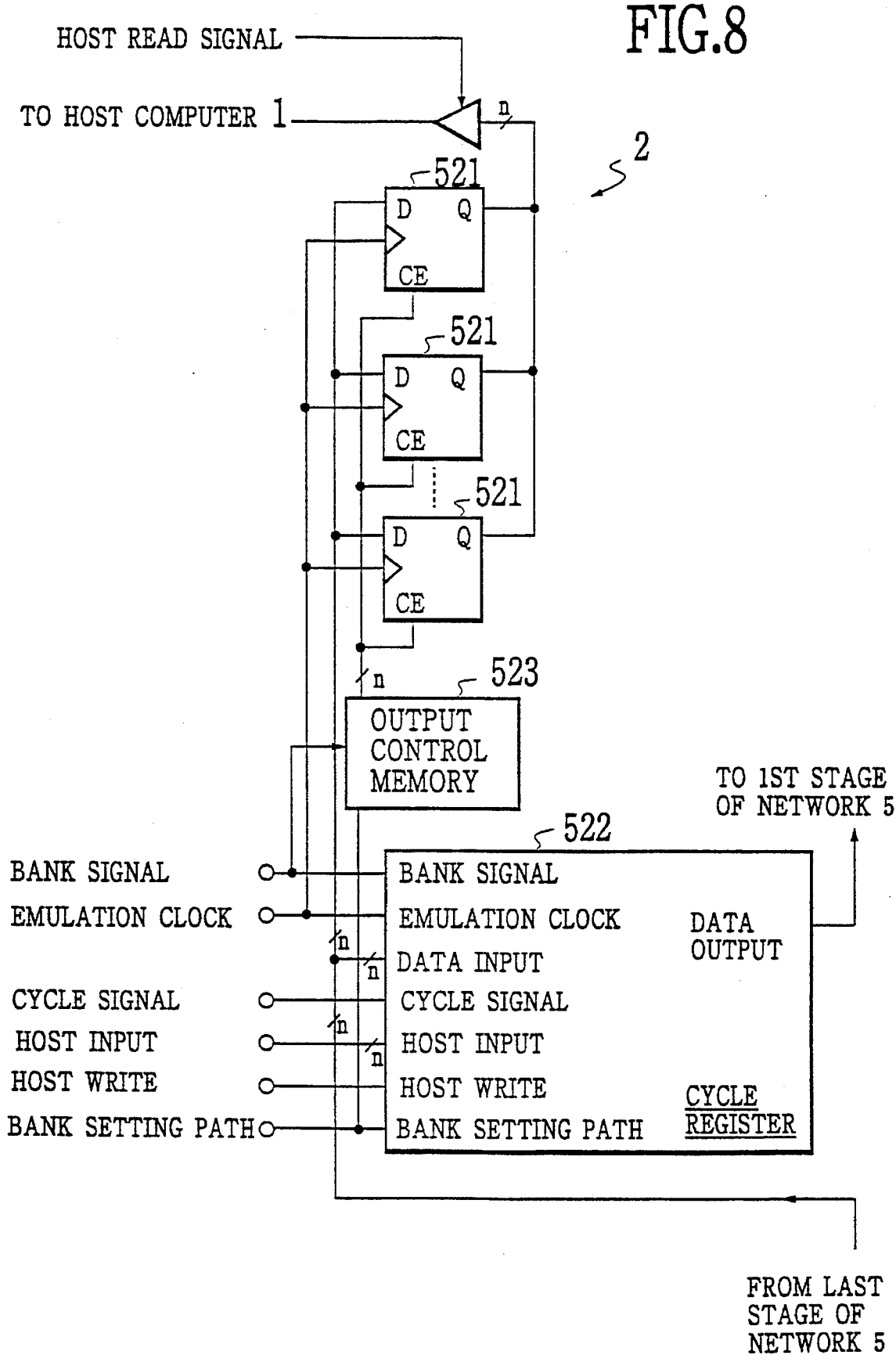
FIG. 8 is a block diagram of an I/O interface in the system of FIG. 2.

The I/O interface 2 has a configuration as shown in FIG. 8, which comprises: n (n is an integer) output vector registers 521 in forms of flip flops for registering each bit of the n bits output entered from the last stage of the network 5 and read out to the host computer 1 in response to the host read signal supplied from the emulation controller 8; a cycle register 522, functioning as a memory element of the I/O interface 2, for feeding back the end result of each phase obtained at an output side of the network 4 to an input side of the network 5 as an input for a next phase; and an output control memory 523, also functioning as a memory element of the I/O interface 2, for controlling an enable state of each bit registered in each of the output vector registers 521, such that each of the output vector registers 521 can register the bit value of the appropriate phase of the simulation.

Figure 9:
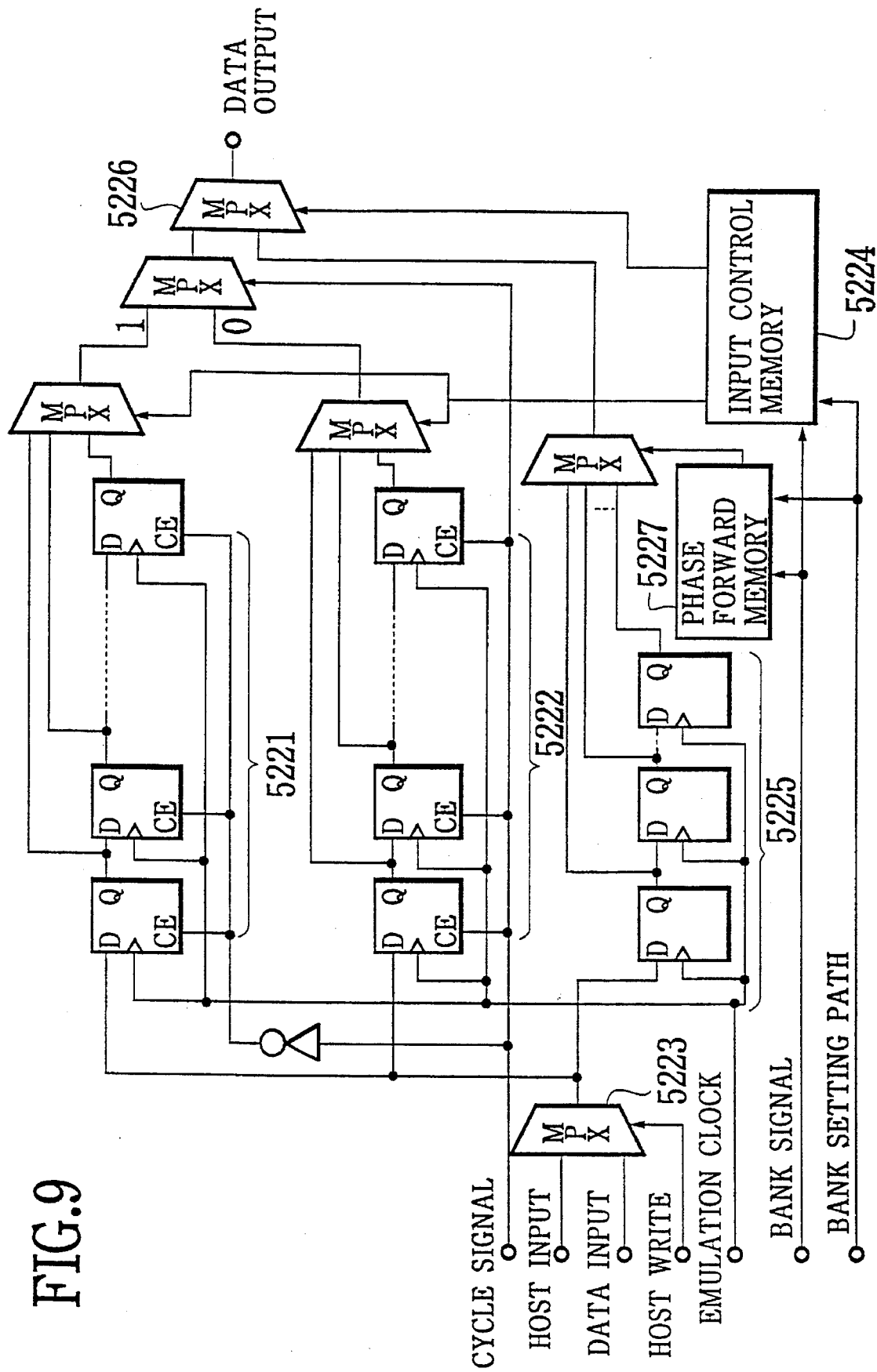
FIG. 9 is a block diagram of one bit part of a cycle register in the I/O interface of FIG. 8.

With respect to each bit of the n bits output, the cycle register 522 has a configuration as shown in FIG. 9. Here, the cycle register 522 has the following three functions: (1) Registering the input vector entered from the host computer 1; (2) Registering the values in the memory element of the simulation target for each phase of the simulation; and (3) Transferring the values in one phase to another phase. In order to realize these functions, the cycle register 522 has two sets of registers including a cycle 0 register 5221 and a cycle 1 register 5222, which are operated reciprocally according to the cycle signal supplied from the emulation controller 8, where the cycle signal itself takes an alternating value according to the emulation clock of the simulation target.

Namely, when the cycle signal takes a value 1, the cycle 1 register 5222 is operated to store the output of a currently executed phase supplied to the data input terminal from the last stage of the network 5 while the input for a next phase stored in the cycle 0 register 5221 is outputted from the data output terminal to the first stage of the network 5. Then, as the emulation clock progresses by one, the cycle signal takes a value 0, in which case the cycle 0 register 5221 is operated to store the output of a currently executed phase supplied to the data input terminal from the last stage of the network 5 while the input for a next phase stored in the cycle 1 register 5222 is outputted from the data output terminal to the first stage of the network 5. In this manner, the cycle 0 register 5221 and the cycle 1 register 5222 are operated reciprocally to store the values of the memory element of the simulation target in turns.

Each of the cycle 0 register 5221 and the cycle 1 register 5222 comprises m (m is an integer) flip flops forming a shift register with a depth m, where each stage of the shift register corresponds to each time division phase, and from which the stored value of any desired stage can be read out by an associated multiplexer. Consequently, the values of the memory element of the simulation target for any desired phase can be supplied from this cycle register 522 to the emulator 4.

At a time of registering the input vector from the host computer 1, an input multiplexer 5223 is switched by the host write signal supplied from the emulation controller 8 while the cycle signal takes a value 0, and the input vector is registered through the host input terminal to the cycle 0 register 5221 at a timing of the emulation clock supplied from the emulation controller 8. Then, while the cycle signal takes a value 1. the output of the cycle 0 register 5221 is outputted to the first stage of the network 5 from an output multiplexer 5226 which is switched by an input control memory 5224 according to the mapping data registered through the bank setting path and the bank selected by the bank signal which in this case indicates which phase is currently executed.

The transfer of the values in one phase to another phase is furnished by a phase forward register 5225, in which the values of one phase are latched at a timing of the emulation clock, and then outputted to the emulator 4 from the output multiplexer 5226 which is switched by the input control memory 5224. Here, the phase forward register 5225 comprises m flip flops forming a shift register with a depth m, where each stage of the shift register corresponds to each time division phase, and from which the stored values of any desired stage can be read out by an associated multiplexer. Consequently, the values of the memory element of the simulation target for any desired preceding phase can be supplied from this cycle register 522 to the emulator 4. Here, the values of which phase are to be outputted is controlled by a phase forward memory 5227 according to the mapping data registered through the bank setting path and the bank selected by the bank signal.

Now, in this logic simulation system of FIG. 2, the simulation using the time division emulation can be carried out in the following procedure.

(1) The cycle signal takes a value 0 (1).

(2) The values are supplied to the first stage of the network 5 from a certain phase of the cycle 1 (0) register 5222 (5221) or the phase forward register 5225.

(3) The signals are transmitted through the network 5 and the emulation chips 6.

(4) The signals from the last stage of the network 5 are registered in the cycle 0 (1) register 5221 (5222) and latched at the phase forward register 5225 at a timing of the emulation clock.

(5) The bank signal is switched to specify the connections for the next phase.

(6) The above (2) to (5) are repeated for as many times as necessary.

(7) One simulation cycle ends when all the phases are executed. Then, the cycle signal is switched and the next cycle is executed.

On the other hand, the output vector obtained by the emulator 4 and fed to the I/O interface 2 is latched at the output vector registers 521, and read out to the host computer 1 by the host read signal supplied from the emulation controller 8. Here, the output vector is obtained for each phase, so that the clock enable for each bit is specified from the output control memory 523 to each of the output vector registers 521 according to the mapping data registered through the bank setting path and the bank selected by the bank signal, such that each of the output vector register 521 registers the bit value of the appropriate phase of the simulation.

In order to carry out the debugging of the simulation target, the scan paths for debugging should be provided for the cycle 0 register 5221 and the cycle 1 register 5222, such that the values of the memory element of the simulation target can be obtained by accessing these scan paths for debugging from the host computer 1.

Figure 10:
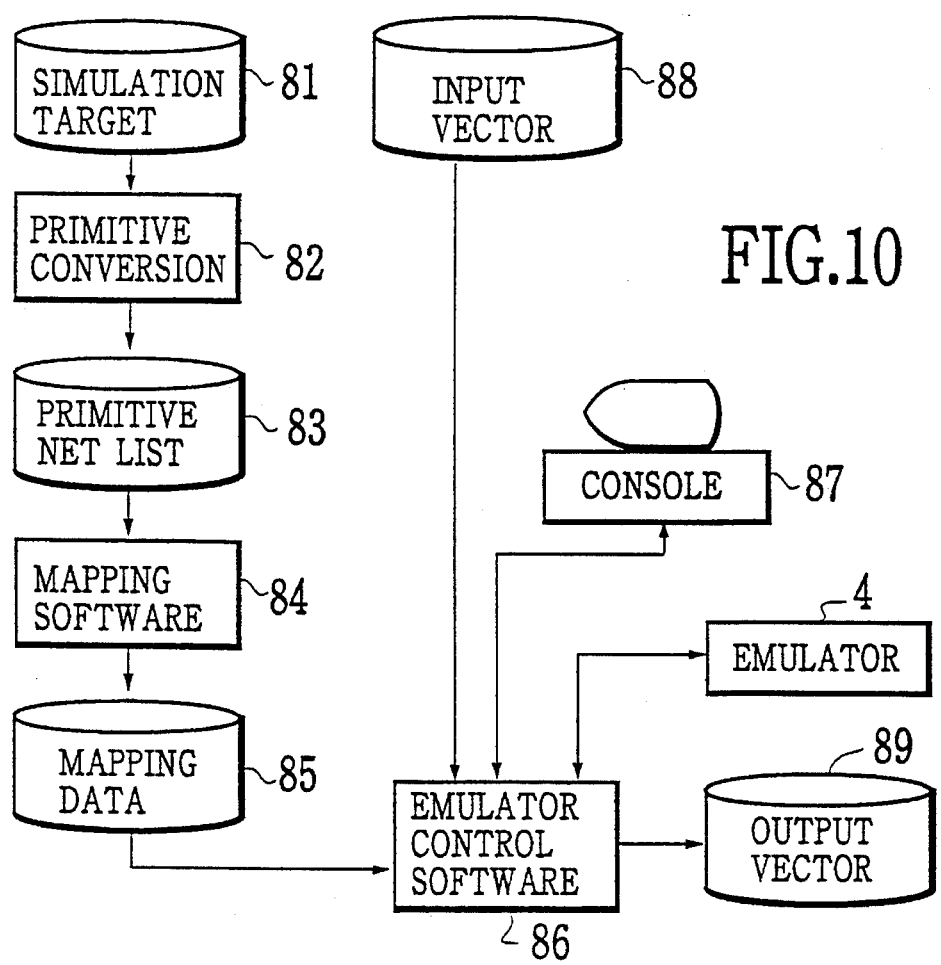
FIG. 10 is a diagram of software structure used in the system of FIG. 2.

In this logic simulation system of FIG. 2, the primitive conversion and the mapping of the simulation target are carried out by using the software structure as shown in FIG. 10.

Namely, the simulation target 81 is converted into primitives at 82, and the primitive net lists are produced at 83. Then, the mapping software 84 determines the manner of mapping of the primitives onto the emulator 4. Here, the mapping software 84 generates the mapping data 85 to be loaded into the banks of the memory elements of the emulation chips 6, the network 5, and the I/O interface 2 which specify which primitive is mapped onto which emulation chip 6 of the emulator 4, as well as the connections within each emulation chip 6, the connections in the network 5, the connections in the I/O interface 2, and the time division of the simulation into phases.

Then, the mapping data 85 are loaded into the emulator 4 by the emulator control software 86. Also, the emulator control software 86 supplies the input from the console 87 and the input vector 88 from the host computer 1 to the emulator 4, and obtains the output vector 89 by controlling the operation of the emulator 4, which can be subsequently displayed on the console 87 as the simulation result.

Figure 11:
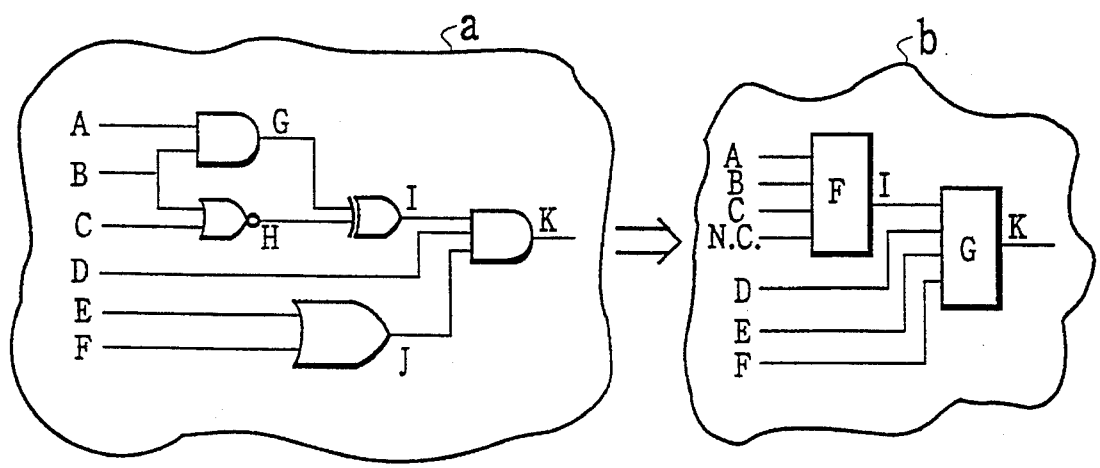
FIG. 11 is a diagram for illustrating an example of a conversion of a simulation target into primitives used in the system of FIG. 2.

The conversion of the simulation target into the primitives can be realized as shown in FIG. 11. Here, each primitive is assumed to have four inputs and one output as an example. FIG. 11 shows an exemplary case in which an exemplary circuit using five elements as depicted in a part (a) of FIG. 11 are expressed by two primitives with four inputs and one output representing the functions F and G as shown in a part (b) of FIG. 11.

Here, as an example of several known methods for grouping a plurality of elements into one primitive, the following method can be used.

(1) One output node is selected and the element outputting to this node is put into a primitive. In a case, the primitive has more than four inputs, the primitive is divided into a plurality of stages in which each primitive has at most four inputs.

(2) When the primitive has less than four inputs, one of the inputs of the primitive is selected, and the element outputting to that input is included into the primitive, and whether there are not more than five inputs in the primitive or not is checked.

(3) In a case there are more than four inputs in the primitive, the inclusion of the element outputting to that input into the primitive is abandoned, and the resulting primitive is registered.

(4) In a case there are less than four inputs in the primitive, the steps (2) and (3) are repeated.

In this manner, starting from the output side, all the elements can be put into the primitives. The other known heuristic method for grouping a plurality of elements into one primitive may also be utilized.

The simulation target converted into the primitive net lists in this manner is then mapped onto the emulator 4 in the following procedure.

(1) Each primitive net list is registered as an old wavefront.

(2) The old wavefront is set to the first stage of the emulator 4, the primitives are taken out from the primitive net list one by one, and allocated to the primitives 61 in the emulation chips 6 of the emulator 4. Then, the wavefront is advanced.

(3) When the primitives cannot be allocated anymore, the signals are transmitted to the last stage of the emulator 4.

(4) The mapping is completed when the wavefront passes through all the outputs and the entire simulation target. Otherwise, the wavefront is set as an old wavefront, and the steps (2) and (3) are repeated until the mapping is completed.

In this procedure, there are cases in which a number of signal lines of the wavefront exceeds a number of output signal lines of the emulator 4. In such cases, the wavefront is further divided into a plurality of sections, and the mapping is carried out in time division.

As a concrete example of this mapping of the logic circuit, a case of mapping a decimal counter called SN74ALS168 manufactured by the Texas Instruments Inc. will be described.

Figure 12:
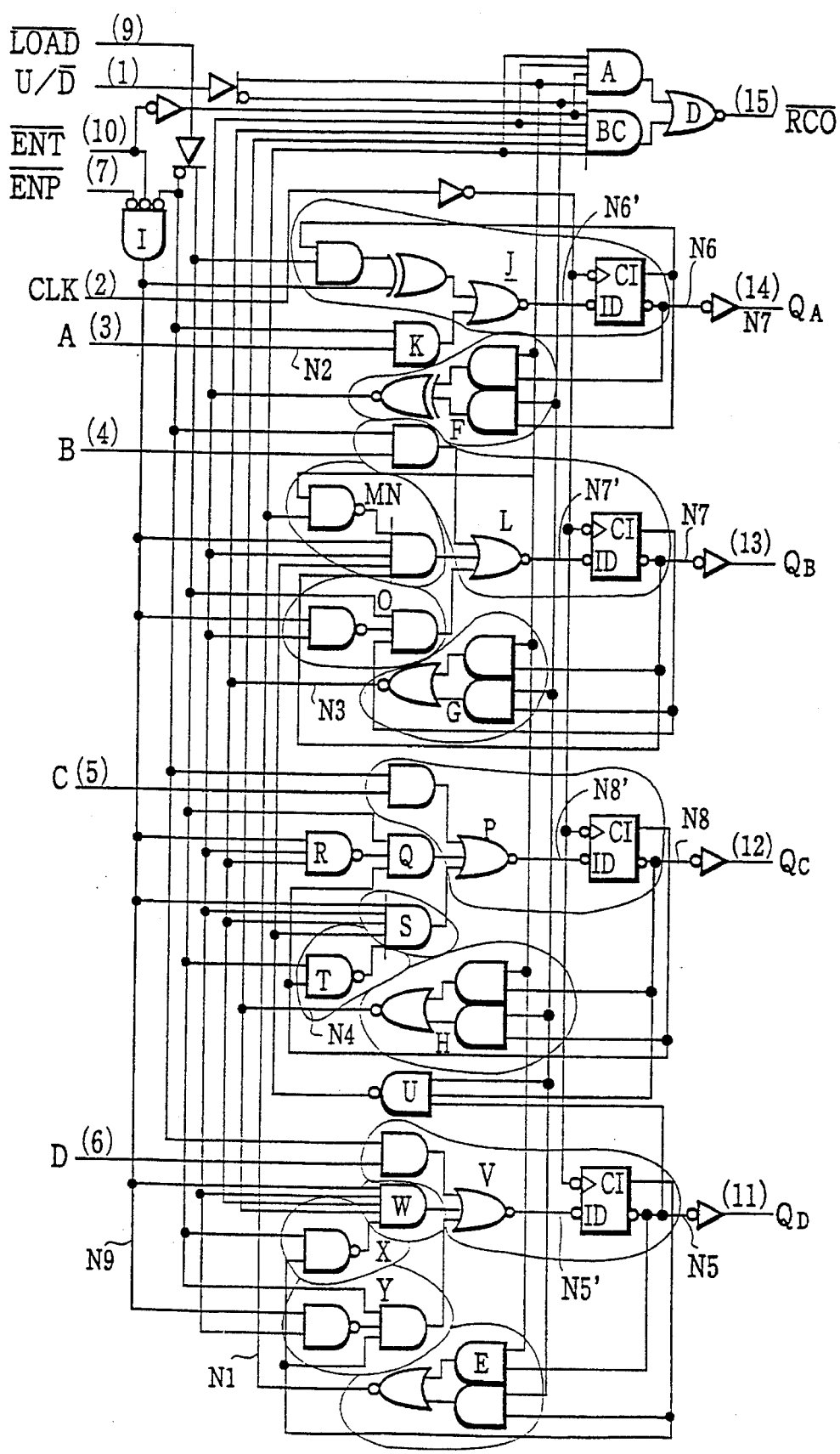
FIG. 12 is a circuit diagram of an exemplary simulation target logic circuit to be simulated by the system of FIG. 2.

This decimal counter has the internal equivalent circuit as shown in FIG. 12, and when the primitive conversion is applied to this circuit of FIG. 12, the primitive net lists as shown in FIGS. 13A, 13B, 13C, and 13D can be produced.

Figure 14:
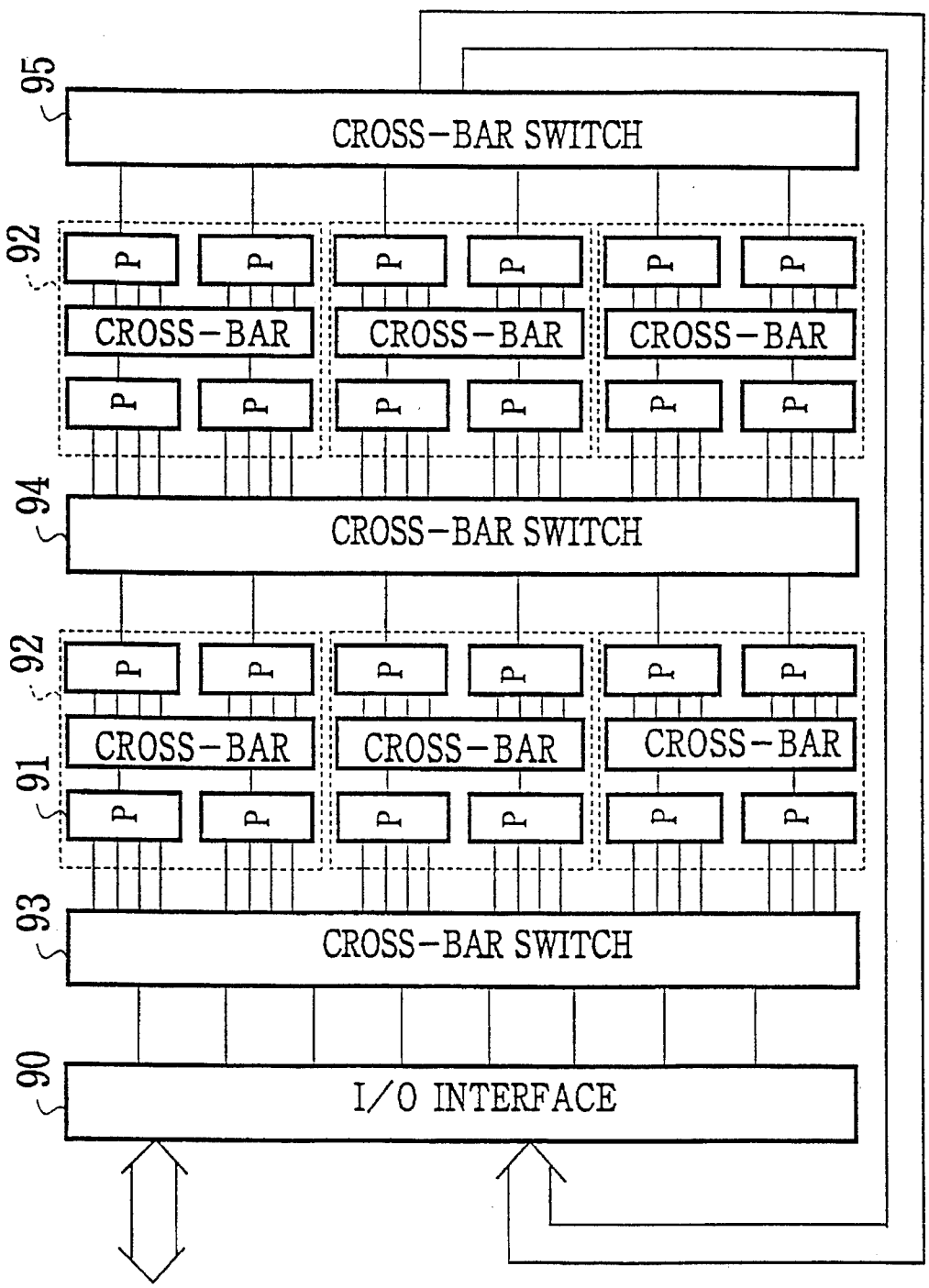
FIG. 14 is a block diagram of an exemplary configuration of an emulator for mapping the circuit of FIG. 12 in the system of FIG. 2.

Then, the mapping of these primitive net lists onto the emulator having a configuration as shown in FIG. 14 will be considered. In the configuration of FIG. 14, the four primitives 91 are contained in each of the six emulation chips 92, and two sets of three emulation chips 92 are interconnected in multi-stage by the cross-bar switches 93, 94, and 95, while the input is given from the host computer through the I/O interface 90.

Figure 15:
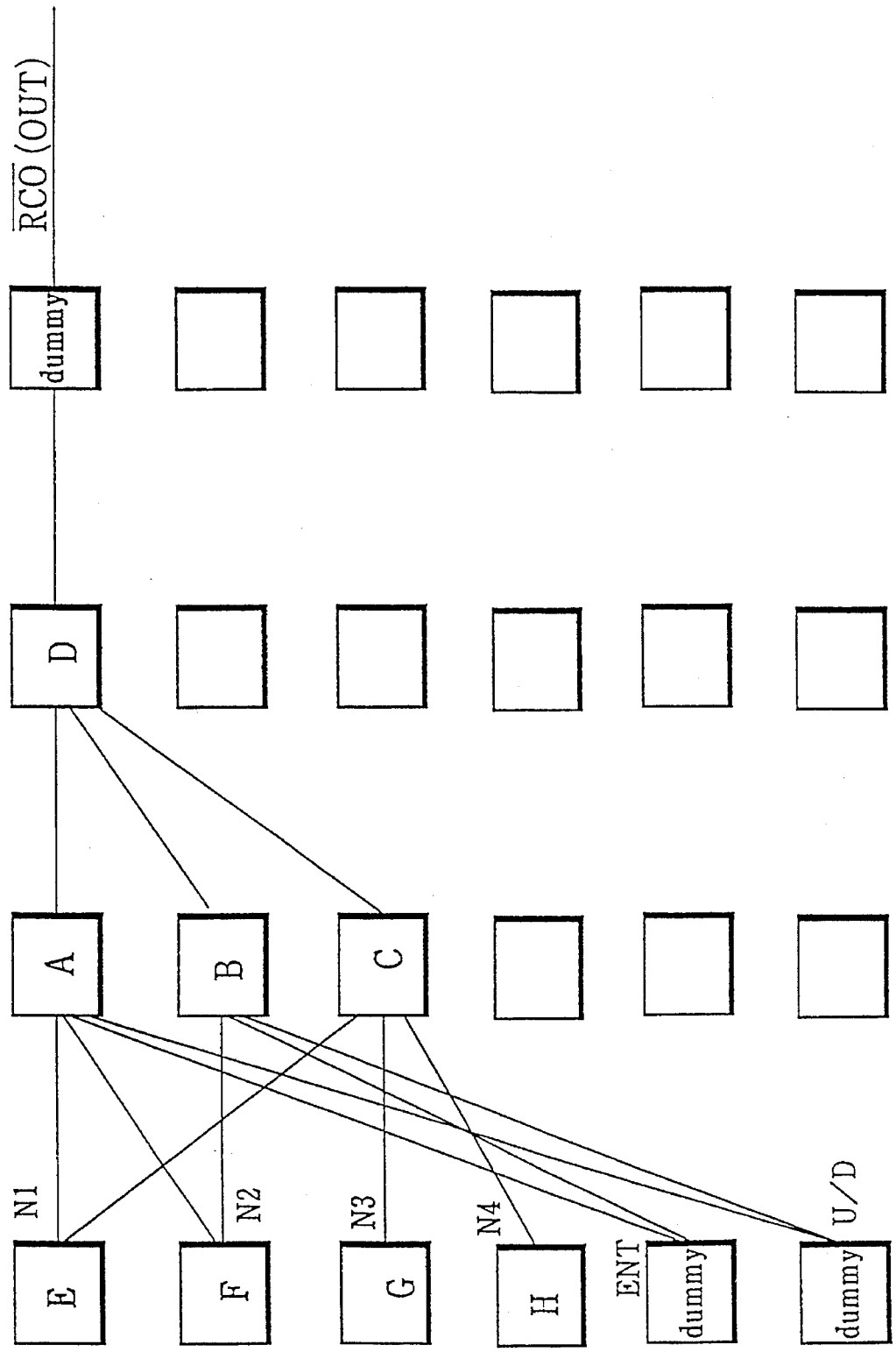
FIGS. 15 to 21 are diagrams of primitives in the emulator of FIG. 14, indicating the result of the mapping of the circuit of FIG. 12 in the first to seventh phases of an exemplary simulation of the circuit of FIG. 12.

First, in the phase 1, the circuit for producing the RCO signal in the primitive net list of FIG. 13A is mapped onto this emulator, as indicated in FIG. 15. In this case, due to the limitation on the inputs, the wavefront cannot be advanced anymore.

Figure 16:
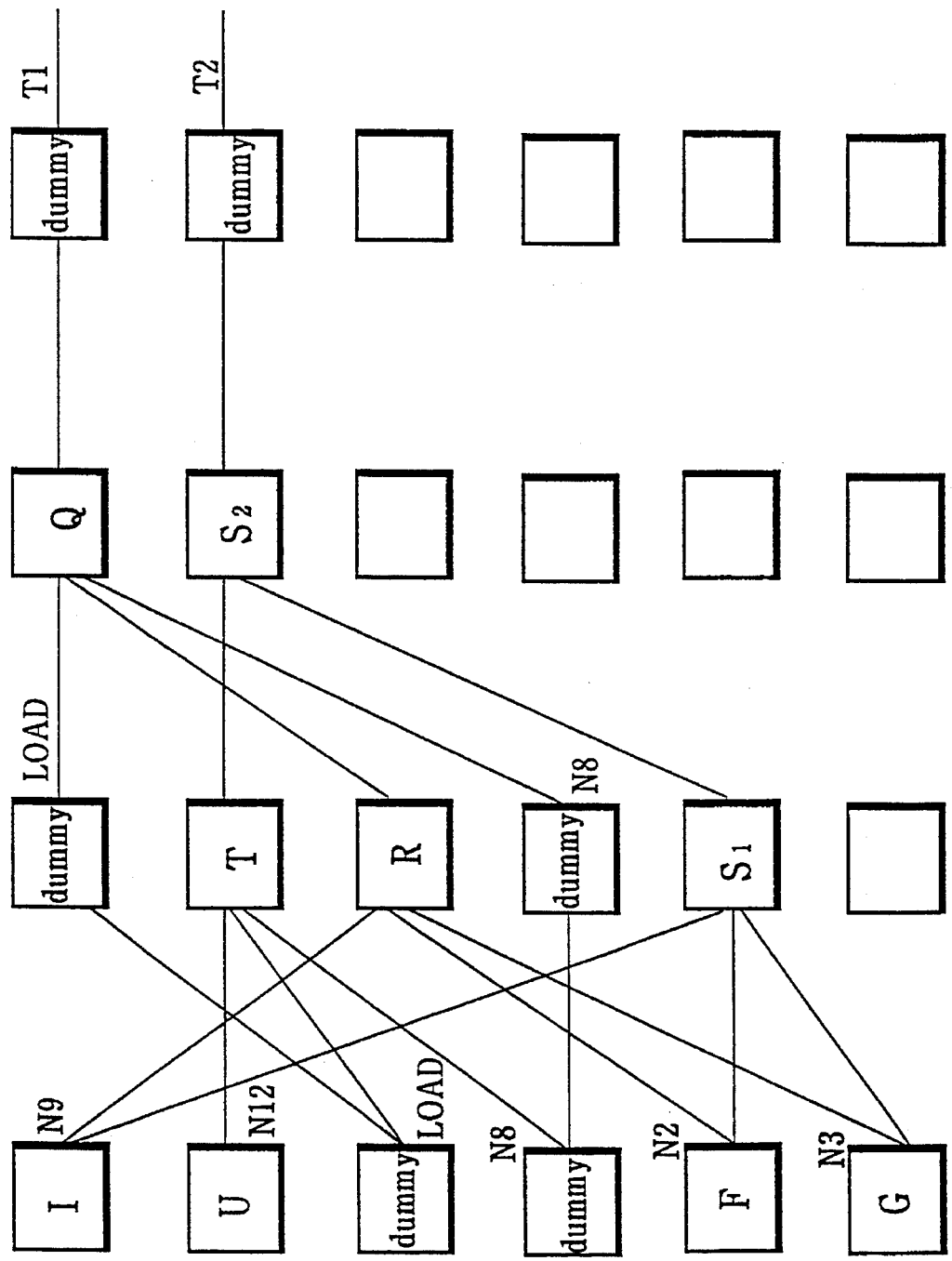

Next, the phase is switched to the phase 2 shown in FIG. 16, in which the wavefront can be advanced to the elements Q and S in FIG. 13B, and the intermediate signals T1 and T2 are produced. These intermediate signals T1 and T2 are to be transferred to the next phase through the phase forward register of the cycle register in the I/O interface 90.

Figure 17:
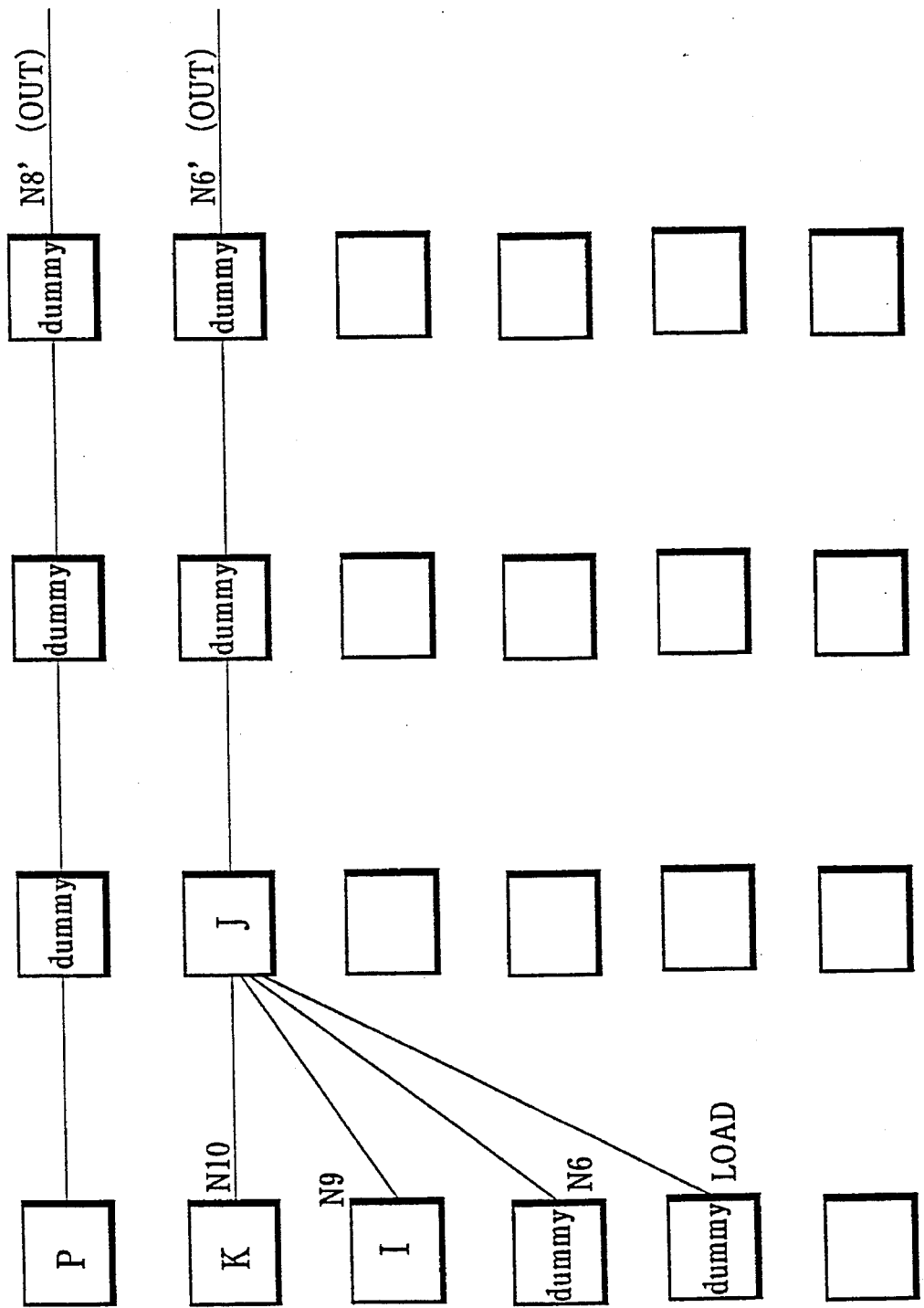

Then, in the phase 3 shown in FIG. 17, the intermediate signals T1 and T2 are used at the element P and the signal N8' is produced, while the signal N6' is also produced.

Figure 18:
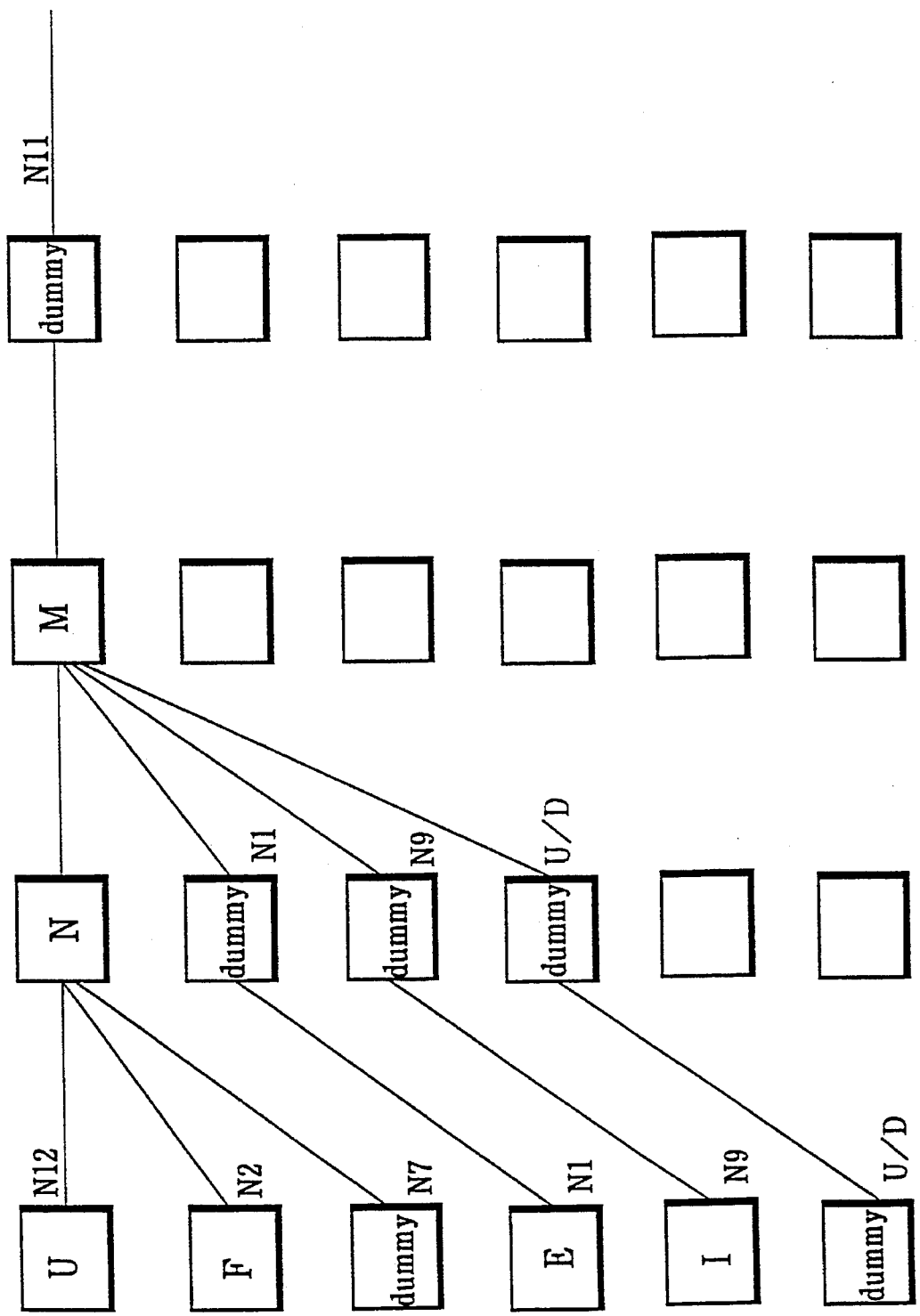
Figure 19:
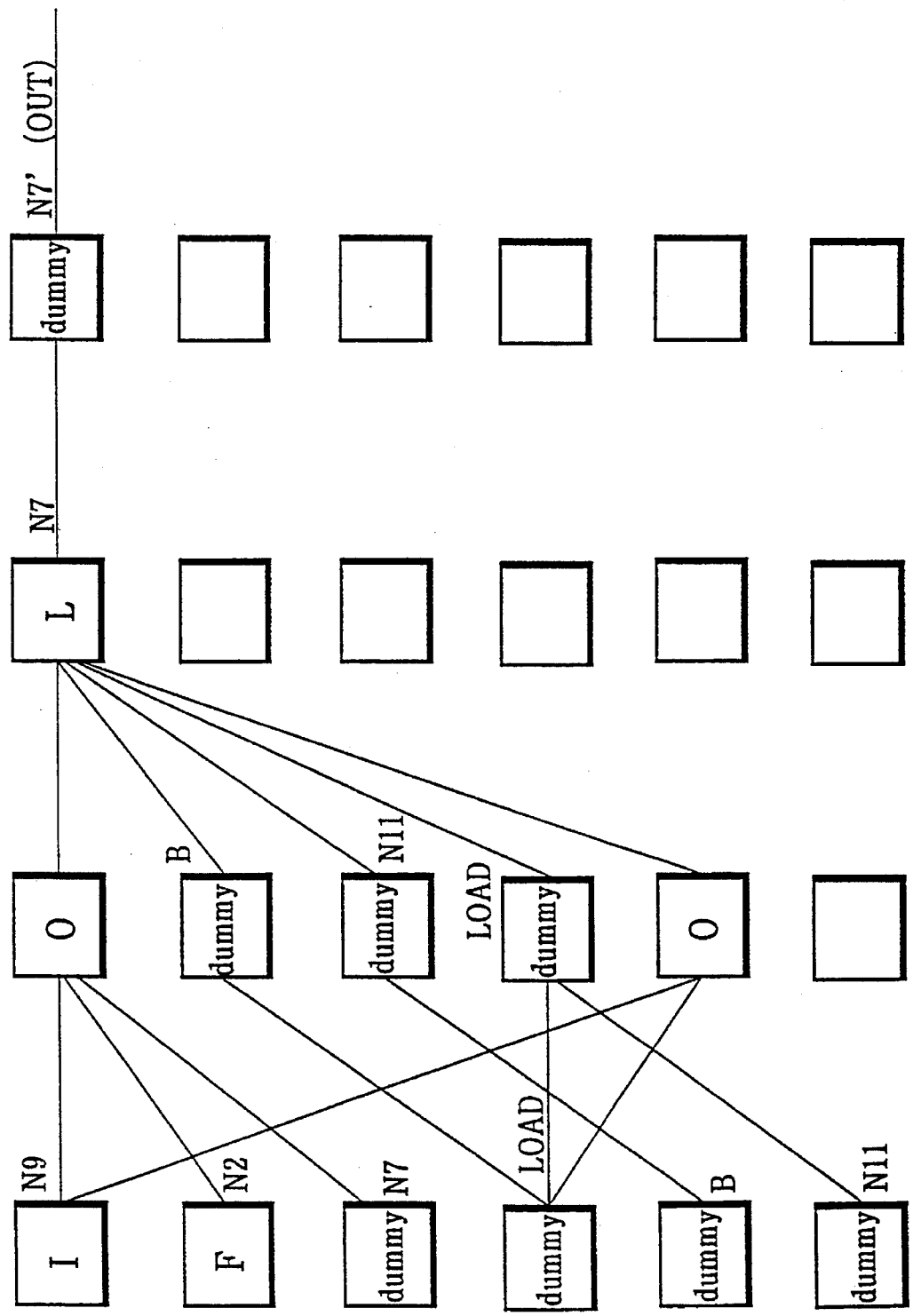

Then, the signal N11 is produced in the phase 4 shown in FIG. 18, and the signal N7' is produced in the phase 5 shown in FIG. 19.

Figure 20:
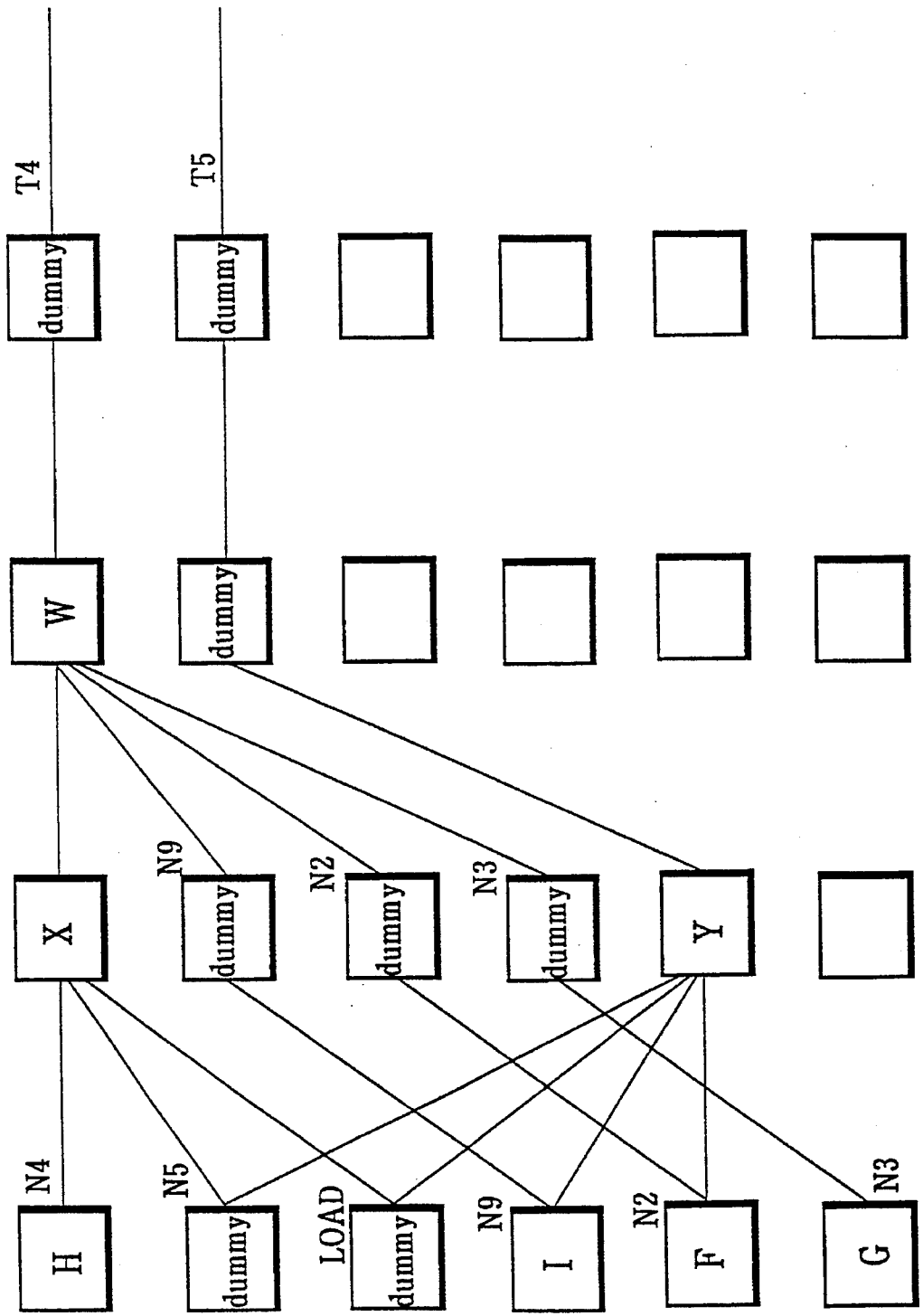
Figure 21:
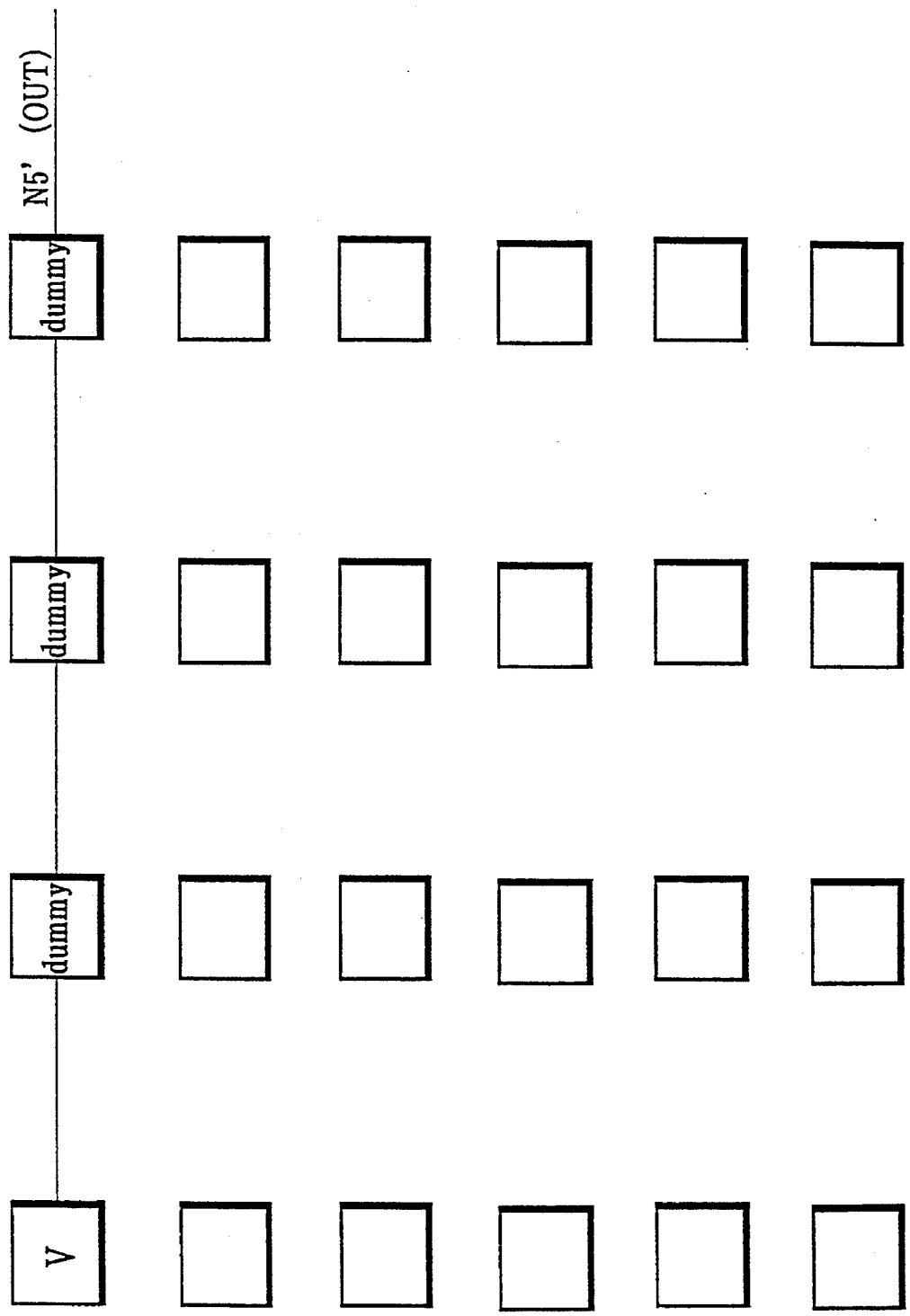

Then, the intermediate signals T4 and T5 are produced in the phase 6 shown in FIG. 20, and the signal N8' is produced in the phase 7 shown in FIG. 21.

In this manner, as the phases are switched consecutively, the wavefront can passes through all the outputs and the memory element of the simulation target in seven phases in this example.

Figure 22:
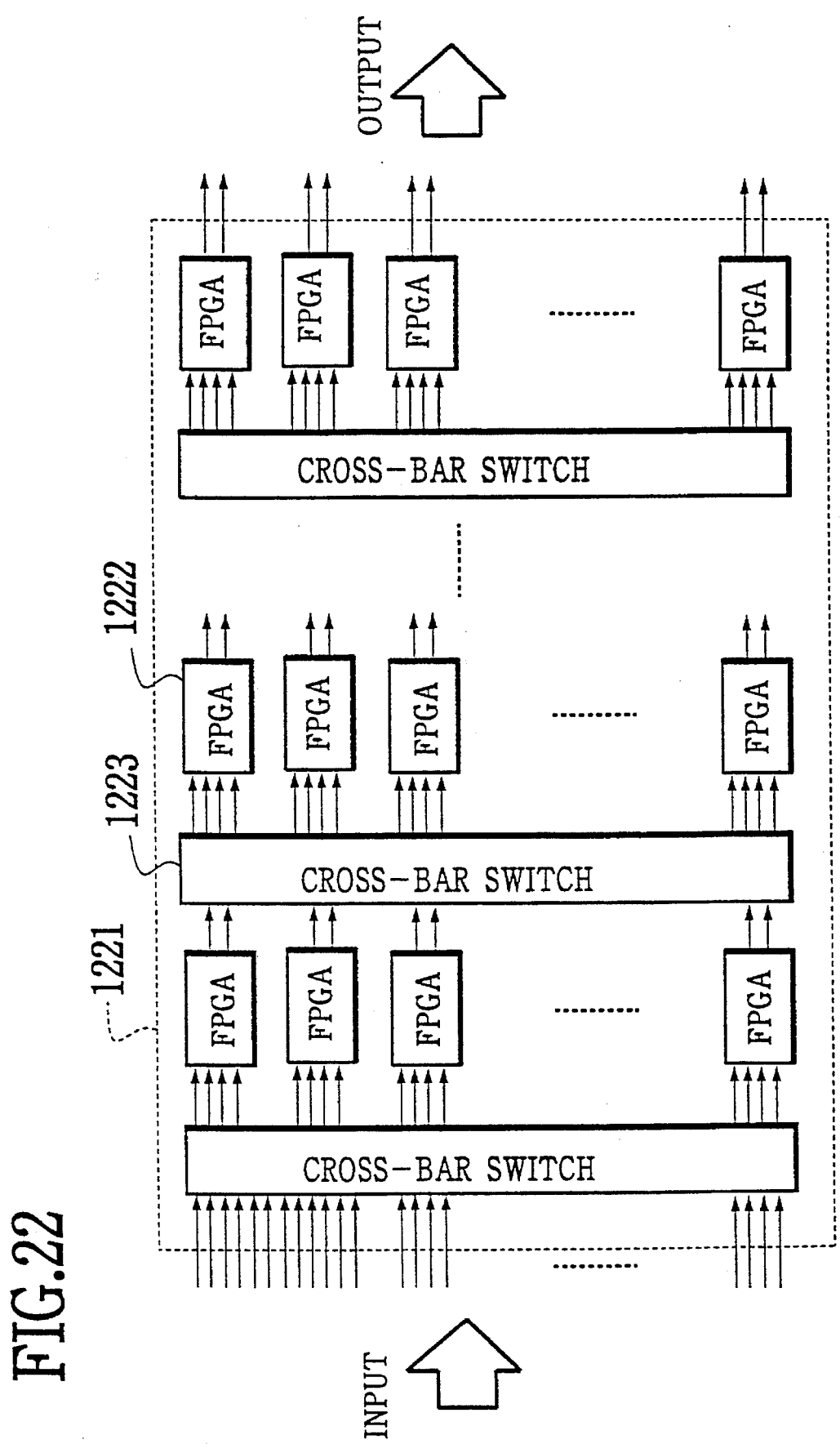
FIG. 22 is a block diagram of an emulator to be used in the second embodiment of a logic simulation system according to the present invention.

Referring now to FIG. 22, the second embodiment of a logic simulation system according to the present invention outlined above will be described in detail.

In this second embodiment, the logic simulation system has a general configuration similar to that of FIG. 2 for the first embodiment described above. Here, as shown in FIG. 22, the emulator 1221 has a configuration in which a plurality of FPGAs 1222 are interconnected in multi-stage by the cross-bar switches 1223.

Figure 23:
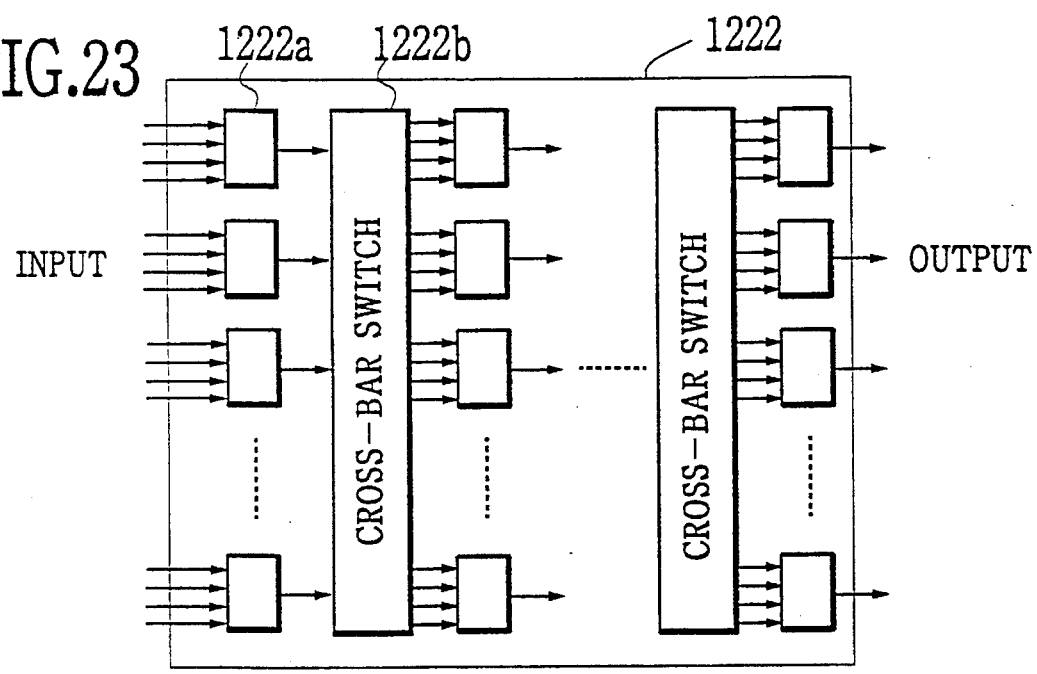
FIG. 23 is a block diagram of a field programmable gate array in the emulator of FIG. 22.

The FPGA 1222 has a configuration as shown in FIG. 23, which comprises a plurality of programmable elements 1222a interconnected in multi-stage by the cross-bar switches 1222b. In FIG. 23, each programmable element 1222a is a universal element of four inputs and one output type, although in general, it can be of M inputs and N outputs type, where M and N are positive integers. Also, in FIG. 23, the cross-bar switches 1222b can be either a complete cross-bar switch or a partial cross-bar switch.

Here, the simulation target is going to be mapped onto logic blocks formed by a plurality of the FPGAs 1222, in units of four inputs and one output circuit elements which will be referred as primitives in the following.

In this second embodiment, the conversion of the simulation target logic circuit into the primitives is carried out as follows.

Figure 24:
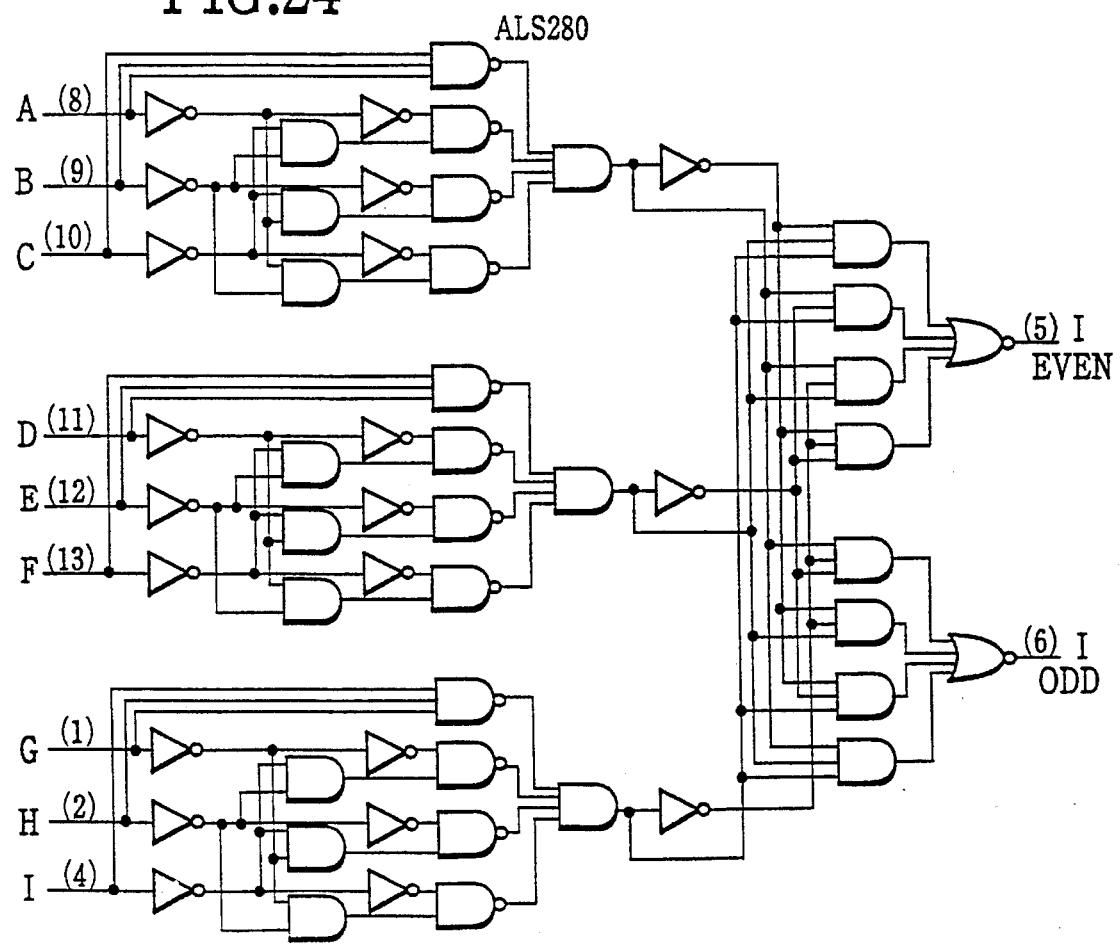
FIG. 24 is a circuit diagram of an exemplary simulation target logic circuit to be simulated by the system of FIG. 22.
Figure 25:
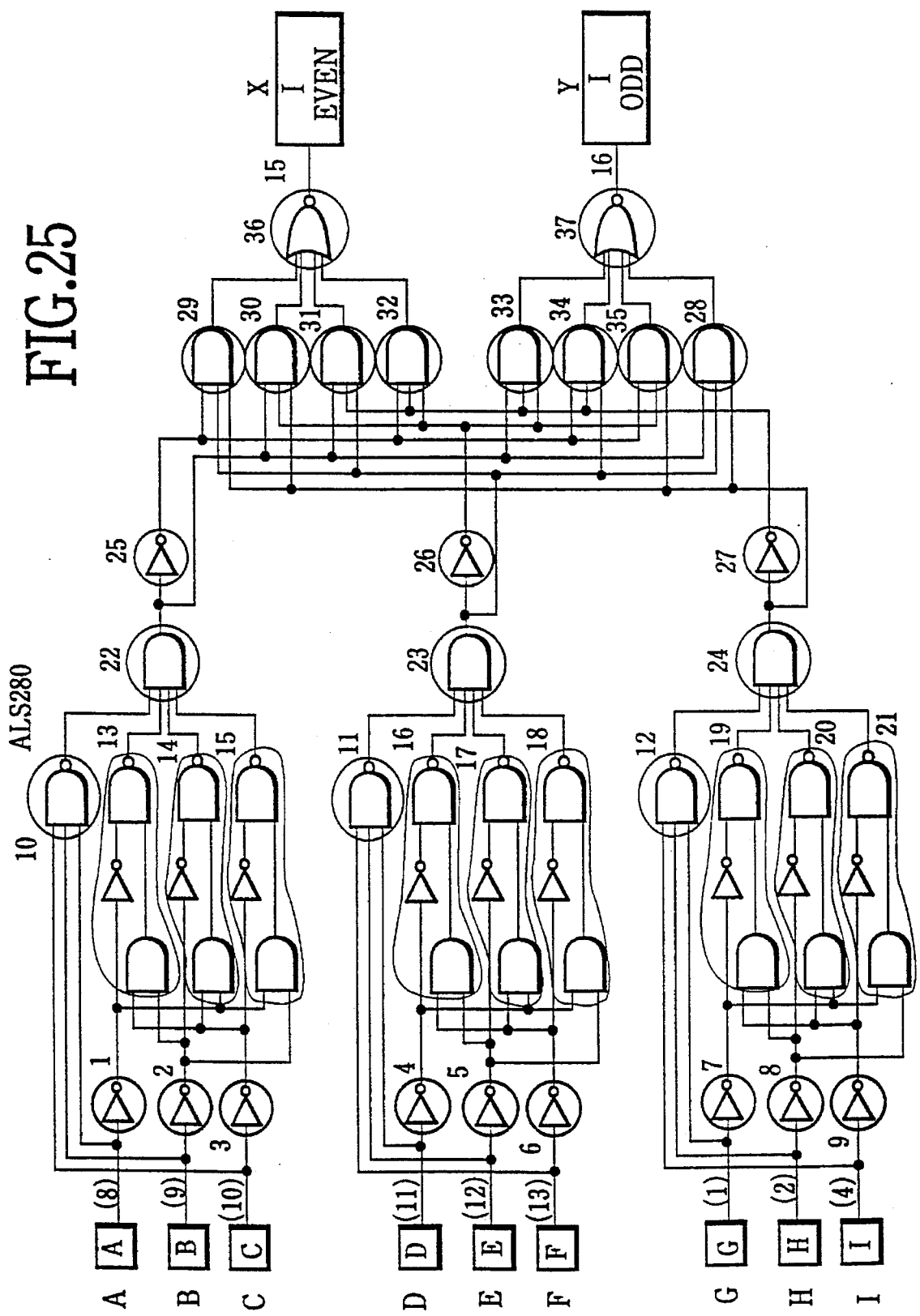
FIG. 25 is a circuit diagram of the circuit of FIG. 24 with indications of groupings of circuit elements in units of primitives.
Figure 26:
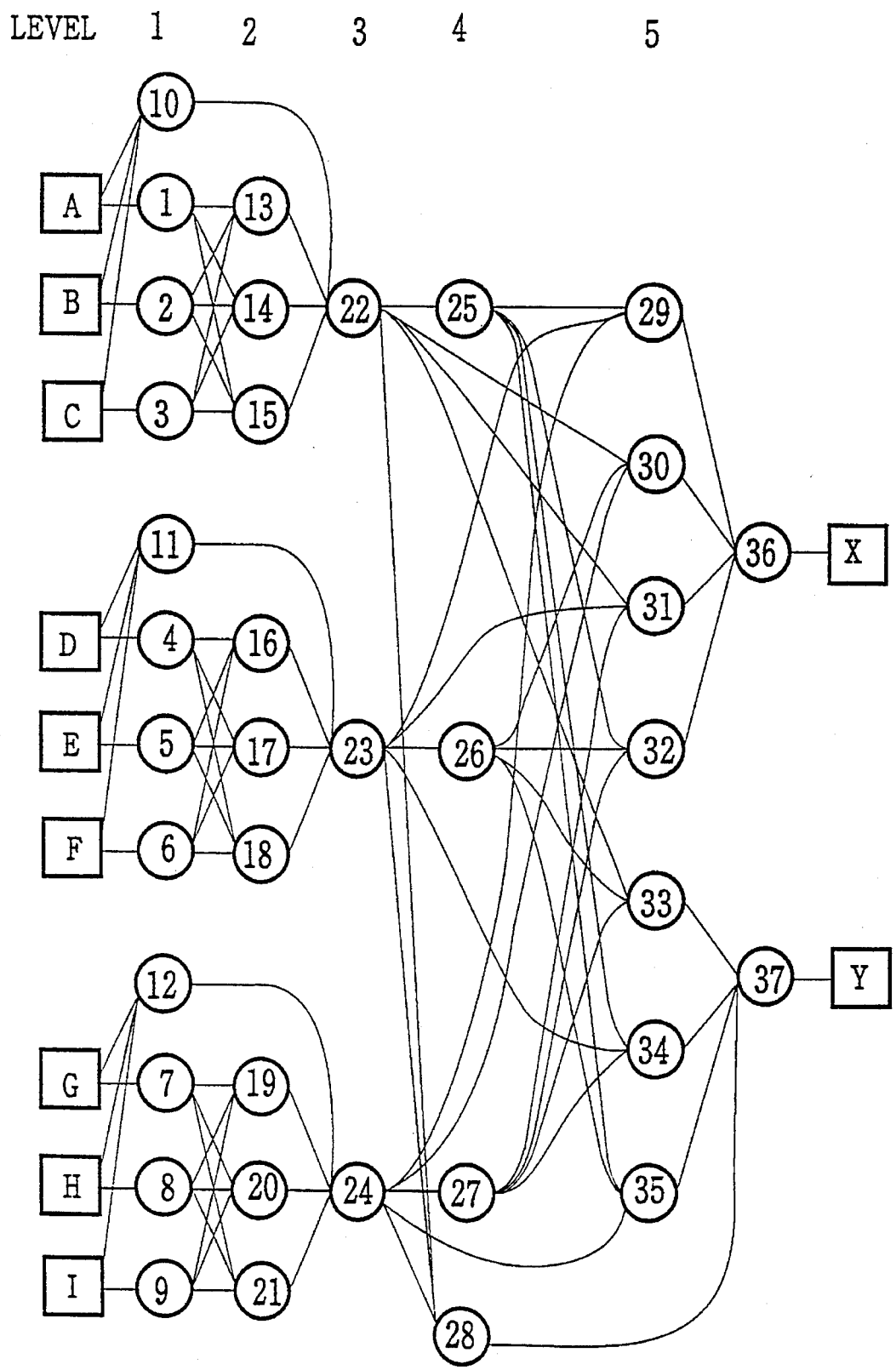
FIG. 26 is a diagram of a primitive graph for the circuit of FIG. 24 obtained according to the groupings indicated in FIG. 25.

As an example of a simulation target logic circuit, the 9 bits parity generator called SN74ALS280 manufactured by the Texas Instruments Inc. is shown in FIG. 24, which has nine inputs and two outputs. For this circuit of FIG. 24, the groupings of the circuit elements in units of primitives having four inputs and one output is shown in FIG. 25, while the primitive graph obtained according to the groupings of FIG. 25 is shown in FIG. 26. In these FIGS. 24 to 26, labels A to I represent the input signals, labels X and Y represent the output signals, and labels 1 to 37 represent the primitives.

Also, in FIG. 26, the primitives labelled 1 to 37 are level sorted according to the length of the longest path counted from the input side to the output side of each primitive. This level sorting can be achieved easily on a computer according to the known procedure in the field of the computational graph theory. According to such a known procedure, the level sorting can be achieved at a speed proportional to a number of branches involved in the graph.

Figure 27:
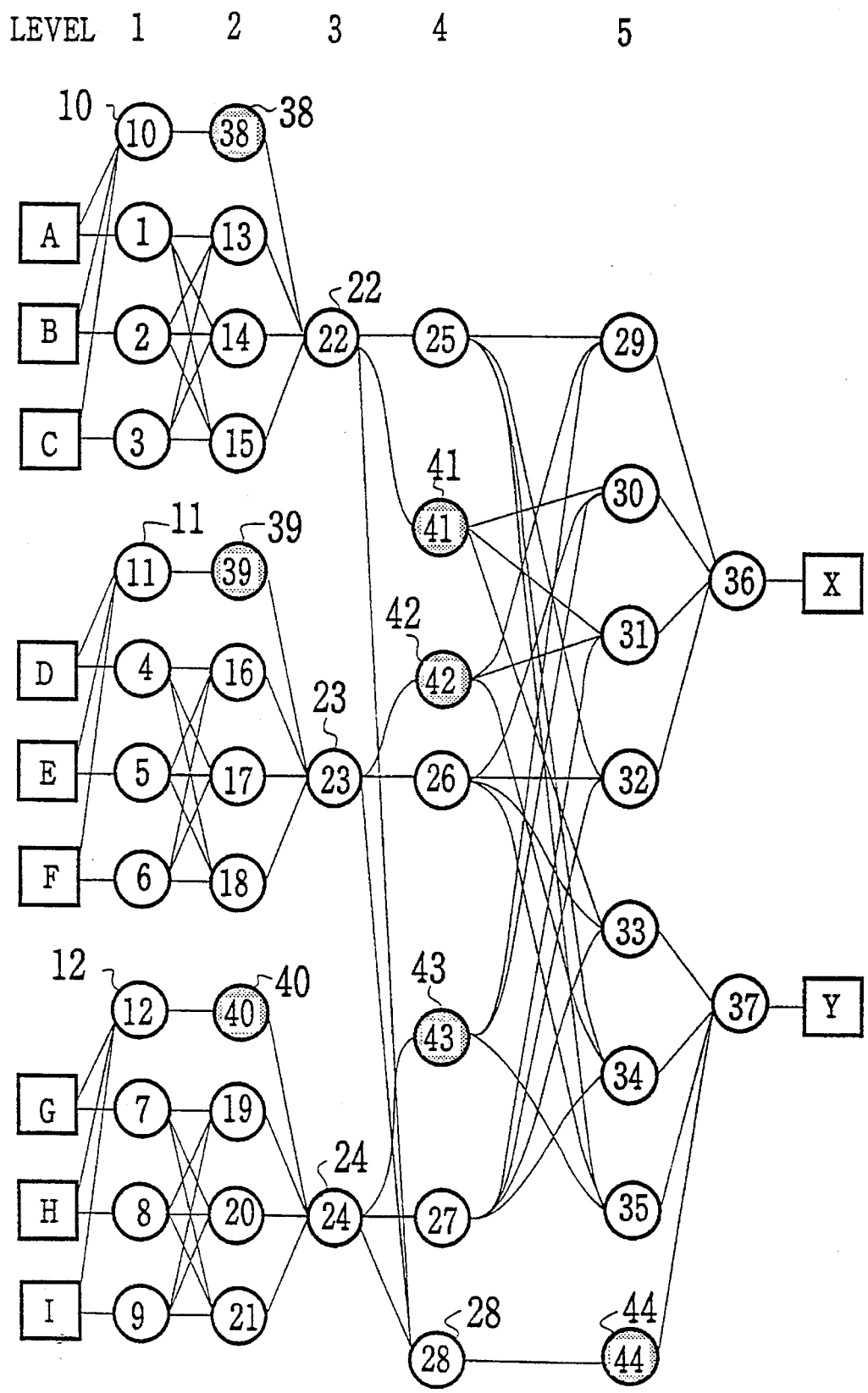
FIG. 27 is a diagram of a primitive graph of FIG. 26 with dummy primitives incorporated.

Here, only the universal elements of the adjacent levels are connected with each other, so that the transmission of the signal values between the primitives which are separated by more than one level are realized by storing the signal values in the universal elements of the intermediate levels once. To this end, the dummy primitives for signal transmission can be introduced into the primitive graph of FIG. 26, as shown in FIG. 27. In this FIG. 27, labels 38 to 44 are the dummy primitives for storing the output signals 10, 11, 12, 22, 23, 24, and 28, respectively. These dummy primitives labelled 38 to 44 are depicted with shading in FIG. 27.

Figure 28:
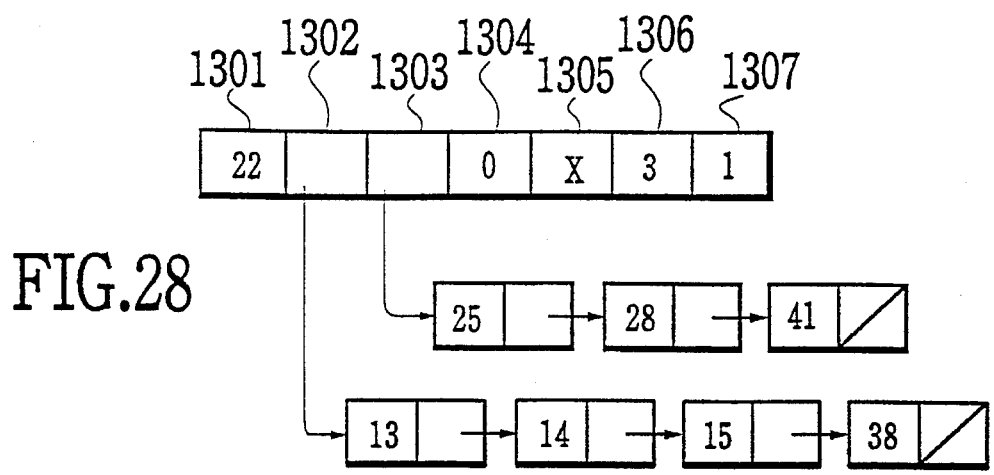
FIG. 28 is a diagram of an exemplary data structure for expressing each primitive in the primitive graph of FIG. 27.

In this primitive conversion procedure, the data structure for expressing each primitive in the primitive graph is given in a format shown in FIG. 28, which comprises an array of a primitive ID 1301, an input primitive ID list 1302, an output primitive ID list 1303, a dummy bit 1304, an original primitive ID 1305, a level 1306, and a connected component ID 1307. Here, the primitive ID 1301, the input primitive ID list 1302, and the output primitive ID list 1303 define a connection information for the graph, the dummy bit 1304 and the original primitive ID 1305 define a dummy primitive information, and the level 1306 and the connected component ID 1307 define a mapping information. In the format of FIG. 28, these informations are all arranged in a single array, but each of these informations may be arranged in separate array if desired. The dummy bit 1304 takes a value 1 when the primitive is the dummy primitive, or a value 0 otherwise. The original primitive ID 1305 is valid only when the primitive is the dummy primitive, and stores the primitive ID of the original primitive from which this dummy primitive has originated.

Now, a case of mapping the simulation target logic circuit represented by the primitive graph of FIG. 27 onto an emulator with a multi-stage cross-bar connection formed by the FPGAs is considered. Here, each FPGA has twelve primitives arranged in 4×3 matrix array, and the FPGAs are arranged in 3×3 matrix array.

In this case, the mapping is carried out according to the flow chart of FIG. 29 as follows.

First, at the step 2901, the simulation target logic circuit is converted into the primitive graph in a form shown in FIG. 27 as described above.

Then, until all the parts of the simulation target logic circuit are mapped at the step 2902, the following steps 2903 to 2908 are repeated.

Figure 30:
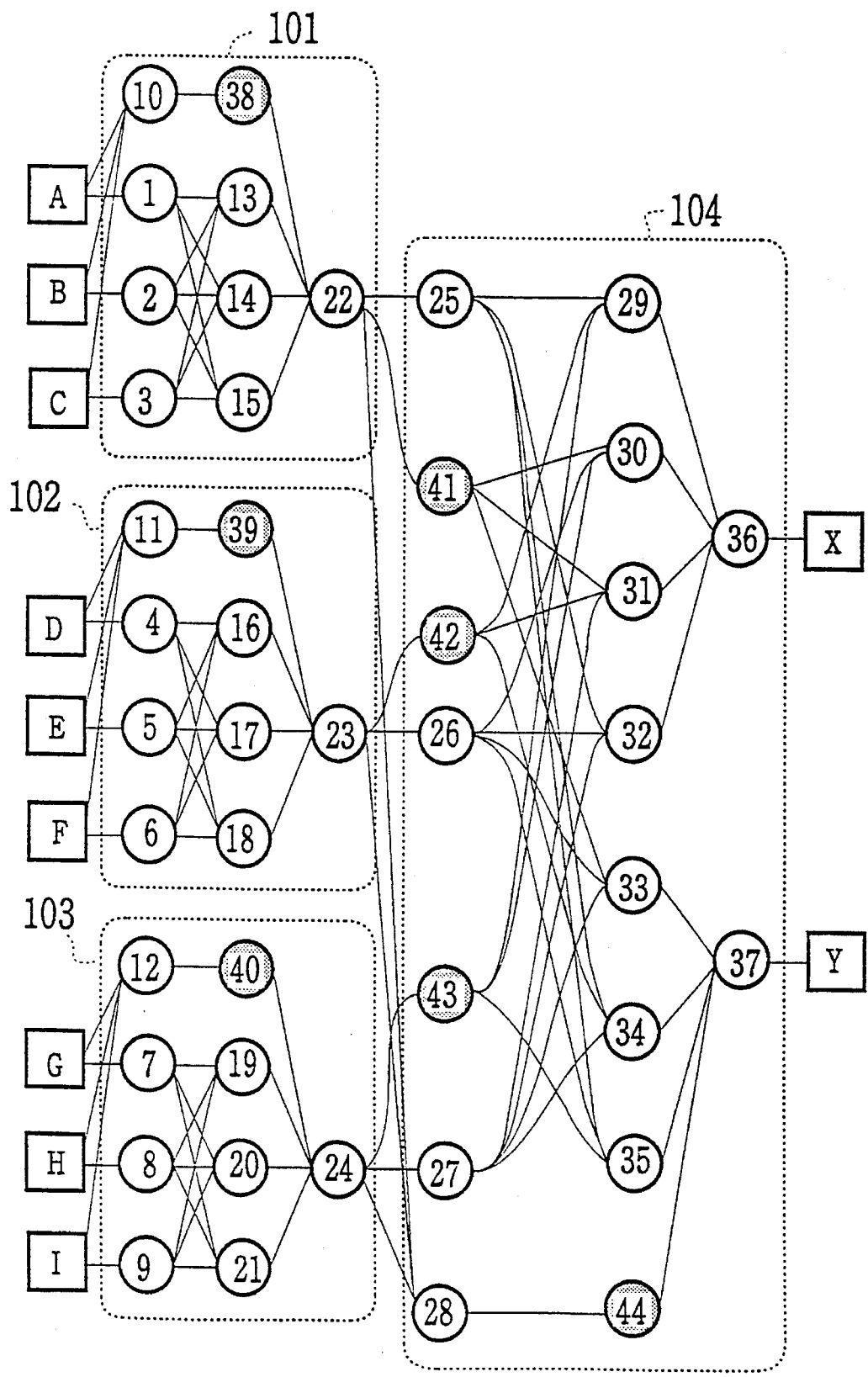
FIG. 30 is a primitive graph of FIG. 27 with indications of connected components obtained in the mapping of the circuit of FIG. 24 according to the flow chart of FIG. 29.

At the step 2903, the primitive graph is divided into connected components, where each connected component is grouping the mutually connected primitives over three levels, starting from the level 1, in correspondence to a number of stages of the FPGAs in the emulator which is equal to three in this case. As a result of this division, connected components 101 to 104 as shown in FIG. 30 can be obtained.

It is to be noted here that, for some primitive graphs, this division may be carried out more conveniently by using the grouping over a number of levels less than a number of stages of the FPGAs in the emulator, such as the grouping over two levels rather than three levels for example. Also, the division may not necessarily be applied to the entire primitive graph all at once. For example, after the mapping onto each stage of the FPGAs is finished, the levels of the primitives can be re-calculated from the updated wavefront of the circuit, and this division can be applied to the primitives level sorted by using the re-calculated new levels.

Next, at the step 2904, the connected component IDs are assigned in such a manner that the connected components for the larger levels are given the larger ID number. Among the connected components for the same levels, such as 101, 102, and 103 of FIG. 30, the IDs can be assigned in an arbitrary order. In the following, the connected components 101, 102, 103, and 104 of FIG. 30 are assumed to be given the connected component IDs of 1, 2, 3, and 4, respectively. Thus, for example, the data shown in FIG. 28 represents the primitive 22 at the level 3 in the connected component 101 whose connected component ID 1307 is 1.

Then, at the step 2905, the number of the connected components is set to N, and an index 1 for specifying each connected component is set to an initial value 1.

Figure 31:
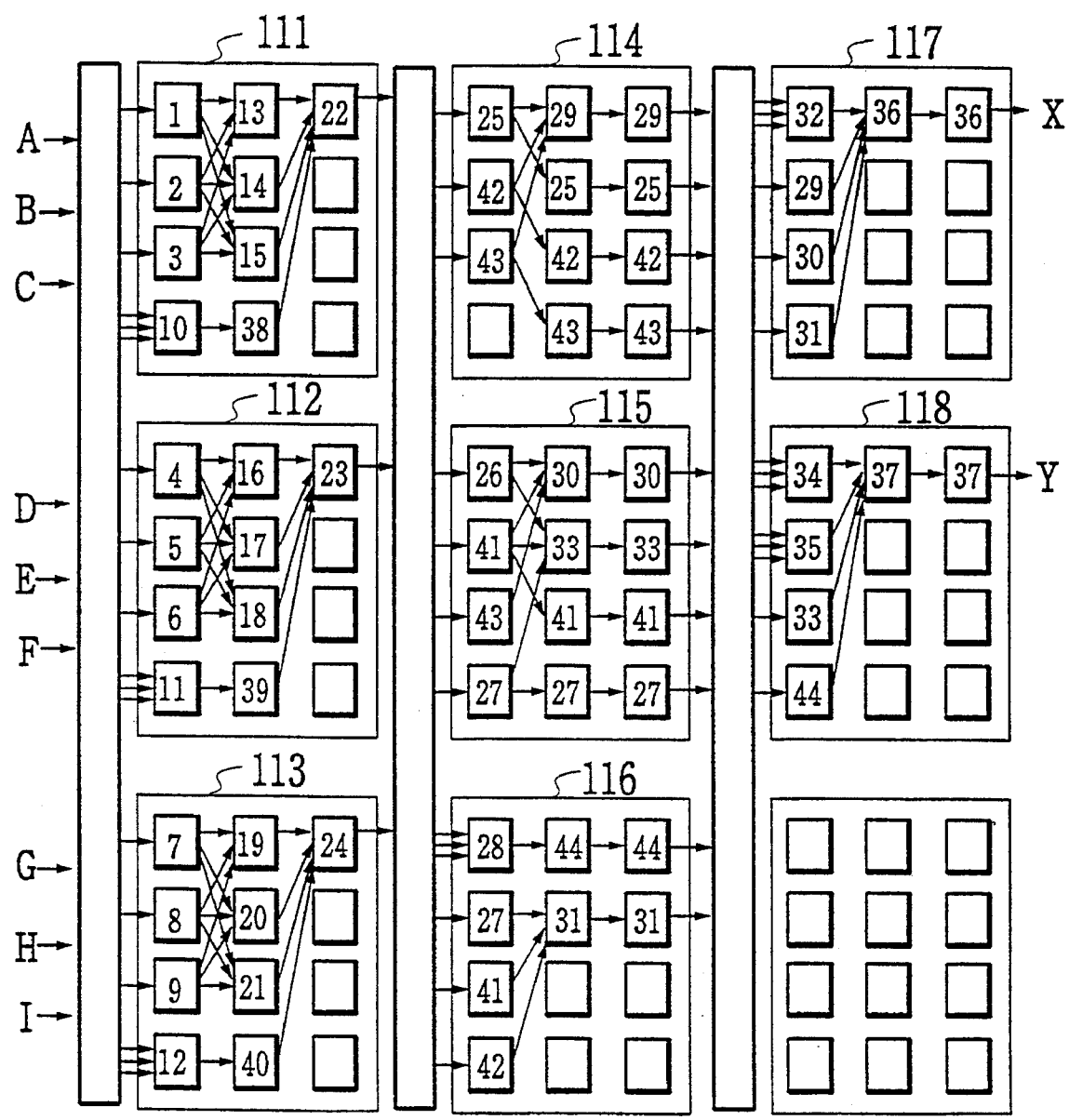
FIG. 31 is a diagram of the emulator showing the result of the mapping of the primitive graph of FIG. 27 according to a mapping scheme (1): a mapping of the connected primitives in an order of their positions in the connections.

Next, at the steps 2906 to 2908, the mapping of each connected component is carried out In an order of the connected component IDs by sequentially incrementing the index 1 at the step 2907 until it becomes equal to N at the step 2908. In a case of FIG. 30, each of the connected components 101, 102, and 103 is in the size that can be contained in one FPGA, so that each of these connected components is mapped onto one FPGA. As a result, the connected components 101, 102, and 103 of FIG. 30 are mapped onto the FPGAs 111, 112, and 113, respectively, as shown in FIG. 31. In this manner, the mapping onto the FPGAs of the first stage of the emulator can be made efficiently.

As for the connected component 104 of FIG. 30, it is larger than the size of each FPGA so that it cannot be mapped onto a single FPGA. In this case, the mapping of this connected component 104 is carried out by one of the following four mapping schemes.

(1) A mapping of the connected primitives in an order of their positions in the connections.

(2) A mapping of the connected primitives in an order of their primitive IDs.

(3) A mapping in an order of the levels of the primitives, starting from a lowest level.

(4) A further division of each connected component into smaller connected components by duplicating some primitives, and mapping in units of the smaller connected components.

As indicated in FIG. 31, according to the mapping scheme (1), one of the primitives at the lowest level in the connected component 104 is arbitrarily selected as a starting point, and the mapping onto the next FPGA 114 is started from this selected primitive. In the following, it is assumed that the primitive 25 has been selected as a starting point. Then, one of the primitives connected with this selected primitive 25 on its output side, such as a primitive 29, is mapped onto the FPGA 114, and the primitives connected with this primitive 29 on its input side, such as the primitives 42 and 48 are mapped onto the FPGA 114. At this point, there are still some primitives connected with the already mapped primitives 25, 42, and 43 on their output side, so that these primitives 25, 42, and 43 must be lead to the output pins of this FPGA 114 by using the dummy primitives. As a consequence, due to the limitation imposed by the number of output pins available in each FPGA, no more primitive can be mapped onto this FPGA 114, so that the mapping onto this FPGA 114 is finished at this point. Then, the mapping onto the FPGAs 115 and 116 of the second stage of the emulator is carried out in the similar manner, and then the mapping onto the FPGAs 117 and 118 of the third state of the emulator is carried out in the similar manner, to obtain the result shown in FIG. 31.

Figure 32:
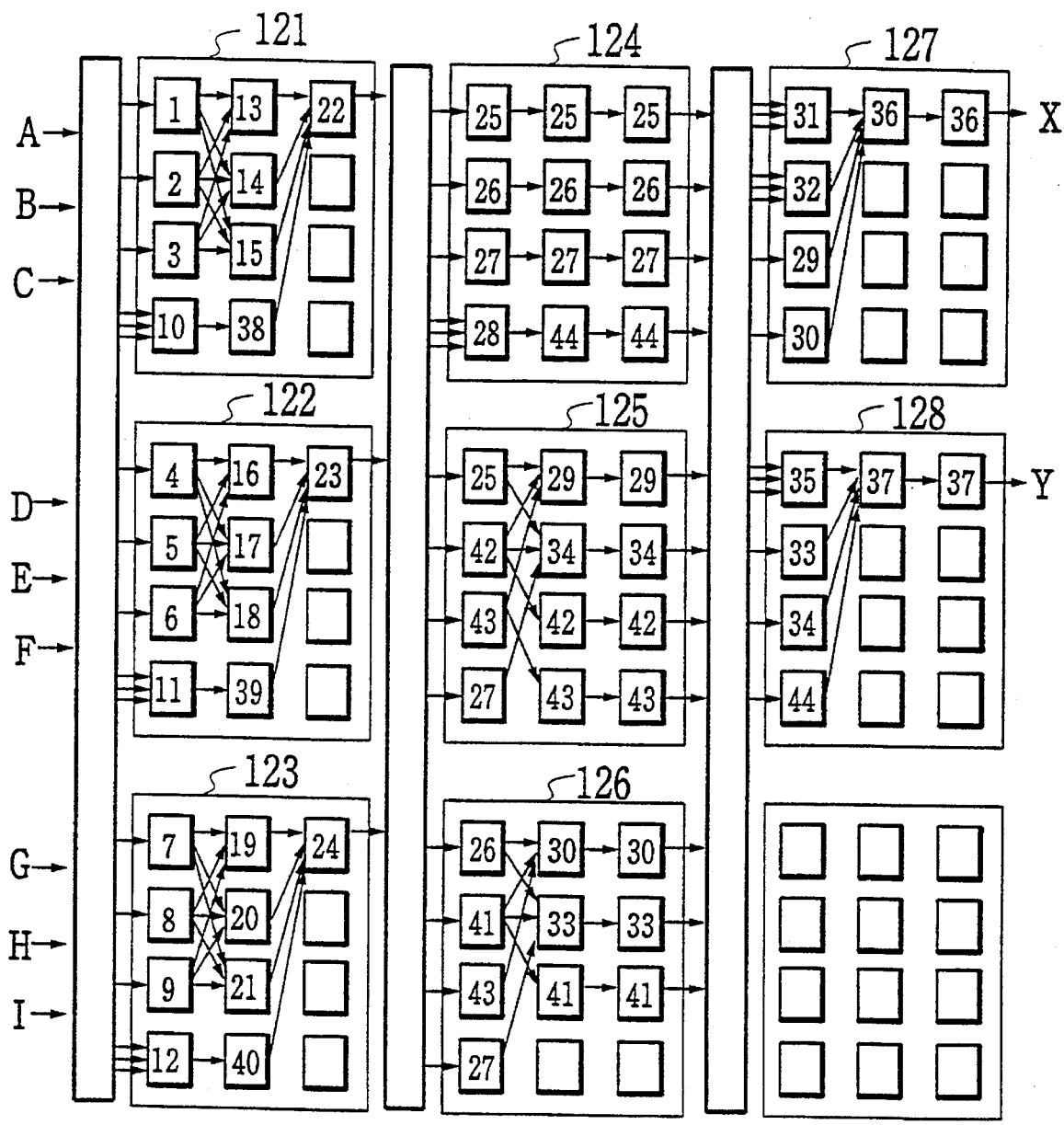
FIG. 32 is a diagram of the emulator showing the result of the mapping of the primitive graph of FIG. 27 according to a mapping scheme (2): a mapping of the connected primitives in an order of their primitive IDs.
Figure 33:
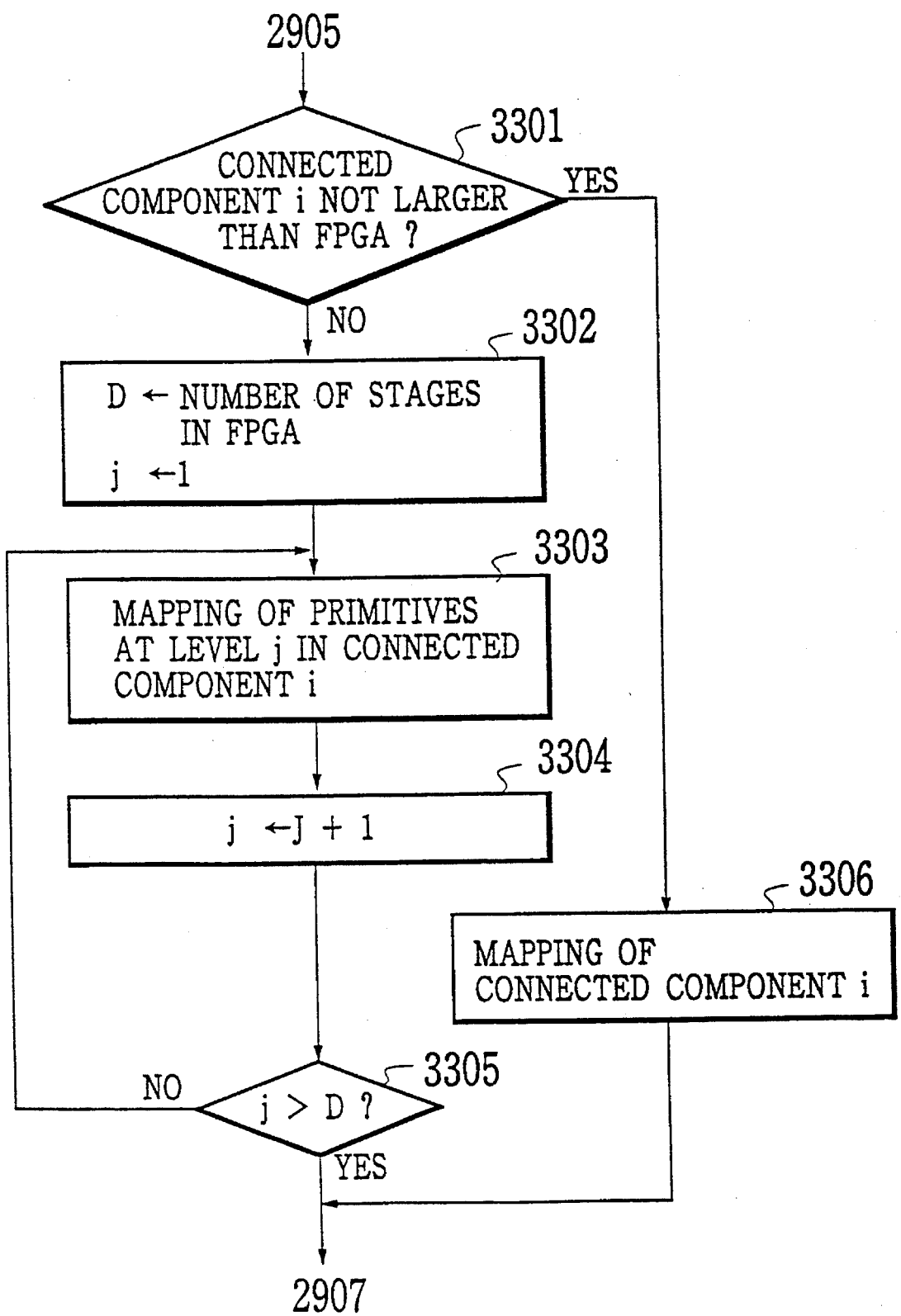
FIG. 33 is a flow chart of the operation in a mapping scheme (3): a mapping in an order of the levels of the primitives, starting from a lowest level.

On the other hand, according to the mapping scheme (2), the primitives of the connected component 104 are mapped in an order of their primitive IDs, starting from the primitive 25 which has the smallest primitive ID among the primitives of the connected component 104. Thus, as shown in FIG. 32, the primitives 25, 26, 27, 28, and 44 are mapped onto the FPGA 124 of the second stage of the emulator. Then, the next primitive 29 is mapped onto the next FPGA 125 of the second stage of the emulator. Here, before the primitive 29, the primitives on the input side of this primitive 29 must be mapped onto this FPGA 125, so that the primitives 25, 42, and 43 are mapped onto the first stage of this FPGA 125. In this case, the following primitives 30, 31, 32, and 33 cannot be mapped onto this FPGA 125 due to the limitation imposed by the number of pins and the number of universal elements available in each FPGA, but the primitive 34 is not affected by this limitation, so that this primitive 34 is also mapped onto this FPGA 125. In this manner, the mapping onto the FPGAs 126, 127, and 128 are carried out, to obtain the result shown in FIG. 32.

In contrast, the mapping scheme (3) is suitable for improving the circuit filling rate. Namely, in order to improve the circuit filling rate, it is more preferable to carry out the mapping in an order of the levels of the primitives, starting from a lowest level, because the circuit elements constituting the critical path in the signal flow from the input side to the output side can be mapped onto the earlier stage of the emulator, compared with the mapping schemes (1) and (2) which trace along the connections among th primitives.

This mapping scheme (3) is carried out according to the flow chart of FIG. 83, which is to be substituted into the step 2906 of the flow chart of FIG. 29, as follows.

First, at the step 3301, whether the connected component i is not larger than the size of the FPGA or not is determined. In a case the connected component i is not larger than the size of the FPGA, this connected component i can be mapped onto a single FPGA, so that the mapping of this connected component i to one FPGA is carried out at the step 3306 next, and the process proceeds to the step 2907 of the flow chart of FIG. 29.

On the other hand, when the connected component i is larger than the size of the FPGA, next at the step 3302, the number of stages in the FPGA is set to D, and an index j for specifying each level is set to an initial value 1.

Then, at the steps 3303 to 3305, the mapping of each primitive of this connected component i is carried out in an order of the levels, by sequentially incrementing the index j at the step 3804 until it becomes equal to D at the step 3305. When the sequentially incremented index j exceeds D, the process proceeds to the step 2907 of the flow chart of FIG. 29.

Figure 34:
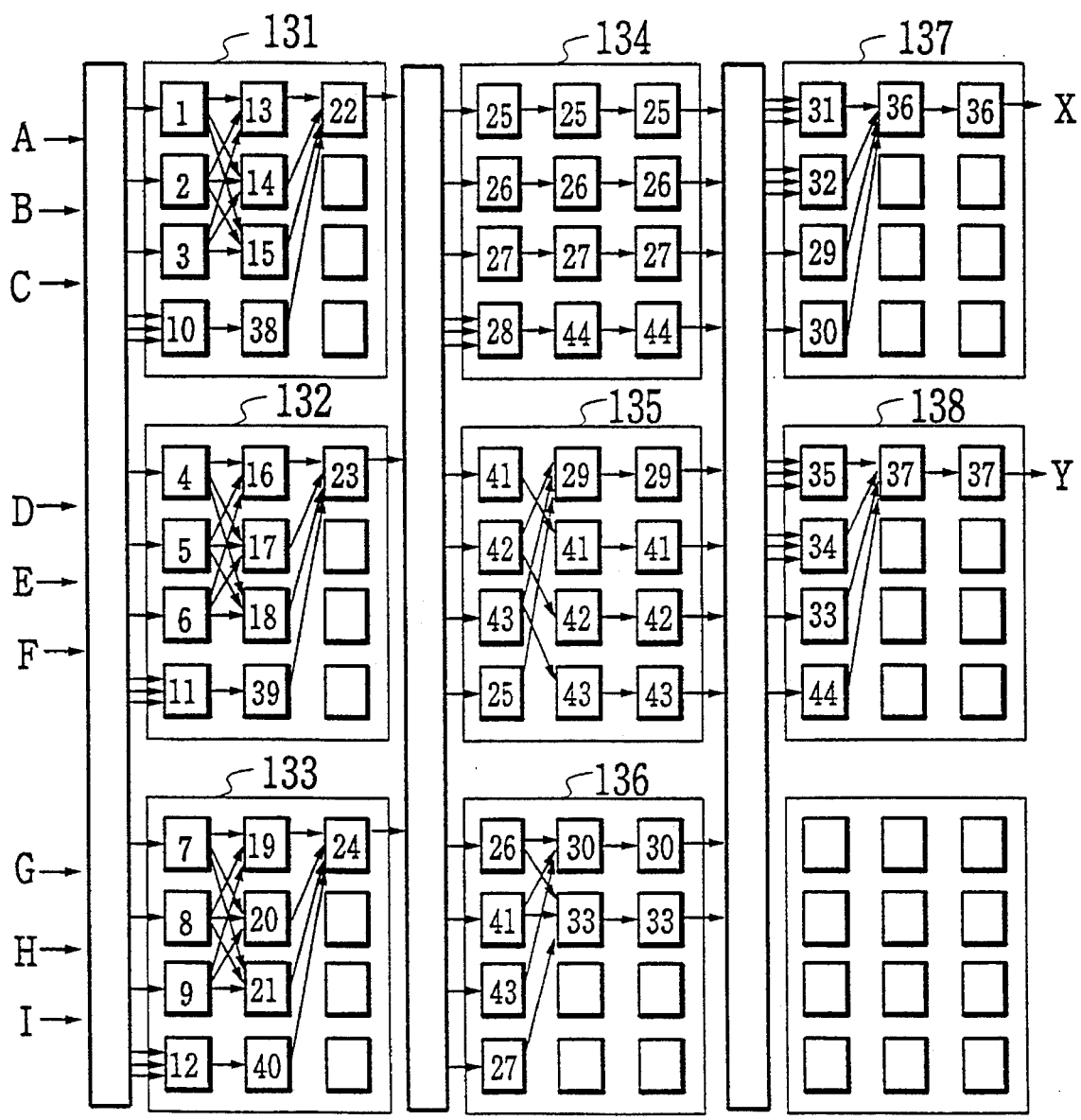
FIG. 34 is a diagram of the emulator showing the result of the mapping of the primitive graph of FIG. 27 according to the mapping scheme (3).

As shown in FIG. 34, according to this mapping scheme (3), the primitives 25, 26, 27, and 28 at the level 4 are mapped onto the FPGA 134 of the second stage of the emulator, along with the primitive 44 at the level 5 which can fill in the remaining universal elements of this FPGA 134 within the limitation imposed by the number of pins and the number of universal elements available in each FPGA. Then, the primitives 41, 42, and 43 at the level 4 are mapped onto the next FPGA 135 of the second stage of the emulator, along with the primitive 29 at the level 5 which can fill in the remaining universal elements of this FPGA 134 within the limitation imposed by the number of pins and the number of universal elements available in each FPGA. At this point, all the primitives at the level 4 which is the lowest level in the connected component 104 are mapped onto the FPGAs 134 and 135. Then, the next primitive 30 at the level 5 is mapped onto the next FPGA 136 of the second stage of the emulator. Here, before the primitive 30, the primitives on the input side of this primitive 30 must be mapped onto this FPGA 136, so that the primitives 26, 41, and 43 are mapped onto the first stage of this FPGA 136. In this case, the following primitives 31 and 32 cannot be mapped onto this FPGA 136 due to the limitation imposed by the number of pins and the number of universal elements available in each FPGA, but the primitive 33 is not affected by this limitation, so that this primitive 33 is also mapped onto this FPGA 136 along with the primitive 27 on its input side. In this manner, the mapping onto the FPGAs 137 and 138 are carried out, to obtain the result shown in FIG. 34.

Here, it is to be noted that, in view of the mapping result for the FPGAs 137 and 138, the mapping of the primitives 30 and 33 onto the FPGA 136 is superfluous. This implies that all the connected components of FIG. 30 can be mapped into only seven FPGAs in this mapping scheme (3), in contrast to the mapping schemes (1) and (2) which require eight FPGAs as described above, so that the circuit filling rate for the FPGAs is improved in this mapping scheme (3).

Thus, for the connected component in a size larger than the size of the FPGA, it is preferable to carry out the mapping in an increasing order of the levels according to the mapping scheme (3). This mapping scheme (3) has hardly any overhead in the required calculation time, so that the mapping can be carried out at a high speed according to this mapping scheme (3).

Finally, the mapping scheme (4) is also effective in dealing with the connected component in a size larger than the size of the FPGA. In this mapping scheme (4), the primitive having many connections with the other primitives is duplicated to divide the connected components into smaller connected components, each of which is smaller than the size of the FPGA.

Figure 35:
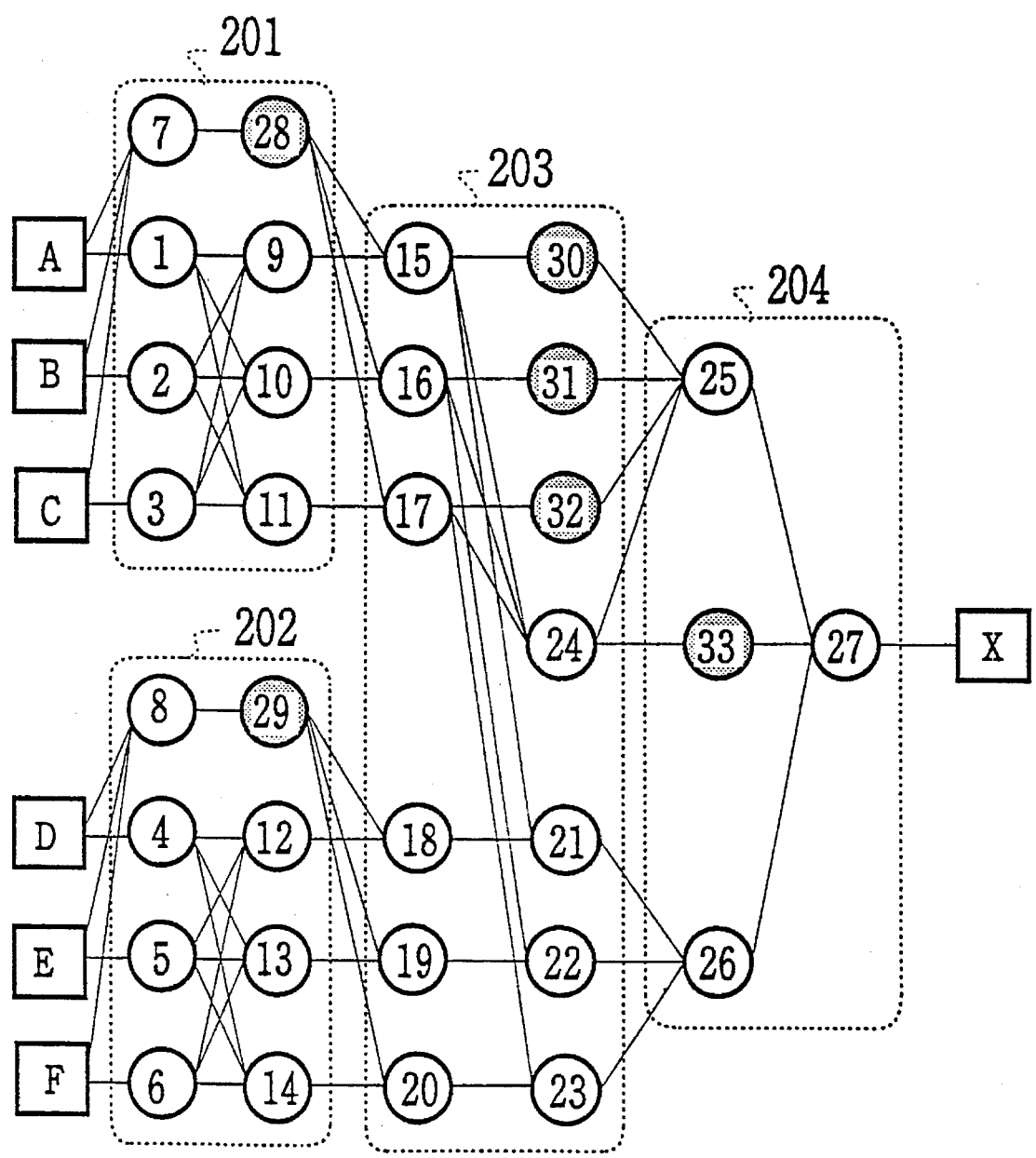
FIG. 35 is a diagram of an exemplary primitive graph for explaining a mapping scheme (4): a further division of each connected component into smaller connected components by duplicating some primitives, and mapping in units of the smaller connected components.

Here, the explanation is given for a case of mapping the simulation target logic circuit represented by the primitive graph of FIG. 35 onto an emulator with a multi-stage cross-bar connection formed by the FPGAs in which each FPGA has eight primitives arranged in 4×2 matrix array, and the FPGAs are arranged in 3×3 matrix array.

In this case, as a result of the division of this primitive graph by using the grouping of the mutually connected primitives over two levels in correspondence to a number of stages of the FPGAs in the emulator which is equal to two, the connected components 201 to 204 as shown in FIG. 35 can be obtained. Among these connected components, the connected component 203 has the size larger than the size of the FPGA.

Figure 36:
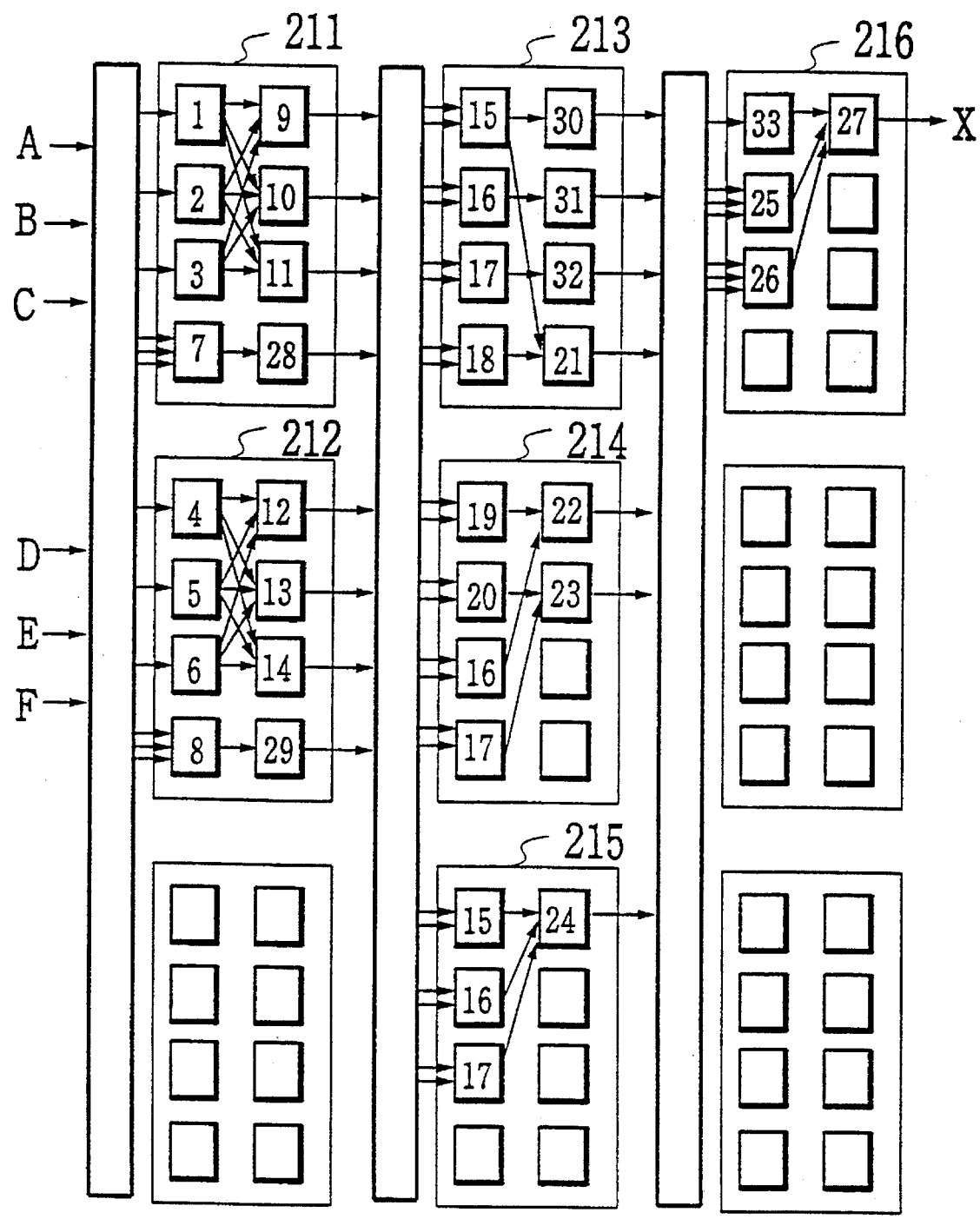
FIG. 36 is a diagram of the emulator showing the result of the mapping of the primitive graph of FIG. 35 according to the mapping scheme (3).

FIG. 36 shows a result of mapping obtained for the primitive graph of FIG. 35 by the mapping scheme (2) or (3). In this case, three FPGAs 213 to 215 are required for mapping the connected component 203.

Now, among the primitives at the lowest level in the connected component 203, a primitive having a greatest number of other primitives connected on its output side is selected and duplicated. In this case, any one of the primitives 15, 16, and 17 can be selected as such a primitive. Here, It is assumed that the primitive 15 is selected and duplicated. Then, the connections among the primitives in this connected component 203 as shown in FIG. 37A can be decomposed by using the duplications 151 and 152 of the selected primitive 15, such that as shown in FIG. 37B, the connected component 203 can be further divided into three smaller connected components 221, 222, and 223.

In this case, the smaller connected component 223 still has a size larger than the size of the FPGA, so that the similar procedure for the further division using the duplications is applied to this smaller connected component 223. Here, the primitives 16 and 17 are duplicated such that the smaller connected component 223 is further divided into five even smaller connected components by using the duplications 161 and 162 of the primitive 16 and the duplications 171 and 172 of the primitive 17.

As a result, as shown in FIG. 37C, the connected component 203 can be decomposed into seven smaller connected components 231 to 237, each of which has a size smaller than the size of the FPGA. Then, these smaller connected components 231 to 237 can be assigned with the connected component IDs 3 to 9 while the connected components 201, 202, and 204 are assigned with the connected component IDs 1, 2, and 10, respectively, such that the primitive graph of FIG. 35 is decomposed into ten connected components in sizes not larger than the size of the FPGA.

Figure 38:
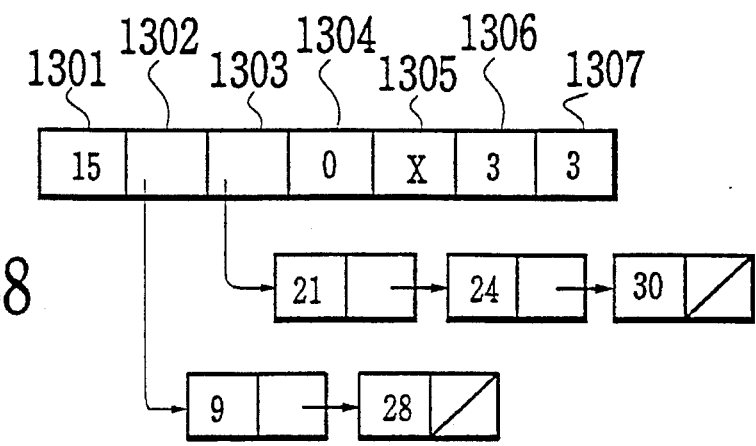
FIG. 38 is a diagram of an exemplary data structure for expressing each primitive in the primitive graph of FIG. 35, before the further division of the connected component according to the mapping scheme (4).
Figure 39:
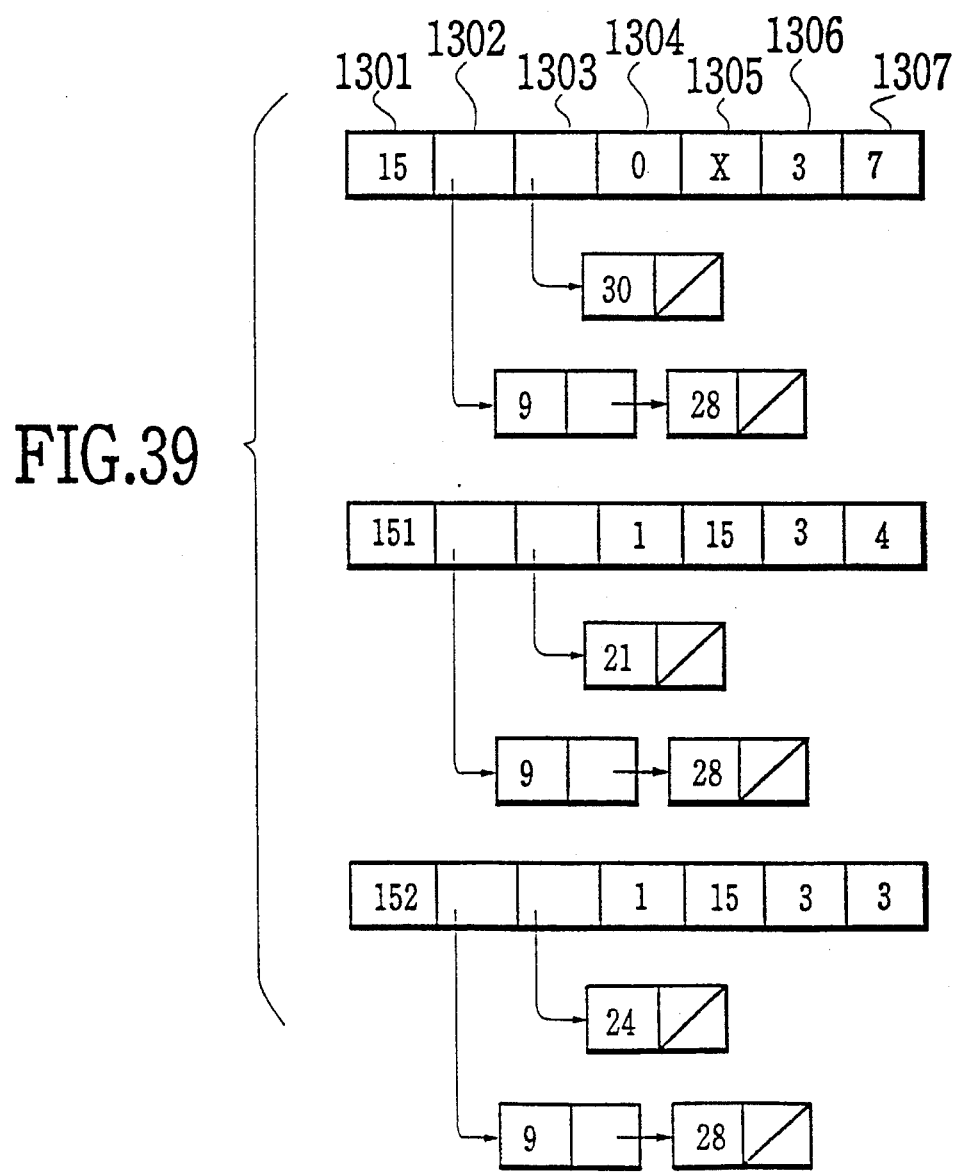
FIG. 39 is a diagram of an exemplary data structure for expressing each primitive in the primitive graph of FIG. 35, after the further division of the connected component according to the mapping scheme (4).

In this process, the data of the primitive 15 changes from a state before the duplication as shown in FIG. 38 to a state after the duplication as shown in FIG. 39. Namely, the primitive 15 in FIG. 38 is divided into three primitives 15, 151, and 152 in FIG. 39, where each of the primitives 15, 151, and 152 in FIG. 39 has only one output primitive enlisted in the output primitive ID list 1303. Also, the input primitive ID list 1302 of each of the dummy primitives 151 and 152 has the same input primitives as the input primitive ID list 1302 of the original primitive 15.

Next, the smaller connected components 281 to 287 obtained above are combined within the limitation that the size of the combined connected component should not be larger than the size of the FPGA, by the following procedure.

(1) Let C and T be empty sets, and U be a set having the smaller connected components obtained above as its elements.

(2) If U is empty, the process is terminated.

(3) Select an element A of U having the largest size among the elements of U.

(4) Let a graph obtained by merging T and A be S.

(5) If U is smaller than the size of the FPGA, T is replaced by S and A is eliminated from U. Otherwise, T is registered in C.

(6) Go to the step (2).

Here, as a result of the merging at the step (4), the set C resulting from this procedure contains the smaller connected components combined within the limitation that the size of the combined connected component should not be larger than the size of the FPGA. In this procedure, when the original primitive ID 1305 for one dummy primitive coincides with the primitive ID of some other primitive, this one dummy primitive can be combined with that some other primitive. Also, at the step (3), when there are more than one elements of U having the same largest size, the element having the smallest connection component ID is selected. The data of the primitives can be changed similarly to the case of the division as shown in FIGS. 38 and 39 described above, and the data of the combined dummy primitive can be deleted if necessary.

Figure 40:
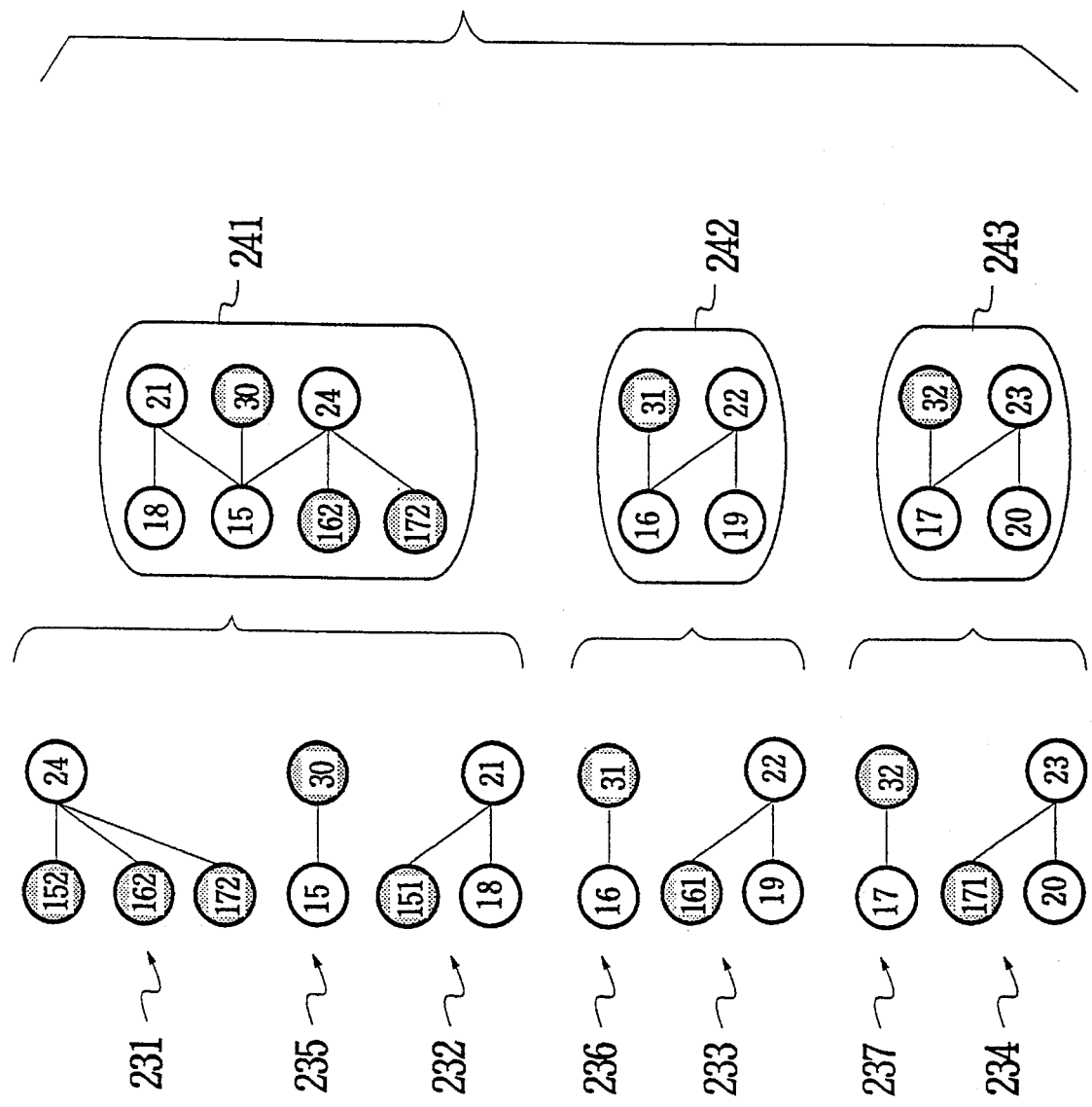
FIG. 40 is a diagram of smaller connected components obtained by combining the divided components into smaller connected components according to the mapping scheme (4).
Figure 41:
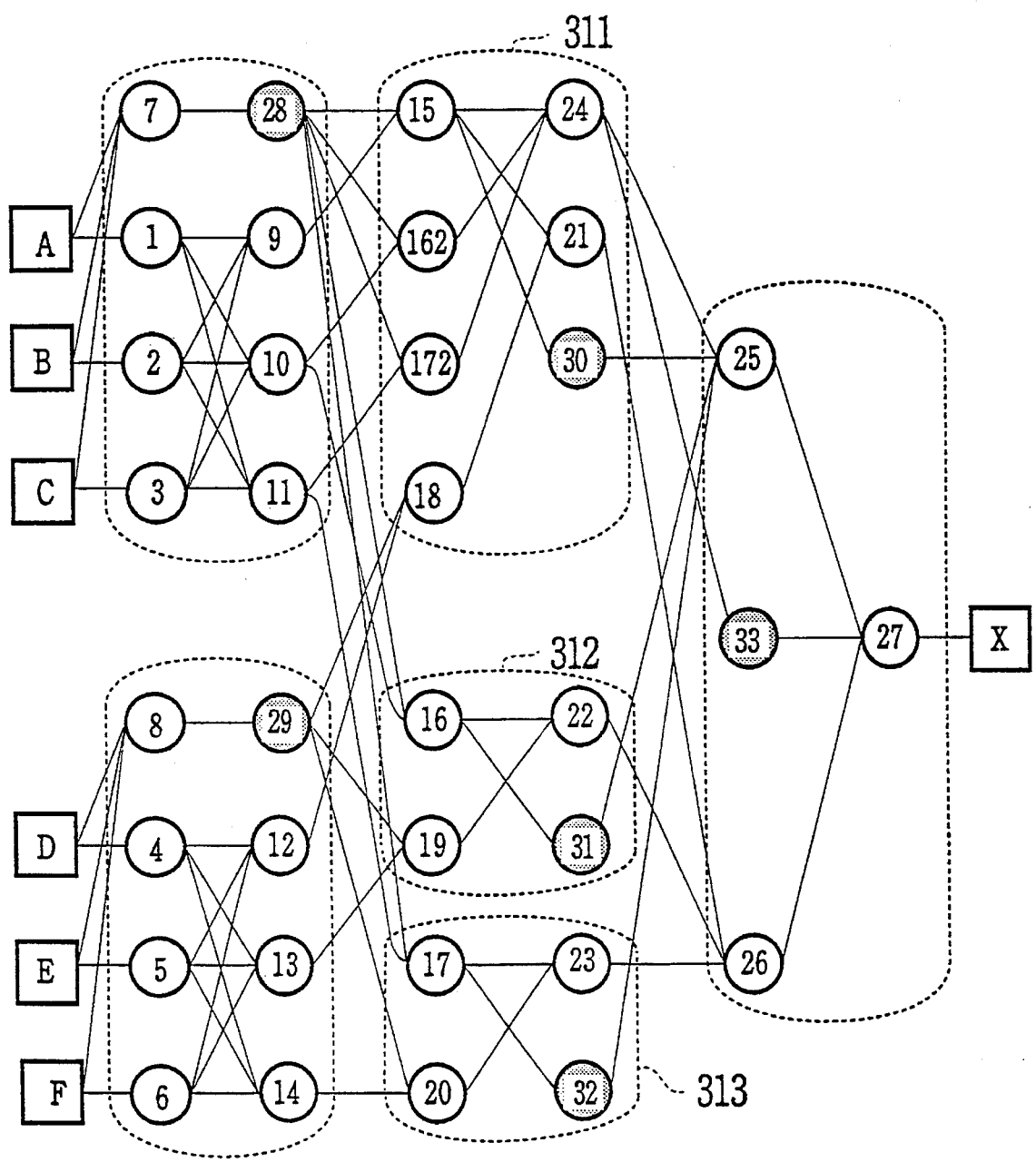
FIG. 41 is a primitive graph of FIG. 35 modified according to the mapping scheme (4).
Figure 42:
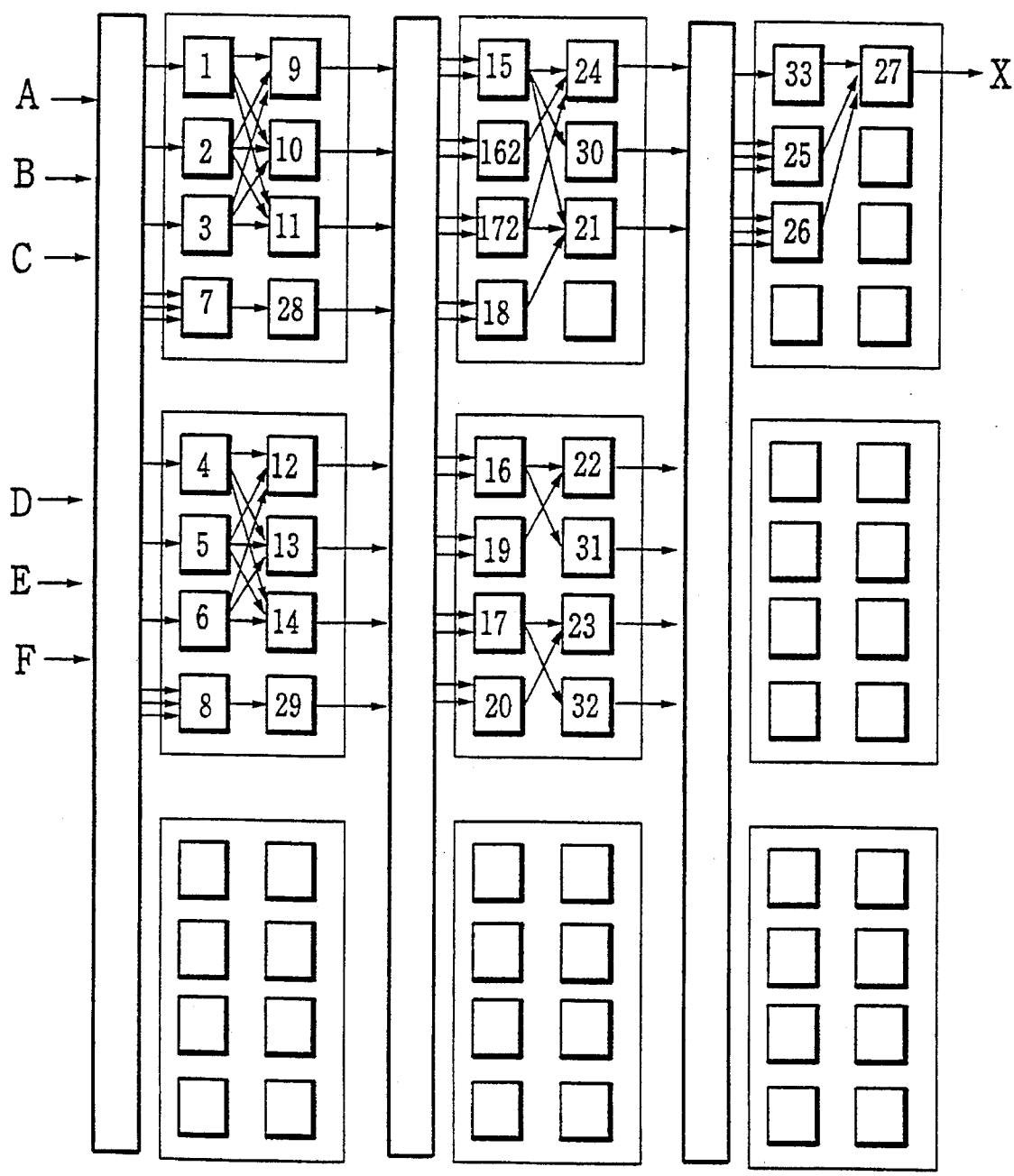
FIG. 42 is a diagram of the emulator showing the result of the mapping of the primitive graph of FIG. 41 according to the mapping scheme (4).

As a result of this procedure, the smaller connected components 231 to 237 are combined into the connected components 241, 242, and 243 as shown in FIG. 40. In accordance with these connected components 241, 242, and 243 of FIG. 40, the primitive graph of FIG. 35 can be modified to the primitive graph as shown in FIG. 41 in which the connected component 203 in FIG. 35 is replaced by the connection components 311, 312, and 313. Then, this primitive graph of FIG. 41 can be mapped straightforwardly onto the emulator as shown in FIG. 42, in which only two FPGAs are required for mapping the connected components 311, 312, and 313, in contrast to the mapping result of FIG. 36 in which three FPGAs are required for mapping the connected component 203, so that the circuit filling rate for the FPGAs can be further improved in this mapping scheme (4).

Figure 43:
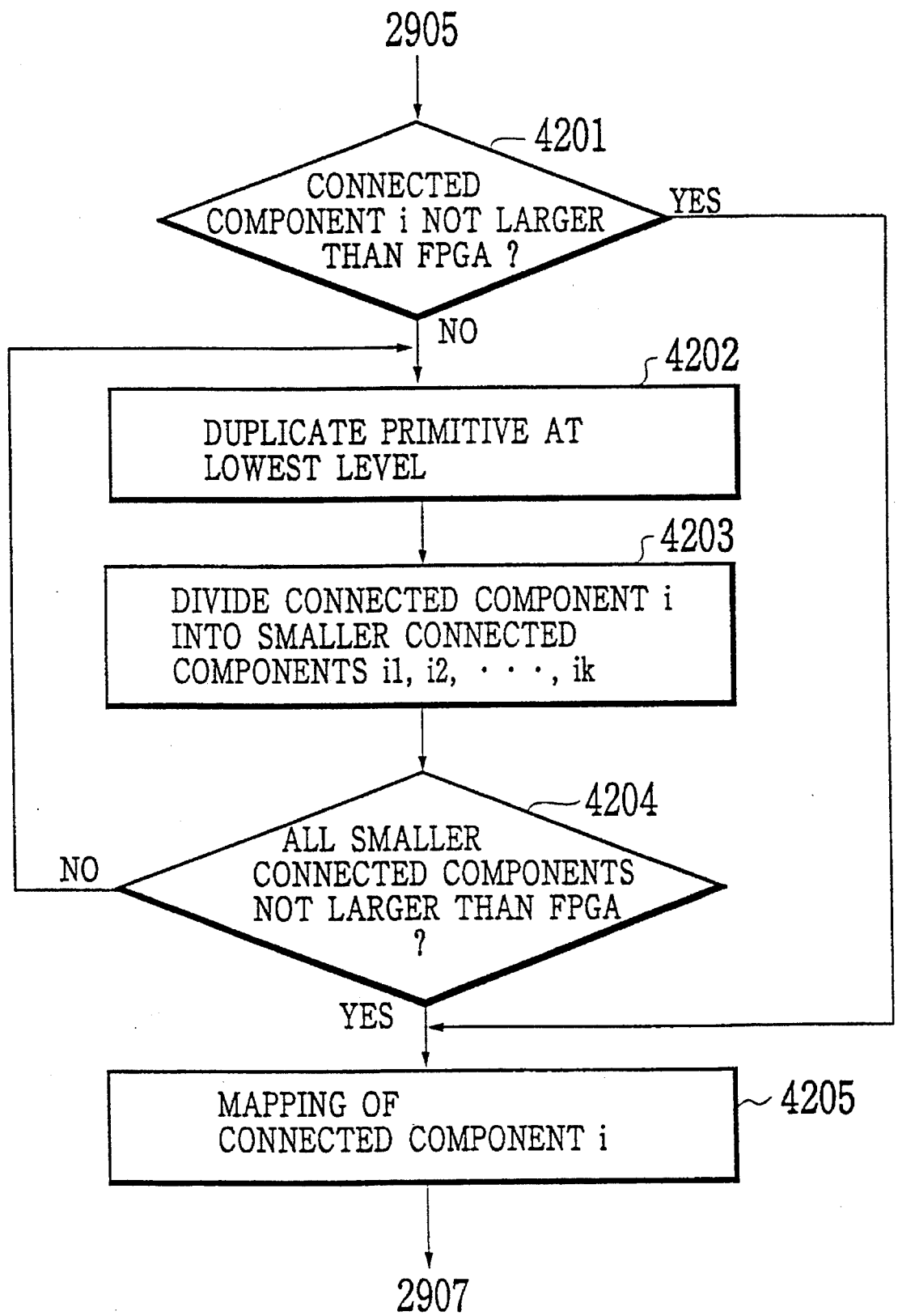
FIG. 43 is a flow chart of the operation in a mapping scheme (4).

Thus, this mapping scheme (4) is carried out according to the flow chart of FIG. 43, which is to be substituted into the step 2906 of the flow chart of FIG. 29, as follows.

First, at the step 4201, whether the connected component i is not larger than the size of the FPGA or not is determined. In a case the connected component i is not larger than the size of the FPGA, this connected component i can be mapped onto a single FPGA, so that the mapping of this connected component i to one FPGA is carried out at the step 4205 next, and the process proceeds to the step 2907 of the flow chart of FIG. 29.

On the other hand, when the connected component i is larger than the size of the FPGA, the primitive at the lowest level in the connected component i is selected and duplicated as described above at the step 4202, and the connected component i is divided into the smaller connected components as described above at the step 4203, until all the smaller connected components are not larger than FPGA at the step 4204.

Figure 29:
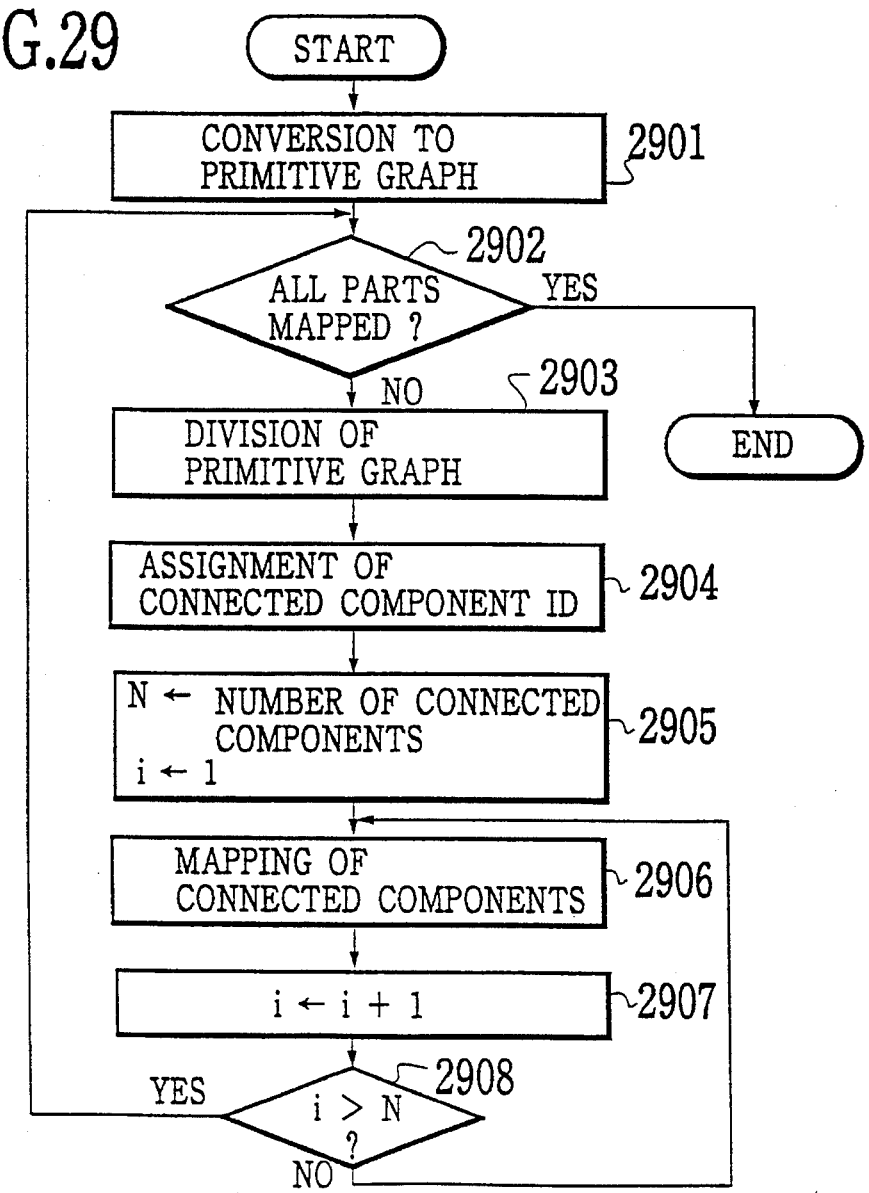
FIG. 29 is a flow chart for a mapping of the circuit onto the emulator in the second embodiment of a logic simulation system according to the present invention.

Then, at the step 4205, the mapping of this connected component i is carried out and the process proceeds to the step 2907 of the flow chart of FIG. 29. Here, If necessary, the combining of the smaller connected components as described above may be carried out prior to the mapping at the step 4205.

In this mapping scheme (4), the algorithm for the division of the connected component by using the duplication of the primitives as well as the combining of the smaller connected components can be implemented easily in practice, and a time required for the necessary calculations can be proportional to a number of branches contained in the graph, so that there is hardly any back track and the mapping can be carried out at a high speed according to this mapping scheme (4). Thus, by using the mapping scheme (4) for the connected component in a size larger than the size of the FPGA, It becomes possible to improve the circuit filling rate for the FPGAs without sacrificing the mapping speed.

It is to be noted that the mapping procedure of this second embodiment is not limited to the emulator configuration as shown in FIGS. 22 and 23, and equally applicable to any other emulator configurations.

Figure 44:
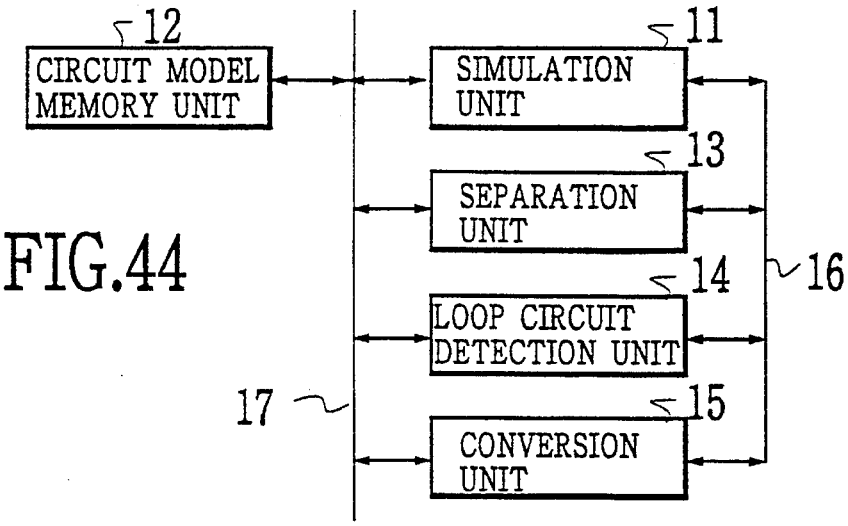
FIG. 44 is a schematic block diagram of the third embodiment of a logic simulation system according to the present invention.

Referring now to FIG. 44, the third embodiment of a logic simulation system according to the present invention outlined above will be described in detail.

As shown in FIG. 44, in this third embodiment, the logic simulation system comprises: a simulation unit 11 for carrying out the simulation; a circuit model memory unit 12 for storing a circuit model of the simulation target logic circuit; a separation unit 13 for separating the combinational circuit portion and a state memory portion of the simulation target logic circuit; a loop circuit detection unit 14 for detecting a loop circuit portion of the simulation target logic circuit; and a conversion unit 15 for converting the loop circuit portion into an equivalent circuit, where the simulation unit, the separation unit 13, the loop circuit detection unit 14, and the conversion unit 15 are mutually connected through a control signal line, while the circuit model memory unit 12 is connected with each of these units through a system bus line 17.

Figure 45:
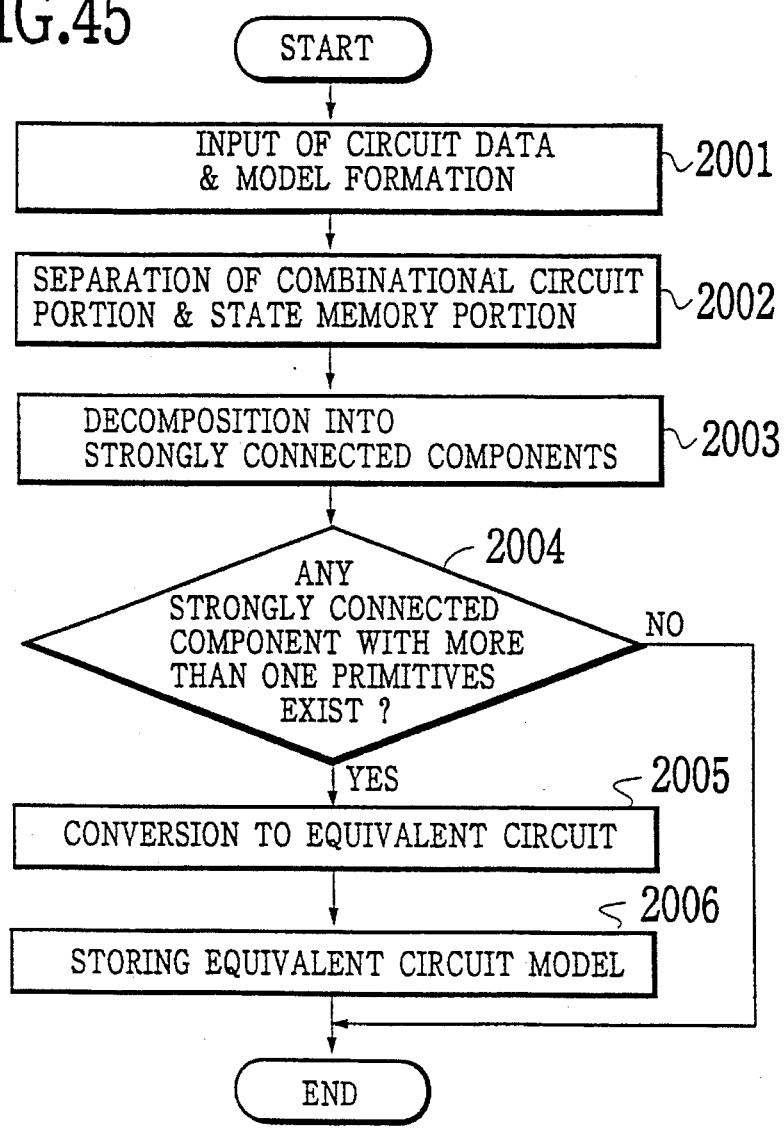
FIG. 45 is a flow chart for the operation of the system of FIG. 44.

This logic simulation apparatus of FIG. 44 operates according to the flow chart of FIG. 45 as follows.

First at the step 2001, the circuit data of the simulation target logic circuit are entered and a circuit model in a form of a primitive graph is formed from the entered circuit data at the simulation unit 11. The obtained circuit model is stored in the circuit model memory unit 12.

Then, at the step 2002, the combinational circuit portion and the state memory portion of the simulation target logic circuit are separated at the separation unit 13 according to the circuit model stored in the circuit model obtained by the simulation unit 11.

Next, at the step 2003, the combinational circuit portion of the circuit model is decomposed into strongly connected components at the loop circuit detection unit 14.

Then, at the step 2004, whether any strongly connected component with more than one primitives exist or not is determined at the loop circuit detection unit 14.

In a case such a strongly connected component exists at the step 2004, it implies the presence of a loop, so that next at the step 2005, the equivalent circuit of the loop circuit portion is produced at the conversion unit 15.

Finally, the equivalent circuit model in which the equivalent circuit for the loop circuit portion produced at the conversion unit 15 is incorporated and the model transformation for the detection of the occurrence of the loop oscillation is applied is stored in the circuit model memory unit 12 at the step 2006.

On the other hand, in a case such a strongly connected component does not exist at the step 2004, it implies the absence of the loop circuit portion, in which case the operation is terminated.

In this third embodiment, the simulation target logic circuit is represented by the circuit data in a form of primitive net lists, which are then converted by the simulation unit 11 into the circuit model in a form of a primitive graph in which the the primitives are represented as nodes and the connections between the primitives are represented as branches joining the nodes, according to the logic element connection data contained in the primitive net lists. Here, the primitive corresponds to a logic element or a set of more than one logic elements, and functions as a unit of simulation. In the following, the signal value is assumed to take one of only two values 0 and 1, for the sake of simplicity. Also, although an external input signal terminal and an external output signal terminal are not the logic elements strictly speaking, they are also represented by special primitives called an input primitive and an output primitive, for the sake of convenience. Each primitive has a unique primitive ID assigned.

Figure 46:
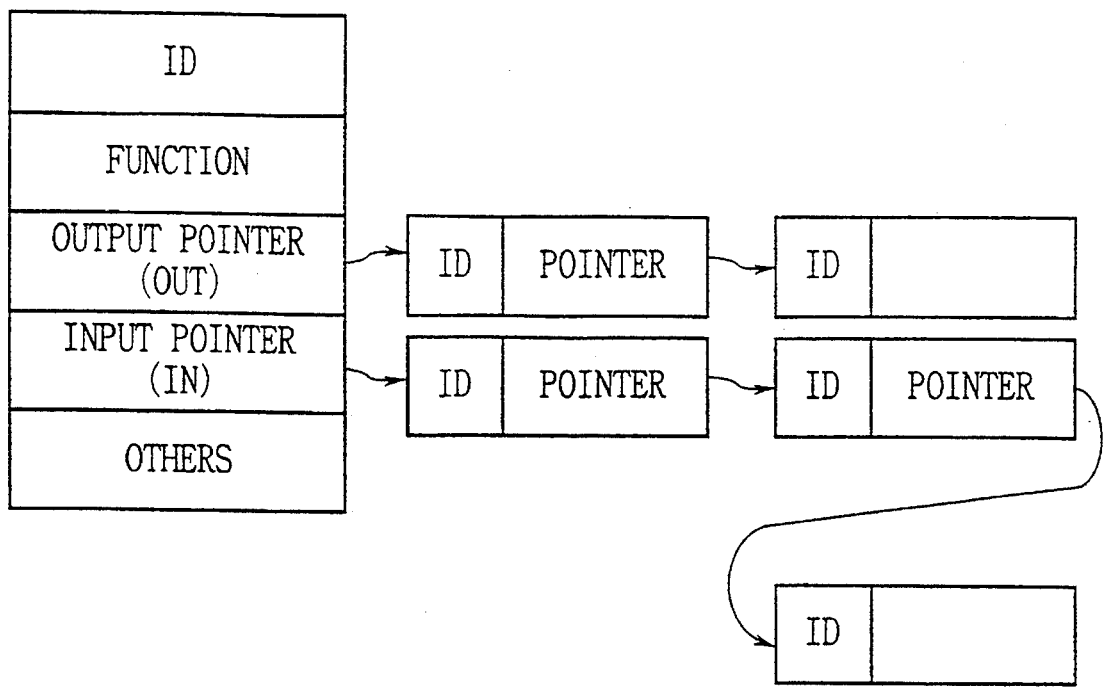
FIG. 46 is a diagram of an exemplary data structure for expressing each primitive to be used in the system of FIG. 44.

The circuit model memory unit 12 stores the data for the primitive graph obtained at the simulation unit 11 in a format shown in FIG. 46 in which each primitive is expressed by an array of fields for the primitive ID, its function such as AND, OR, NOT, FF (flip flop), etc., an output pointer (OUT) in a form of a series of pointers for enlisting the primitive IDs of the primitives to which it supplies its output, an input pointer (IN) in a form of a series of pointers for enlisting the primitive IDs of the primitives from which it receives its input, and other information such as the level information and information necessary for the loop detection.

The separation unit 13 separates the combinational circuit portion in forms of strongly connected components and the state memory portion in forms of flip flops in the circuit model stored in the circuit model memory unit 12. Then, for each flip flop of the state memory portion, the input primitive and the output primitive are newly generated, and the input branch to the flip flop is connected with the output primitive and the output branch from the flip flop is connected with the input primitive.

Figures 47A, 47B:
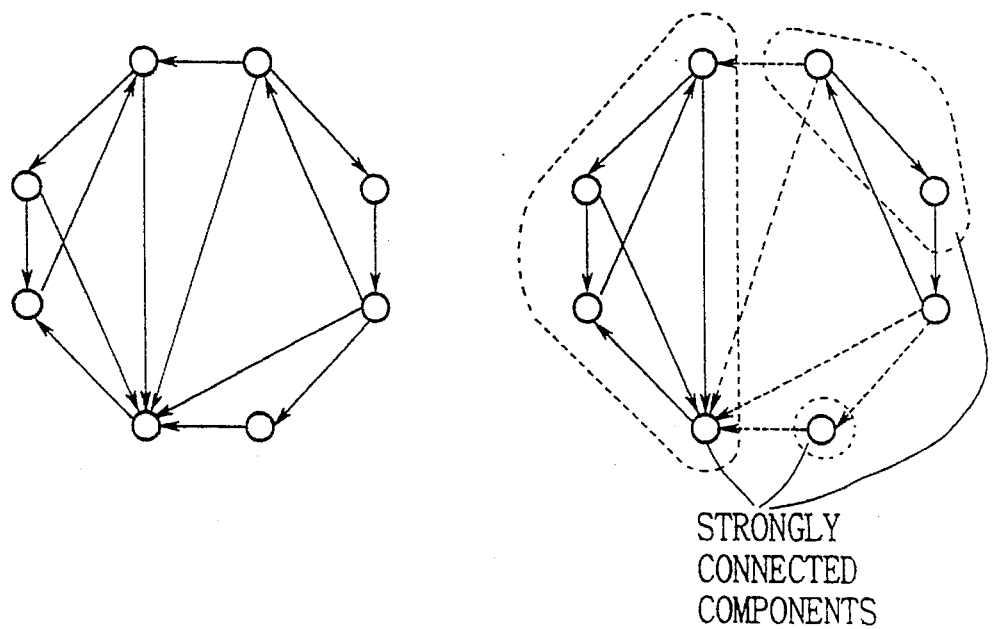
FIGS. 47A and 47B are diagrams showing an exemplary decomposition of a primitive graph into strongly connected components.

Here, the strongly connected component is defined by a pair of a set of nodes which are mutually reachable via directed branches in the directed graph and a set of directed branches joining these nodes. Here, each node is reachable from itself, so that the strongly connected component comprising only one node also exists, and when the strongly connected component contains more than one nodes, it implies a presence of a loop, For example, the directed graph shown in FIG. 47A contains three strongly connected components as indicated in FIG. 47B.

Now, the primitive graph can be decomposed into the strongly connected components at the loop circuit detection unit 14, by the following procedure.

First, in the primitive graph, a starting primitive PO is selected, and the search is started from there along the directed branches. If a searching path happens to returns to this primitive PO, it implies a presence of a loop. The strongly connected component is obtained by gathering such loops. When there is no path returning to the primitive PO, this primitive PO itself forms the strongly connected component. This procedure is repeated by sequentially selecting the primitive not contained in any of the already obtained strongly connected components as a starting primitive. When there remains no primitive that can be selected as a starting primitive, the primitive graph has been decomposed into the strongly connected components. This procedure is only a simple example of a procedure for decomposing the graph in general into the strongly connected components, and any other known method for decomposing the graph into the strongly connected components may be employed instead.

In a case there is no loop in the primitive graph, every strongly connected component of this primitive graph contains only one primitive. In such a case, there is no need to carry out any further processing for this primitive graph.

On the other hand, in a case the primitive graph contains a loop, the loop exists in the strongly connected component having more than one primitives. In such a case, there is a need to convert the loop circuit portion into the equivalent circuit at the conversion unit 15, by the following procedure.

Figure 48:
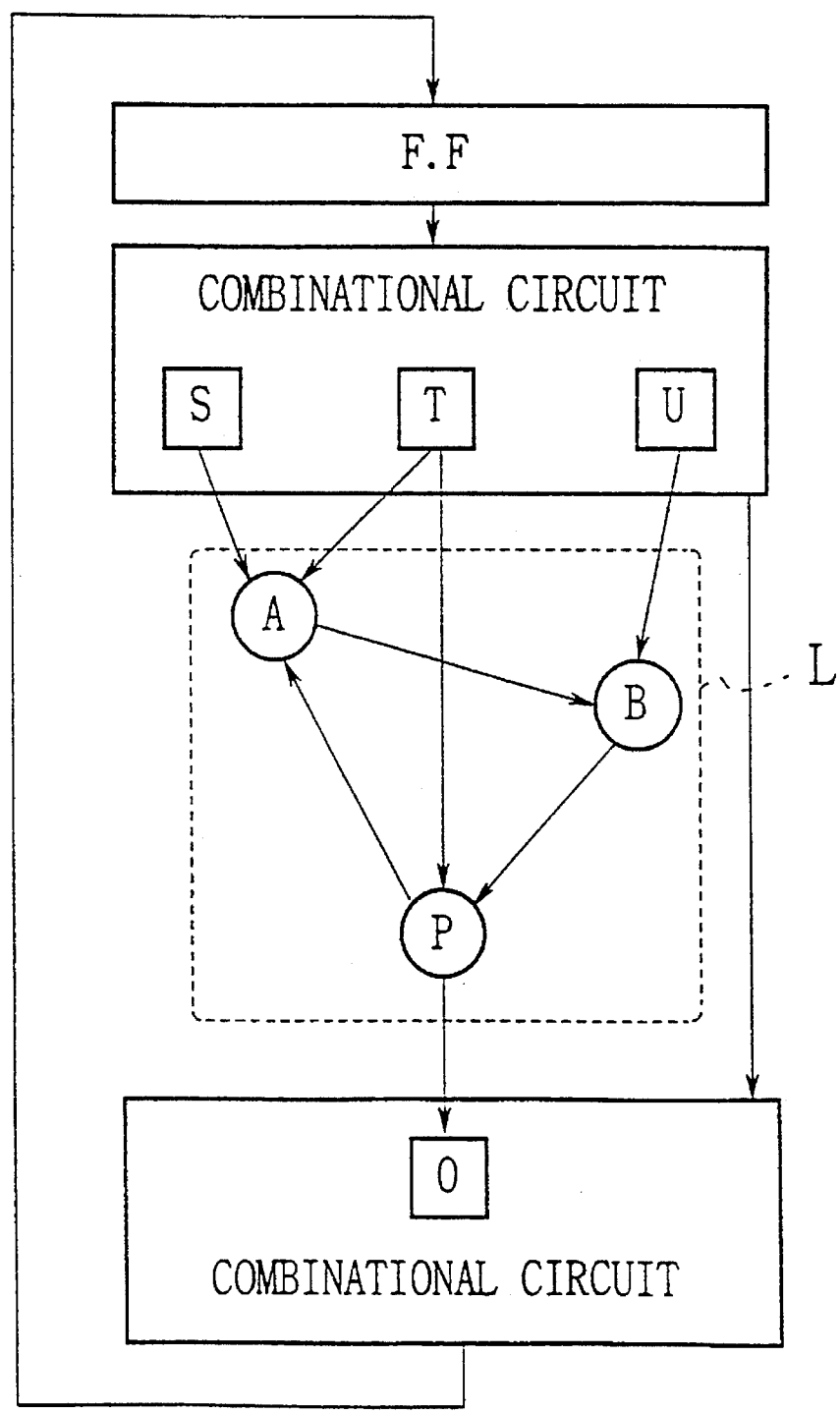
FIG. 48 is an exemplary primitive graph of a loop circuit portion to be converted into an equivalent circuit by the system of FIG. 44.
Figure 49:
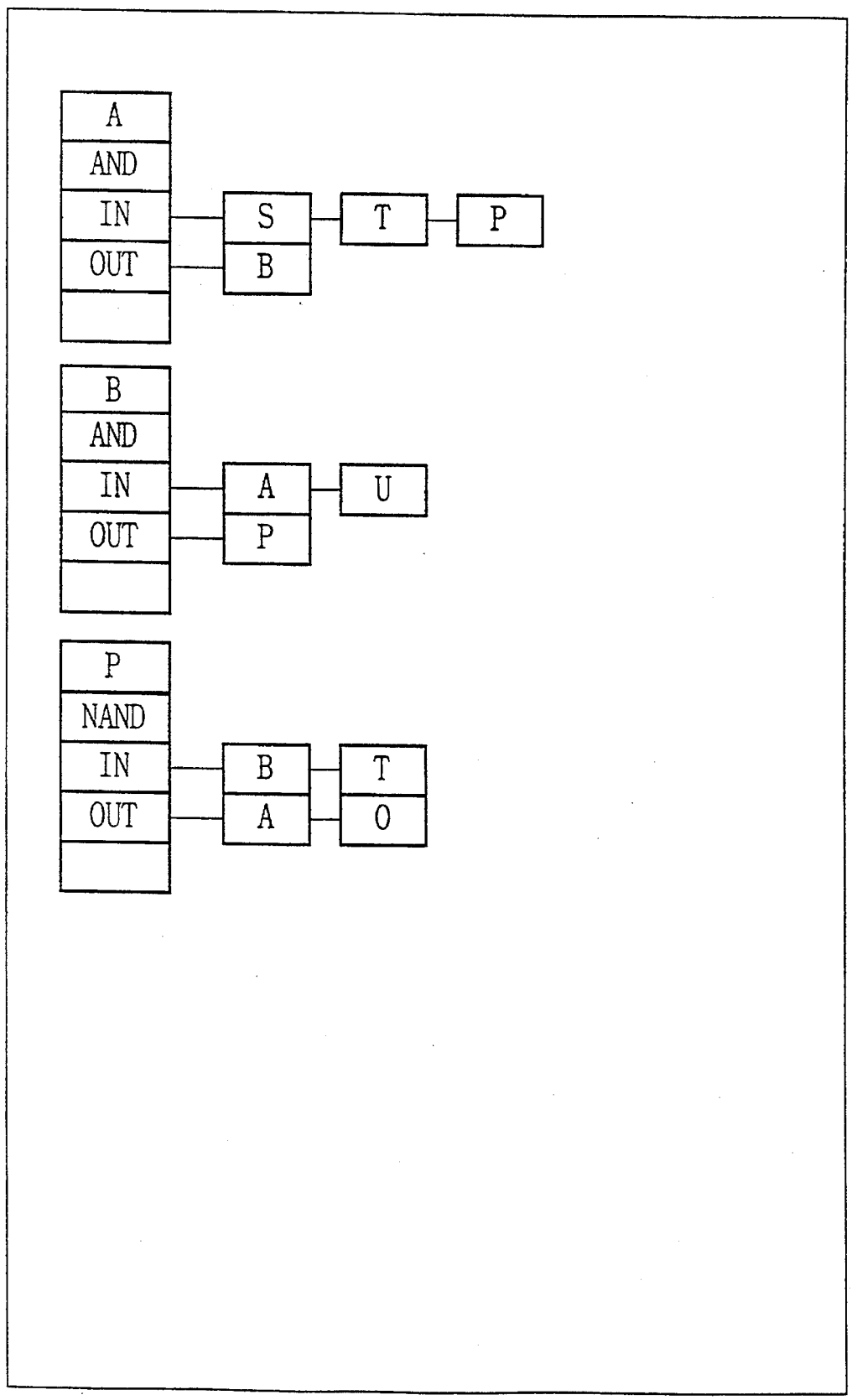
FIG. 49 is a diagram of data expressing the primitive graph of FIG. 48.

Here, as an illustrative example, a simple case of a single loop formed by the primitives A, B, and P as shown in FIG. 48 will be considered. In this case, the loop L is expressed in the circuit model memory unit 12 by the data in a form shown in FIG. 49.

Figure 50:
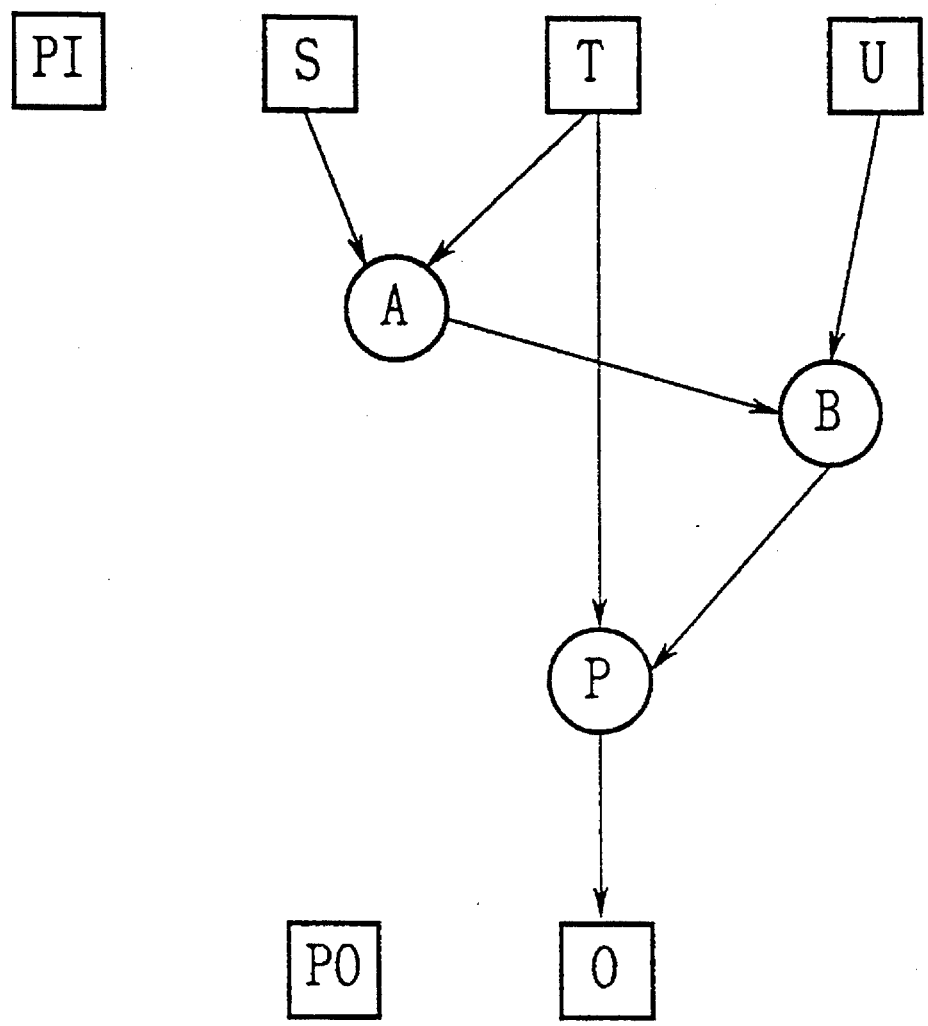
FIG. 50 is a diagram of the primitive graph of FIG. 48 modified by the first step of the loop circuit portion conversion operation by the system of FIG. 44.

(1) First, one primitive in the loop L is selected arbitrarily. Here, it is assumed that the primitive P has been selected. Then, the branch for the output of this selected primitive P is removed from the loop L as shown in FIG. 50. In this case, the directed branch from the primitive P to the primitive A is removed.

Then, a primitive PF which outputs the value of the primitive P at a previous clock timing is added to the state memory portion, and the input primitive PI for supplying the output from this primitive PF and the output primitive PO for supplying the input to this primitive PF are newly generated and added to the primitive graph as shown in FIG. 50.

Figure 51:
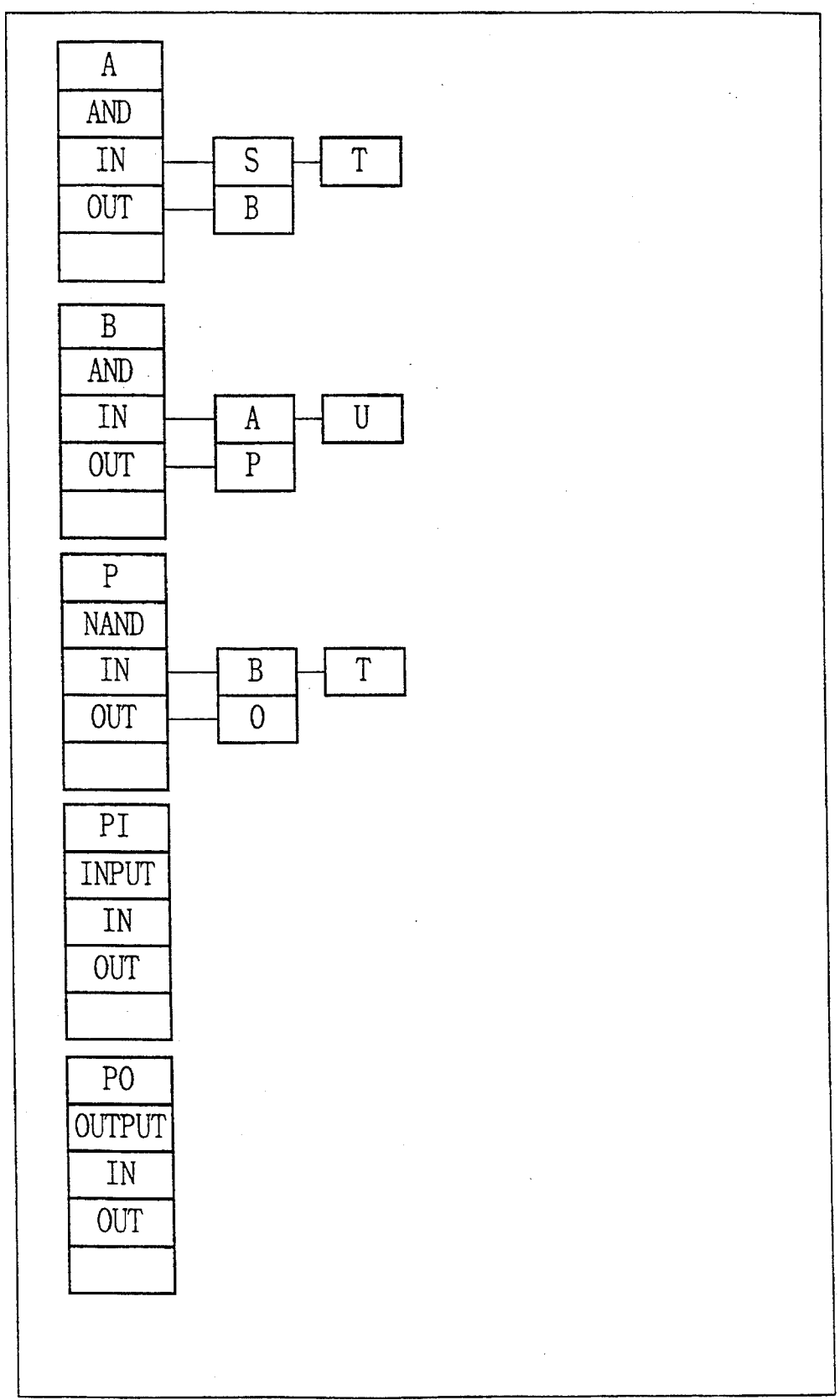
FIG. 51 is a diagram of data expressing the primitive graph of FIG. 50.

At this point, the primitive graph shown in FIG. 50 is expressed by the data shown in FIG. 51 stored in the circuit model memory unit 12, in which the primitive ID of the primitive A is removed from the output pointer in the array for the primitive P and the primitive ID of the primitive P is removed from the input pointer in the array for the primitive A, while the arrays for the input primitive PI and the output primitive PO are added.

Figure 52:
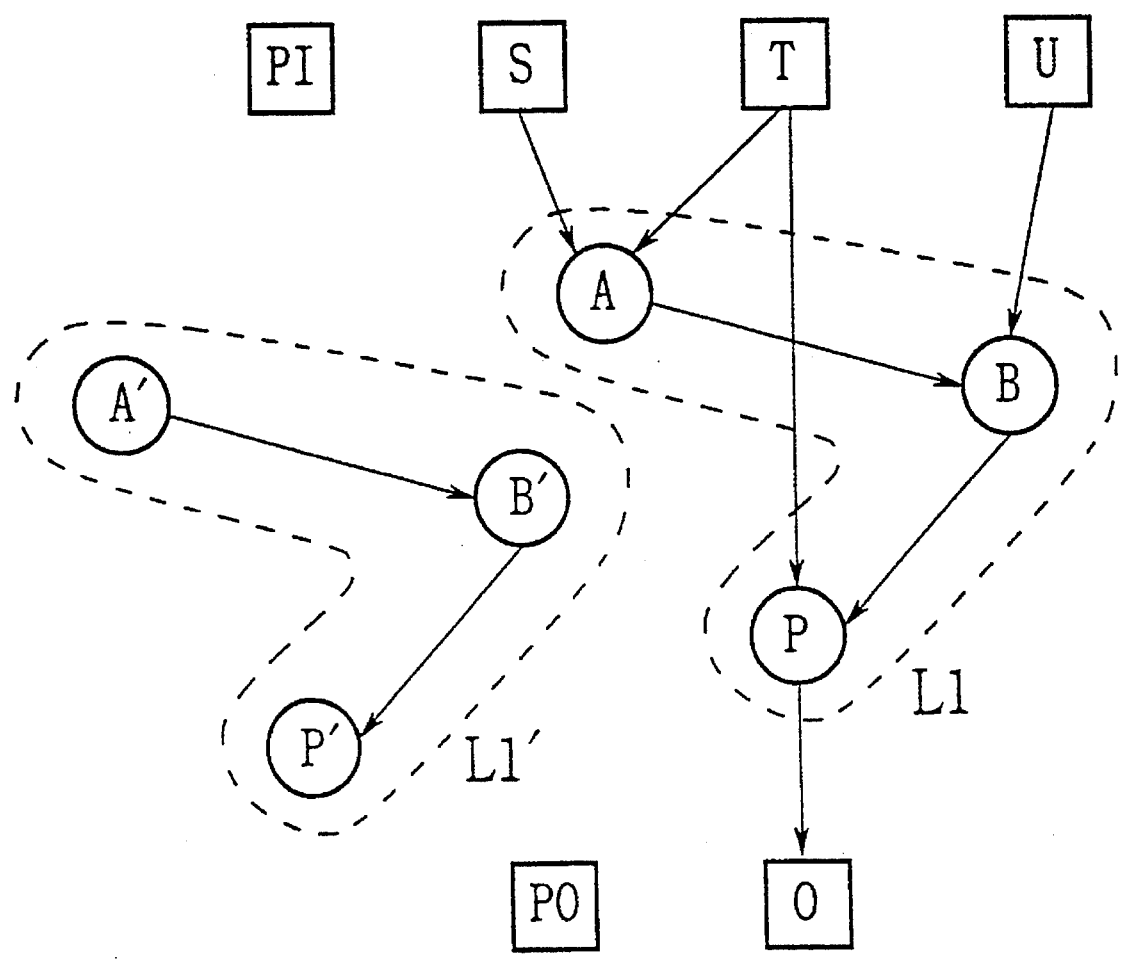
FIG. 52 is a diagram of the primitive graph of FIG. 50 further modified by the second step of the loop circuit portion conversion operation by the system of FIG. 44.

(2) Next, as shown in FIG. 52, a partial graph obtained by breaking the loop at (1) is labelled as L1, and this partial graph L1 is duplicated as another partial graph L1' formed by the primitives A', B', and P' corresponding to the primitives A, B, and P of the partial graph L1.

Figure 53:
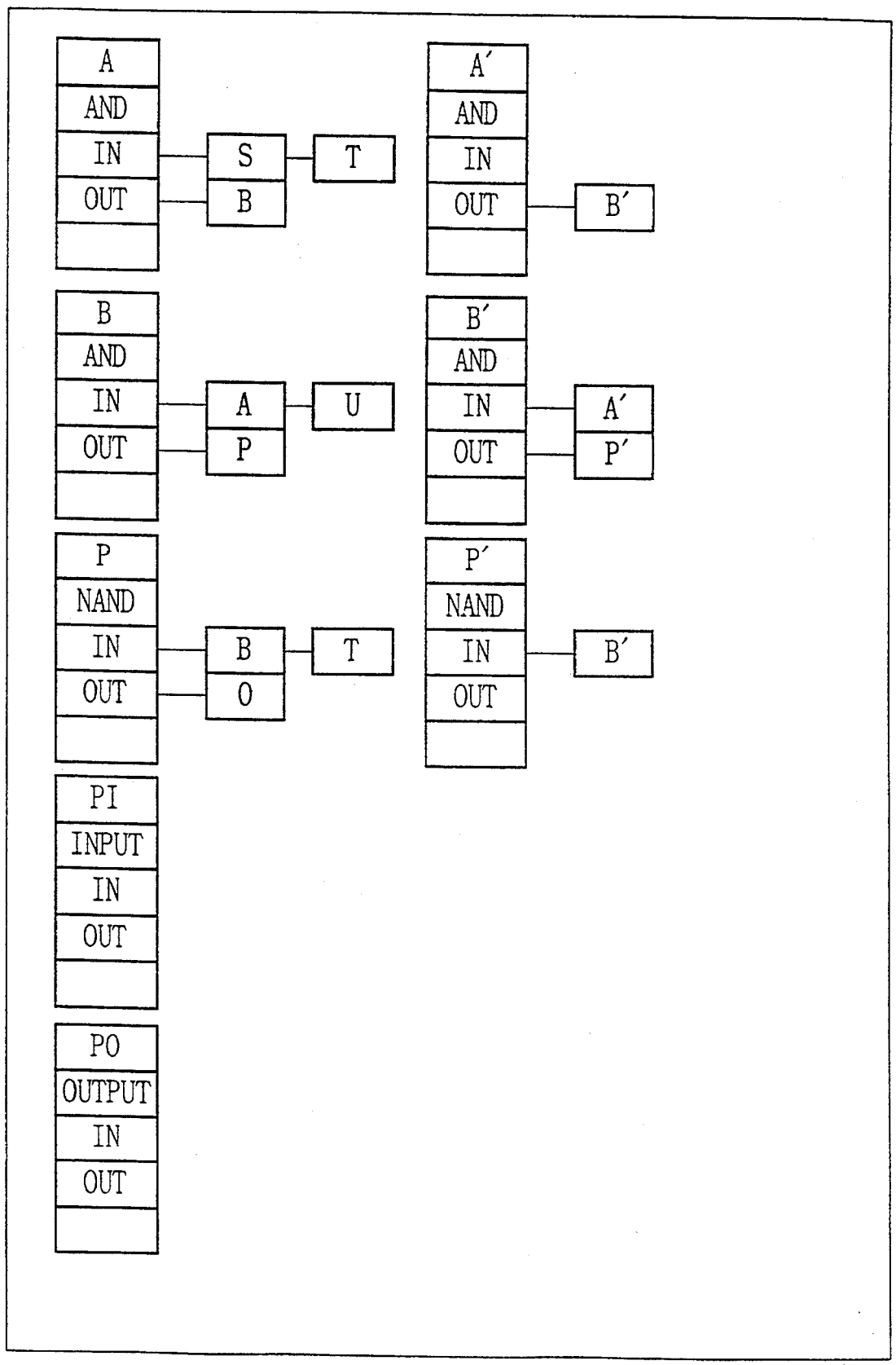
FIG. 53 is a diagram of data expressing the primitive graph of FIG. 52.

At this point, the primitive graph shown in FIG. 52 is expressed by the data shown In FIG. 53 stored in the circuit model memory unit 12, in which the arrays for the primitives A, B, and P of the partial graph L1 are duplicated. Here, the arrays for the primitives A', B', and P' have the input pointer and the output pointer identical to the corresponding ones of the primitives A, B, and P, such that the duplicated partial graph L1' has the identical structure as the original partial graph L1.

Figure 54:
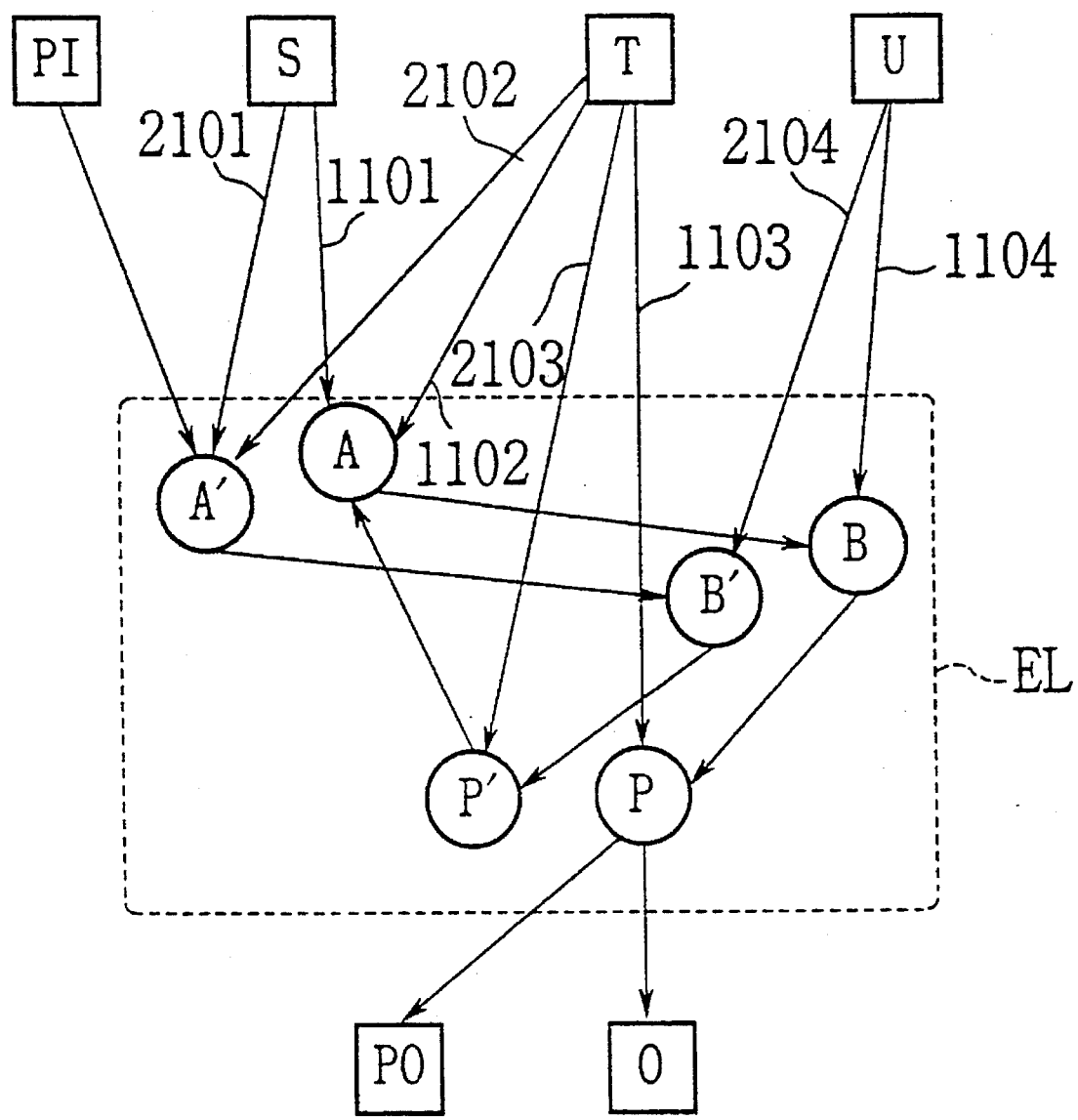
FIG. 54 is a diagram of the primitive graph of FIG. 52 further modified by the third step of the loop circuit portion conversion operation by the system of FIG. 44.

(3) Next, as shown in FIG. 54, the input branches 2101 to 2104 corresponding to the input branches 1101 to 1104 to the partial graph L1 are added as the input branches for the partial graph L1'. In addition, the branch from the primitive P' of the partial graph L1' to the primitive A of the partial graph L1, the branch from the input primitive PI to the primitive A' of the partial graph L1', and the branch from the primitive P of the partial graph L1 to the output primitive PO are added to the primitive graph.

Figure 55:
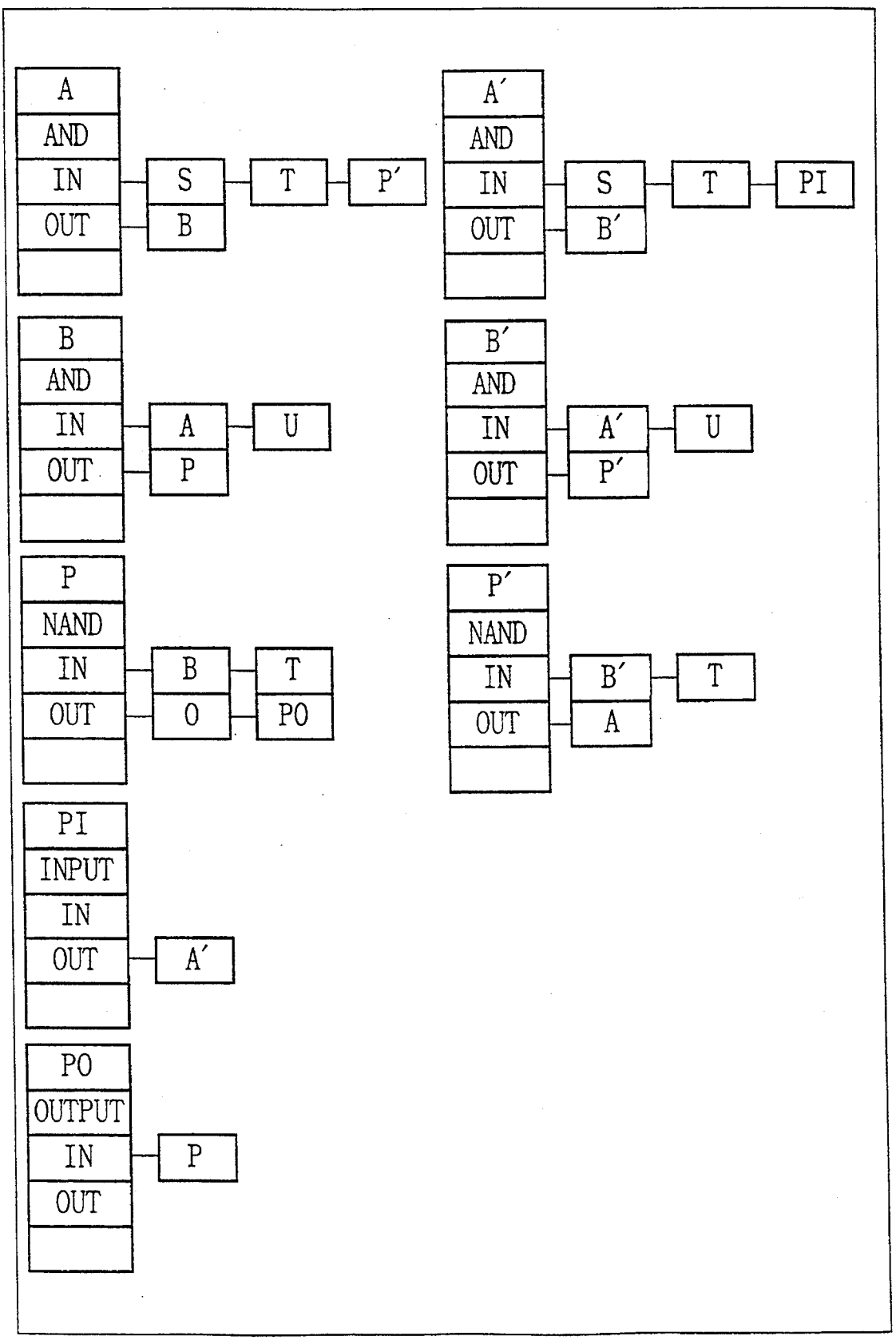
FIG. 55 is a diagram of data expressing the primitive graph of FIG. 54.

At this point, the primitive graph shown in FIG. 54 is expressed by the data shown in FIG. 55 stored in the circuit model memory unit 12, in which the primitive IDs of the primitives S, T, and U are added to the input pointers of the arrays for the primitives A', B', and P' of the partial graph L1' generated at (1), and the primitive IDs of the primitives A', B', and P' are added to the output pointers of the arrays for the primitives S, T, and U, which are not shown in FIG. 55 in correspondence. Moreover, the primitive ID of the primitive P is added to the input pointer of the array for the primitive A', and the primitive ID of the primitive A' is added to the output pointer of the array for the input primitive PI, in correspondence to the added input branch from the primitive PI to the primitive A', while the primitive ID of the primitive P' is added to the input pointer of the array for the primitive A, and the primitive ID of the primitive A is added to the output pointer of the array for the primitive P' in correspondence to the added input branch from the primitive P' to the primitive A. Furthermore, the primitive ID of the array for the primitive PO is added to the output pointer of the array for the primitive PO, and the primitive ID of the primitive P is added to the input pointer of the array for output primitive PO in correspondence to the added branch from the primitive P to the primitive PO.

Now, the fact that the primitive graph of FIG. 54 obtained in this manner is logically equivalent to the original primitive graph of FIG. 48, and the fact that it is possible to detect the occurrence of the oscillation of the loop from the primitive graph of FIG. 54 will be explained. Here, the oscillation of the loop indicates a state in which the signal value becomes indeterminable as the inversion of the signal value in the loop occurs for odd number of times.

In FIG. 54, a portion EL in which the loop is extended has the inputs from the four primitives PI, S, T, and U. Here, the evaluations of the primitives in the portion EL are made after the evaluations of the primitives S, T, and U are completed. In this FIG. 54, the values of the primitives P' and P correspond to the values of the primitive P in the loop L of FIG. 48 for the first and second laps, respectively.

Now, suppose that the evaluations of the signal values of the primitives in the portion EL are made at a certain clock timing. Then, when the signal values for the primitives P' and the PI are equal to each other as a result of the evaluations, it implies that the signal value of the primitive P in the primitive graph of FIG. 48 is not going to change if the same input is given.

On the other hand, when the signal values of the primitives P' and PI differ from each other but the signal values of the primitives P' and P are equal to each other, it implies that the signal value of the primitive P in the primitive graph of FIG. 48 is going to be changed only once and determinable if the same input is given.

Namely, in the first lap, the value of the primitive P is changed according to its own value as an internal state as well as the inputs from the primitives S, T, and U. Then, in the second lap, the value of the primitive P is determined from the value of this primitive P and the values of the primitives S, T, and U in the first lap. Here, if the value of the primitive P in the second lap is equal to the value of the primitive P in the first lap, i.e., the values of the primitives P' and P in FIG. 54 are equal to each other, then the value of the primitive P does not change in the loop evaluation for the subsequent laps, because the values of the primitives P, S, T, and U for the previous lap which are to be used for evaluating the primitive P are not going to change. Consequently, in this case, the loop does not oscillate.

In contrast, when the signal values of the primitives P' and PF differ from each other and the signal values of the primitives P' and P also differ from each other, it implies that the signal value of the primitive P in the primitive graph of FIG. 48 is going to be in determinable if the same input is given, for the same reason. Namely, noting that the values of the primitives P and PF are equal to each other as the signal can take only two values, it follows that the signal value of the primitive P in the third lap is going to be equal to the signal value of the primitive P in the first lap, and subsequently, the signal value of the primitive P differs for the odd lap and the even lap, so that the loop oscillates.

Thus, by checking whether the values of the primitives P' and P are equal to each other or not, the occurrence of the oscillation of the loop can be determined, and in a case of the absence of the oscillation, the simulation result for the equivalent circuit can be regarded as logically correct.

Now, in this third embodiment, in order to detect the occurrence of the loop oscillation, the circuit model of the simulation target logic circuit can be subjected to the following model transformation at the conversion unit 15.

Figure 56:
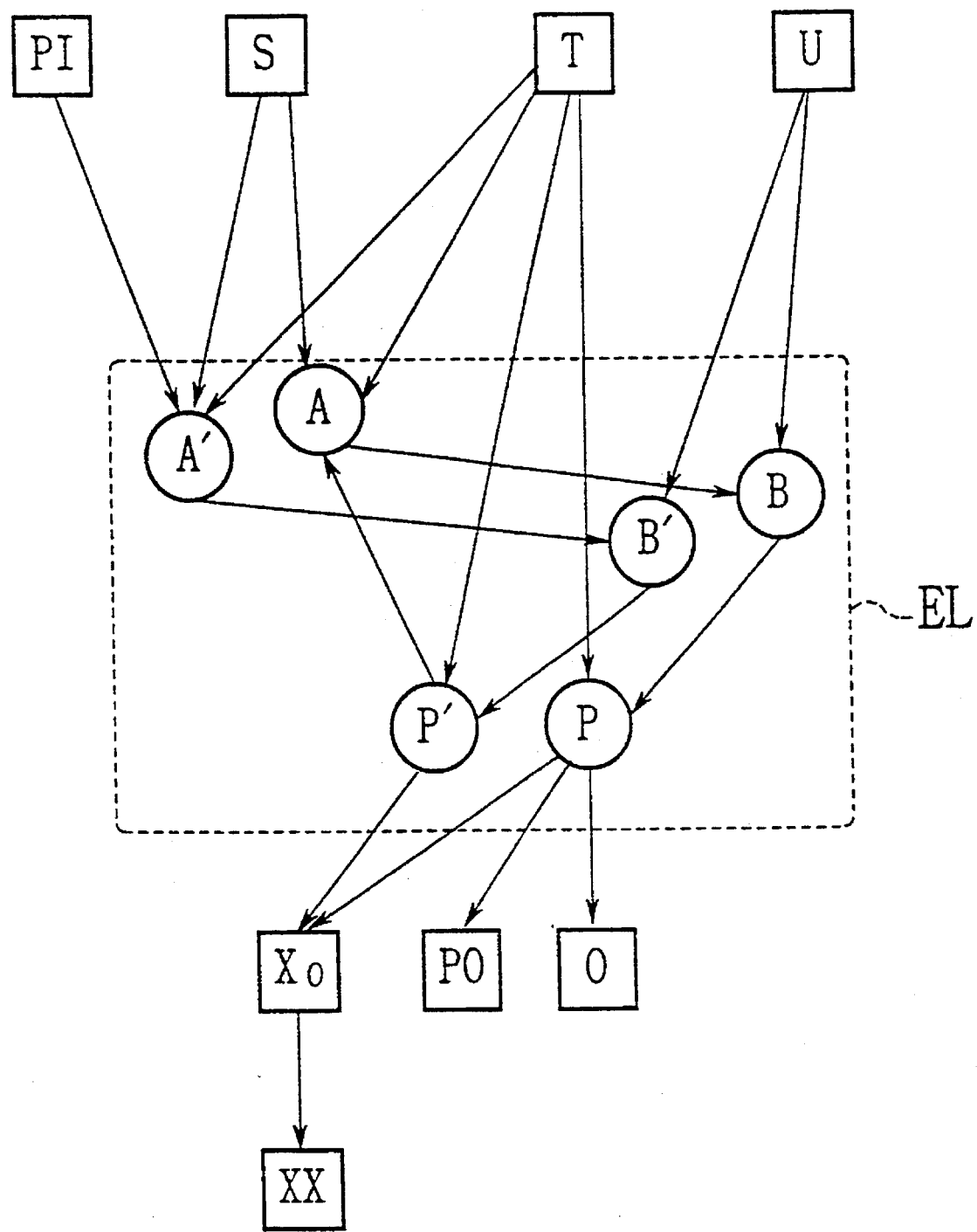
FIG. 56 is a diagram of the primitive graph of FIG. 54 further modified by the model transformation operation by the system of FIG. 44.
Figure 57:
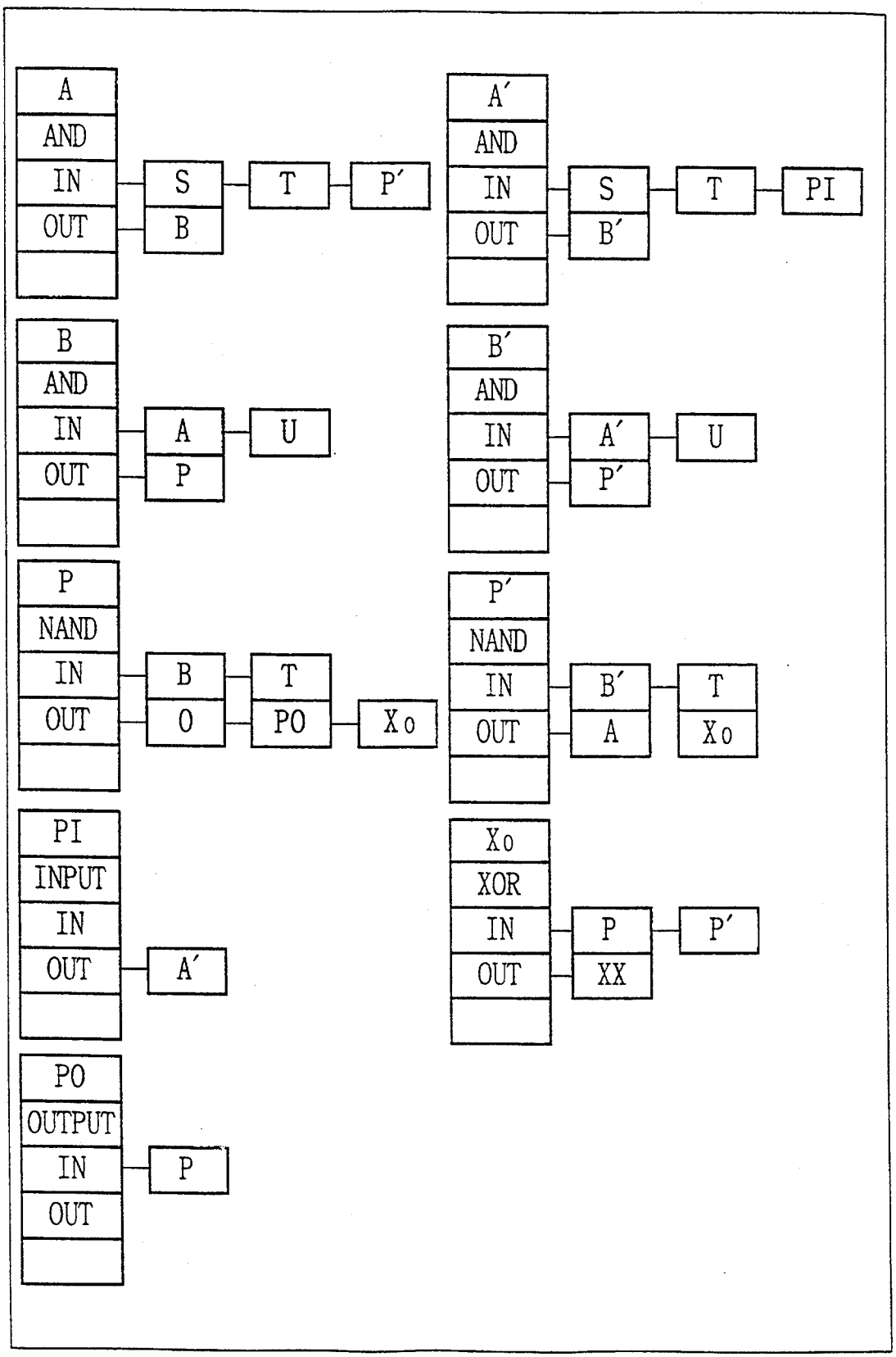
FIG. 57 is a diagram of data expressing the primitive graph of FIG. 56.

Namely, to the primitive graph of FIG. 54 representing the equivalent circuit for the loop circuit portion, a primitive Xo for comparing the output signals of the primitives P and P' by taking XOR of these output signals and an output primitive XX for receiving the output of this primitive Xo are added as shown in FIG. 56. At this point, the primitive graph shown in FIG. 56 is expressed by the data shown in FIG. 57 stored in the circuit model memory unit 12, in which the primitive ID of the added primitive Xo is added to the output pointers of the arrays for the primitives P and P', while the array for this added primitive Xo having the primitive IDs of the primitives P and P' as the input pointer and the primitive ID of the output primitive XX as the output pointer is generated.

Then, the value of the output primitive XX is monitored by the host computer to detect the occurrence of the loop oscillation.

Figure 58A:
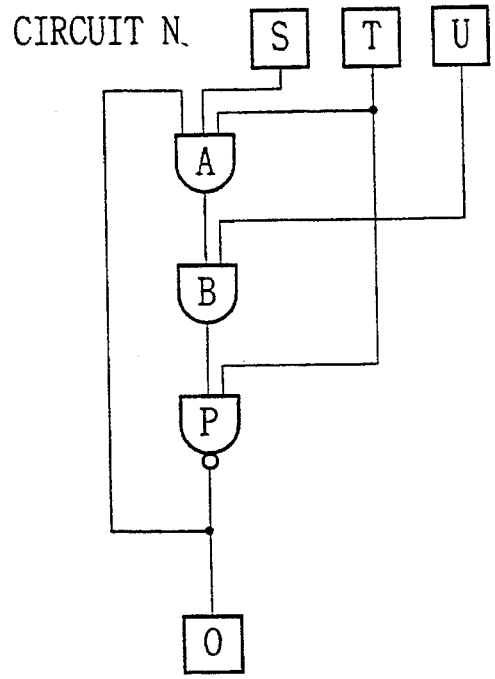
FIGS. 58A and 58B are diagrams of exemplary primitive graphs, before and after the model transformation operation.

As a concrete example, in the circuit N shown in FIG. 58A, when the values of the primitives S, T, and U are all 1, the loop oscillation occurs as the signal value is inverted for odd number of times during one lap of the loop. On the other hand, when any one of the primitives S, T, and U takes a value 0, the signal value is inverted for even number of times during one lap of the loop, so that the loop oscillation does not occur.

This result can also be obtained from the evaluations of the primitives in the equivalent circuit N' shown in FIG. 58B obtained by the above described procedure as follows.

Figure 58B:
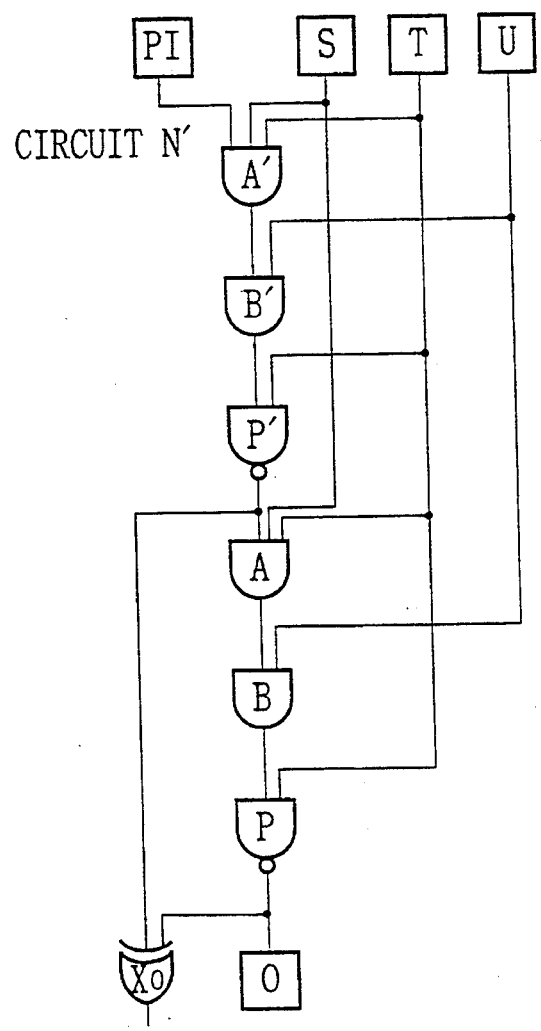

In the equivalent circuit N' of FIG. 58B, the input primitive PI enters the value of the primitive P at a previous clock timing, and its value at a clock 0 timing is set to be an indefinite value X.

On the other hand, the primitive Xo takes the XOR of the output of the primitives P and P', and when the outputs of the primitives P and P' are equal to each other, the output of this primitive Xo is 0, whereas when the outputs of the primitives P and P' differ from each other, the output of this primitive Xo is 1.

Then, the result of the evaluations of the signal values at each clock timing for the primitives A', B', P', A, B, P, and Xo in this order according to the level sort scheme is as follows.

Namely, when the values of the primitives PI, S, T, and U at a clock 0 timing are X, 1, 1, and 0, respectively, the output signal values of the primitives A', B', P', A, B, P, and Xo are going to be X, 0, 1, 1, 0, 1, and 0, respectively. Also, when the values of the primitives S, T, and U at a clock 1 timing are 1, 1, and 1, respectively, because the value of the input primitive PI at this clock 1 timing is 1, the output signal values of the primitives A', B', P', A, B, P, and Xo are going to be 1, 1, 0, 0, 0, 1, and 1, respectively. Thus, the correct simulation result can be obtained in a case the loop oscillation does not occur, while the occurrence of the loop oscillation can be detected from the output of the primitive Xo.

Now, in general, the strongly connected component having a plurality of primitives may contain a plurality of loops, and the simulation target logic circuit may contain more than one such strongly connected components having a plurality of primitives. For such a general case, the above described procedure for converting the loop circuit portion of the simulation target logic circuit into the equivalent circuit can be generalized to the following generalized procedure.

Figure 59:
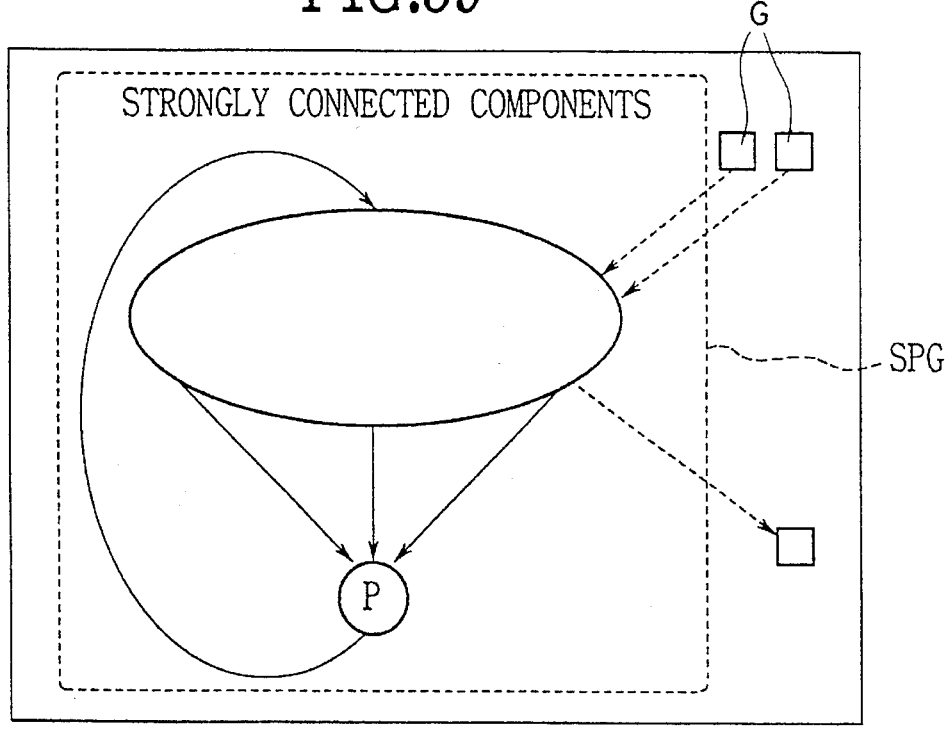
FIGS. 59 to 63 are diagrams of an exemplary primitive graphs at various steps of a generalized procedure for the loop circuit portion conversion operation by the system of FIG. 44.

(1) First, one strongly connected component having more than one primitives is selected as SPG (selected partial graph), while one primitive in the SPG is selected as a primitive P, as shown in FIG. 59.

Figure 60:
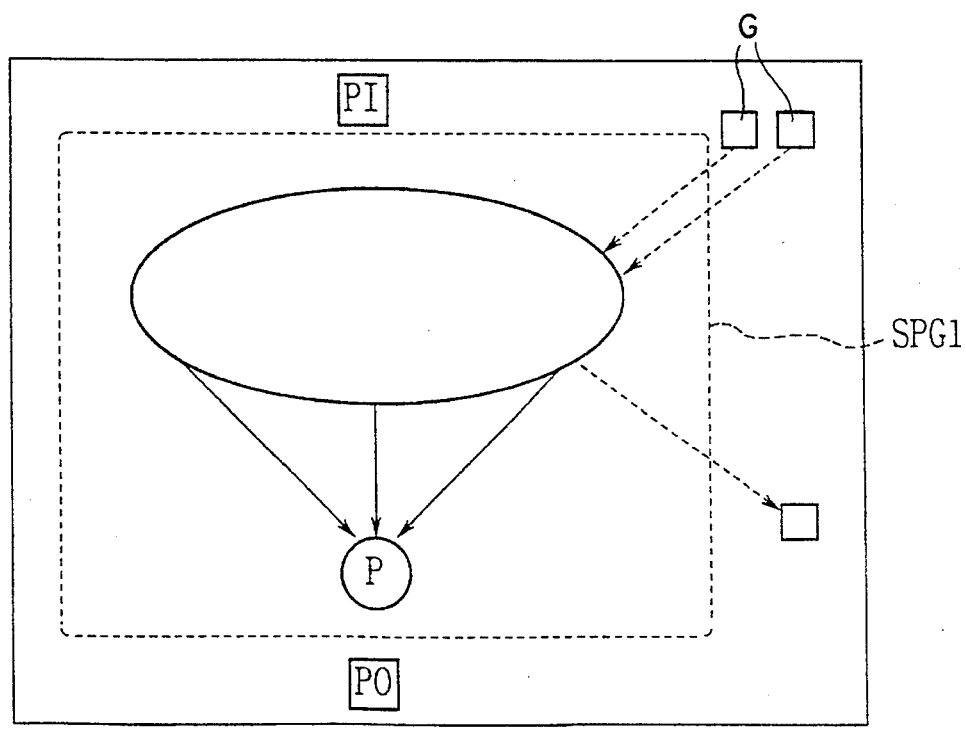

(2) Then, a primitive PF which functions as a flip flop corresponding to the primitive P and outputs the value of the primitive P at a previous clock timing is added to the state memory portion, and the input primitive PI for supplying the output from this primitive PF and the output primitive PO for supplying the input to this primitive PF are newly generated and added to the primitive graph, while the branch for the output of the primitive P is removed from the SPG, to obtain a modified partial graph SPG1, as shown in FIG. 60. In this modified partial graph SPG1, the loop containing the primitive P is no longer present.

Figure 61:
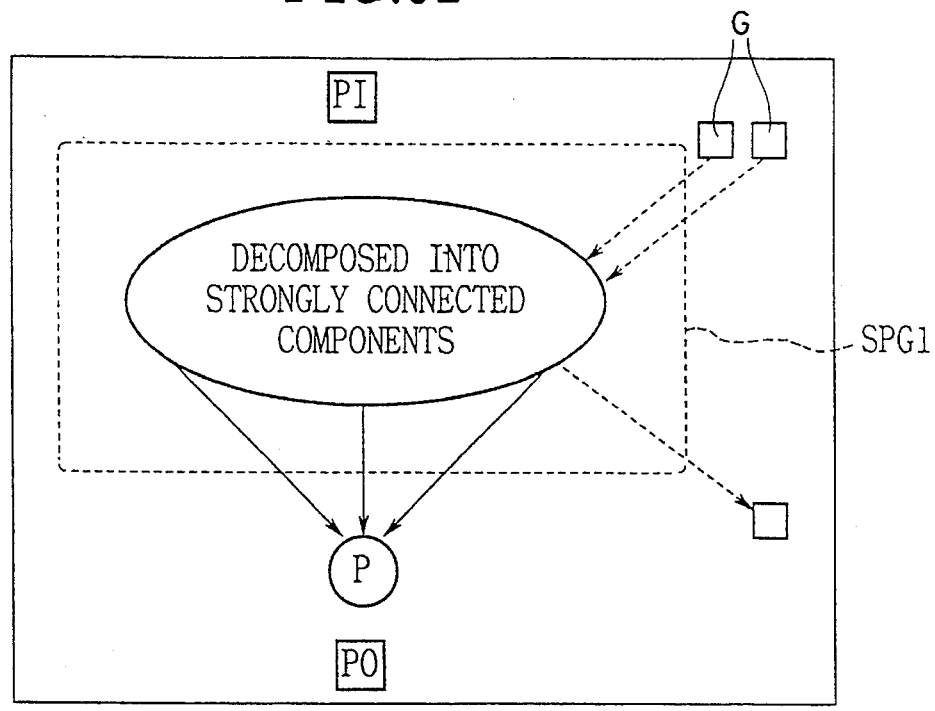
Figure 62:
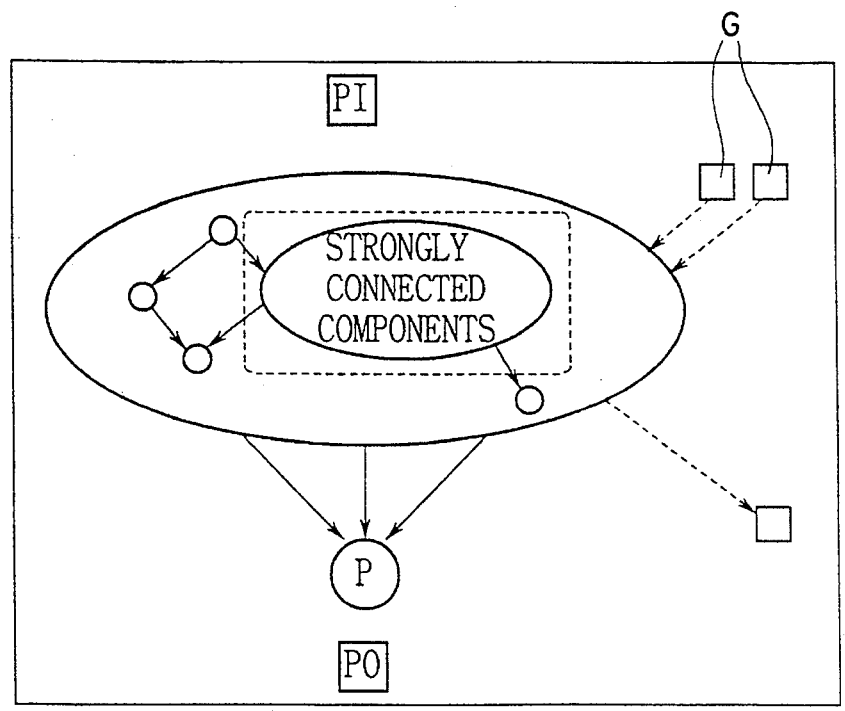

(3) Next, the modified partial graph SPG1 is decomposed into the strongly connected components as shown in FIG. 61, and this decomposition is recursively applied to any remaining strongly connected components having more than one primitives as shown in FIG. 62, to obtain a loopless partial graph SPG2.

Figure 63:
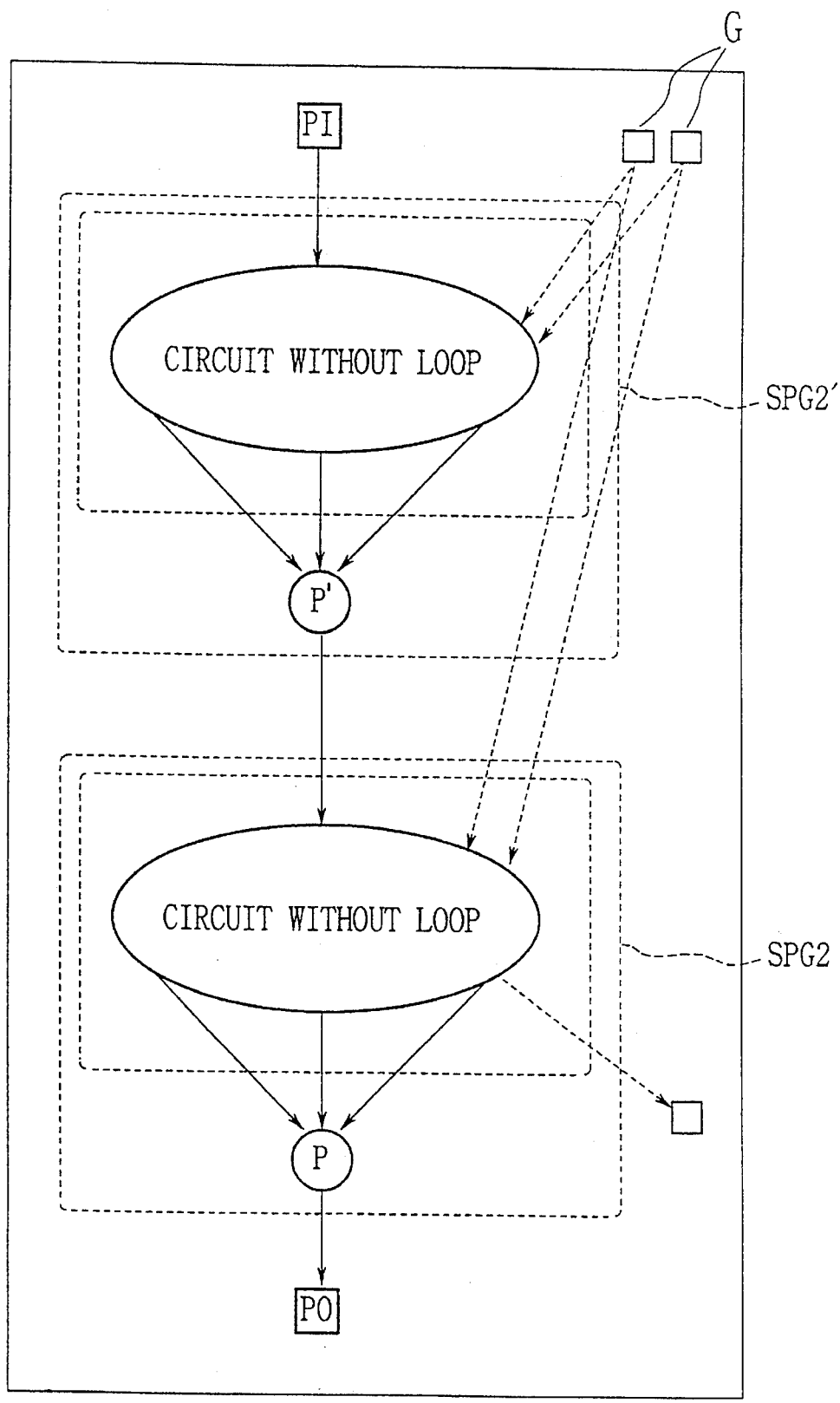

(4), Then, as shown in FIG. 63, this loopless partial graph SPG2 is duplicated as another loopless partial graph SPG2', and the input branches corresponding to the input branches for the loopless partial graph SPG2 are added as the input branches for the loopless partial graph SPG2' from the primitives G located outside of the loopless partial graphs SPG2 and SPG2'. In addition, the branch from the primitive P' of the loopless partial graph SPG2' to the primitive which originally received the output of the primitive P in the loopless partial graph SPG2, the branch from the input primitive PI to the primitive of the loopless partial graph SPG2' corresponding to the primitive which originally received the output of the primitive P, and the branch from the primitive P of the loopless partial graph SPG2 to the output primitive PO are added to the primitive graph.

In this generalized procedure, the number of primitives contained in the strongly connected component can be reduced by at least one, so that by iterating this procedure for all the remaining strongly connected component having more than one primitives, every strongly connected component can be made to have only one primitive eventually, to obtain the equivalent circuit without any loop.

The detection of the occurrence of the loop oscillation can be made by adding a primitive to compare the output signals of the primitives P and P' and an output primitive for the output of this added primitive, and monitoring the value of this output primitive by the host computer.

The conversion unit 15 then obtains the equivalent circuit model in which the equivalent circuit for the loop circuit portion is incorporated and the model transformation for the detection of the occurrence of the loop oscillation is applied, and supplies the obtained equivalent circuit model to the circuit model memory unit 12 as well as the simulation unit 11.

Thus, according to this third embodiment, it becomes possible to provide a logic simulation system capable of dealing with the simulation target logic circuit containing a loop, and detecting an occurrence of the loop oscillation in the simulation.

It is to be noted that the procedure for detecting an occurrence of the loop oscillation described above is applicable to any simulation algorithm for handling a loop, regardless of the use of the level sort scheme.

For example, in the software simulator, the process to convert the loop circuit portion into the equivalent circuit described above can be replaced by the following procedure.

Figure 64:
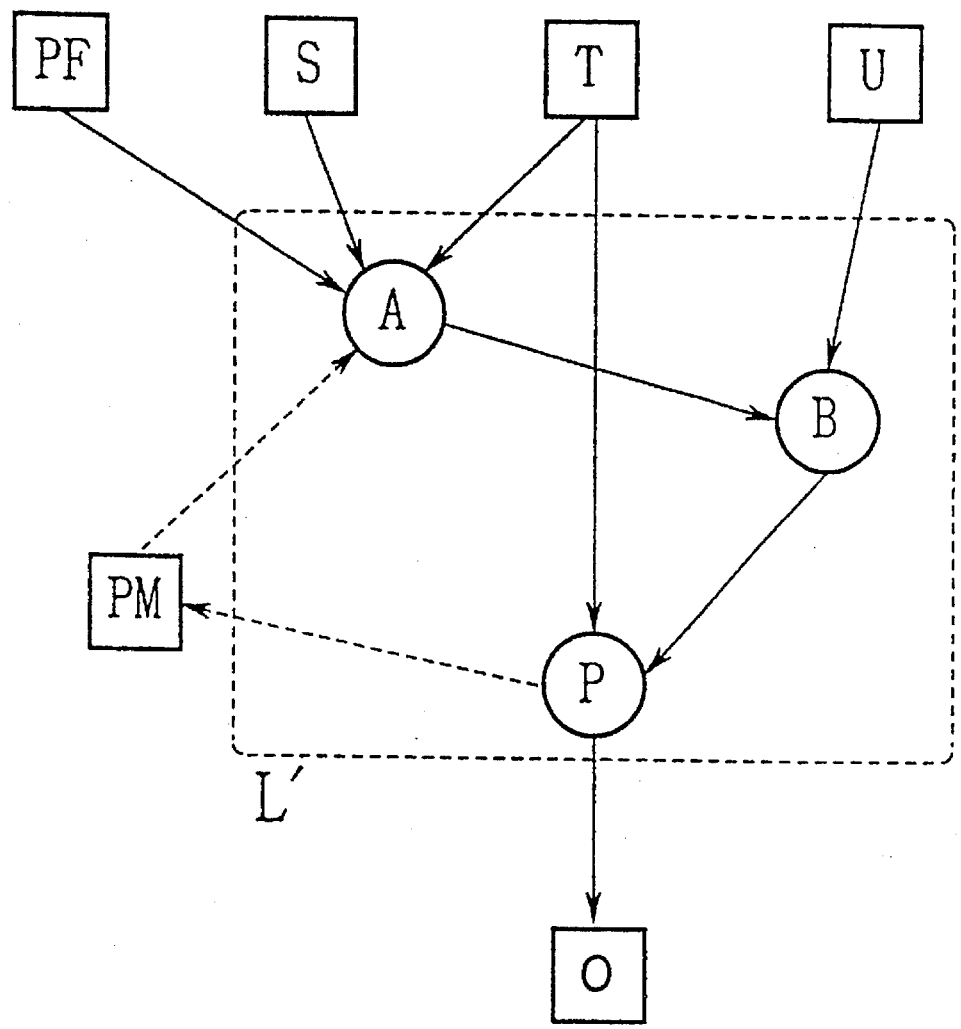
FIG. 64 is a diagram of an exemplary primitive graph for explaining a loop oscillation detection operation that can be carried out by a software simulator.

Namely, for the primitive graph shown in FIG. 64 which is obtained from the loop circuit portion in a manner similar to the primitive graph of FIG. 50 described above, the evaluation of a partial graph L' at a certain clock timing is carried out and the obtained value of the primitive P is registered in a primitive PM which functions as a memory. Then, when the value of the primitive PM is equal to the value of the primitive PF which is functioning as a flip flop for the primitive P, it can be judged that the loop oscillation does not occur and the simulation result is correct. n the other hand, when the value of the primitive PM differs from the value of the primitive PF, the partial graph L' is re-evaluated by using the value of the primitive PM instead of the value of the primitive PF. Then, when the value of the primitive P obtained by this re-evaluation is equal to the value of the primitive PM, it can be judged that the loop oscillation does not occur, whereas when the value of the primitive P obtained by this re-evaluation differs from the value of the primitive PM, it can be judged that the loop oscillation occurs.

It is also to be noted that although the third embodiment has been described for a case of using the binary value signals, it can readily be extended to a case of using the multi-value signals.

It is further to be noted here that, besides those already mentioned above, many modifications and variations of the above embodiments may be made without departing from the novel and advantageous features of the present invention. Accordingly, all such modifications and variations are intended to be included within the scope of the appended claims.

What is claimed is:

1. A logic simulation system for simulating a simulation target logic circuit, comprising:

a host computer having data of the simulation target divided into a plurality of sections defining different simulation phases to be executed sequentially in time division;

an emulator for emulating the simulation target, including:

a plurality of programmable emulation chip means for mapping the simulation target, each emulation chip means having memory means with a plurality of memory banks provided in correspondence to said plurality of sections for registering mapping data specifying a function to be realized by said each emulation chip means in emulating each of said plurality of sections;

programmable network means for interconnecting said plurality of emulation chip means; and emulation control means for controlling said plurality of emulation chip means and the network means by sequentially switching the memory banks of the memory means of said each emulation chip means and changing connections among said plurality of emulation chip means provided by the network means in emulating each of said plurality of sections; and interface means for interfacing the host computer and the emulator.

2. The system of claim 1, wherein the interface means temporarily stores a simulation result obtained by executing each simulation phase at the emulator, and supplies the temporarily stored simulation result to the emulator as an input for another simulation phase to be executed next.

3. The system of claim 1, wherein said each emulation chip means is formed by a plurality of interconnected programmable emulation elements.

4. The system of claim 3, wherein said each emulation chip means comprises a field programmable gate array.

5. The system of claim 3, wherein each of said plurality of emulation elements comprises a universal element representing a universal function.

6. The system of claim 3, wherein the memory means of said each emulation chip means is distributed over said plurality of emulation elements.

7. The system of claim 3, wherein said each emulation chip means has cross-bar switches for interconnecting said plurality of emulation elements in a multi-stage cross-bar connection.

8. The system of claim 7, wherein each of the cross-bar switches has a memory element with a plurality of banks provided in correspondence to said plurality of sections for registering data specifying the connections among said plurality of emulation elements in emulating each of said plurality of sections, and the emulation control means controls said each emulation chip means by sequentially switching the banks of the memory element of said each of the cross-bar switches while sequentially switching the memory banks of said each emulation chip means in emulating each of said plurality of sections.

9. The system of claim 1, wherein the network means has a memory element with a plurality of banks provided in correspondence to said plurality of sections for registering data specifying the connections among said plurality of emulation chip means in emulating each of said plurality of sections, and the emulation control means controls the network means by sequentially switching the banks of the memory element of the network means in emulating each of said plurality of sections.

10. The system of claim 1, wherein the network means comprises cross-bar switches for interconnecting said plurality of emulation chip means in a multi-stage cross-bar connection.

11. A logic simulation system for simulating a simulation target logic circuit, comprising:

input conversion means for converting the simulation target logic circuit into a primitive graph formed by a plurality of primitives connected by branches;

separation means for separating a combinational circuit portion and a state memory portion of the simulation target logic circuit in the primitive graph obtained by the input conversion means;

loop detection means for decomposing the primitive graph of the combinational circuit portion separated by the separation means into strongly connected components, and detecting those strongly connected components containing more than one primitives as loop circuit portions;

loop conversion means for converting each loop circuit portion detected by the loop detection means into an equivalent loopless circuit; and simulator means for executing a simulation operation on an equivalent circuit model of the simulation target logic circuit in which said each loop circuit portion detected by the loop detection means is replaced by the equivalent loopless circuit obtained by the loop conversion means.

12. The system of claim 11, wherein the loop conversion means converts said each loop circuit portion into the equivalent loopless circuit by:

removing one output branch from a primitive P to a primitive A in said each loop circuit portion to obtain a circuit L1;

generating a primitive PF for storing a previous output value of the primitive P;

duplicating the circuit L1 to obtain a circuit L1' having an identical structure as the circuit L1 and containing primitives P' and A' corresponding to the primitives P and A of the circuit L1;

connecting input branches identical to those of the primitives of the circuit L1 to the primitives of the circuit L1'; and connecting an output branch from the primitive P' of the circuit L1' to the primitive A of the circuit L1, an output branch of the primitive PF to the primitive A' of the circuit L1' and an input branch of the primitive PF to the primitive P of the circuit L1 to obtain the equivalent loopless circuit.

13. The system of claim 12, further comprising means for detecting a loop oscillation by attaching a primitive X for indicating an occurrence of a loop oscillation when output values of the primitives P and P' in the equivalent loopless circuit obtained at the loop conversion means are not equal to each other, to the equivalent loopless circuit obtained at the loop conversion means.

14. A method for simulating a simulation target logic circuit, comprising the steps of:

dividing the simulation target into a plurality of sections defining different simulation phases;

mapping the simulation target onto an emulator formed by a plurality of programmable emulation chip means interconnected by a programmable network means; and executing the different simulation phases sequentially in time division, by sequentially controlling said plurality of emulation chip means and the network means to emulate each of said plurality of sections.

15. The method of claim 14, wherein a simulation result obtained by executing each simulation phase at the emulator is temporarily stored in interface means, and the temporarily stored simulation result is supplied from the interface means to the emulator as an input for another simulation phase to be executed at the emulator next.

16. The method of claim 14, wherein each emulation chip means has memory means with a plurality of memory banks provided in correspondence to said plurality of sections for registering mapping data specifying a function to be realized by said each emulation chip means in emulating each of said plurality of sections, and said plurality of emulation chip means and the network means are controlled by sequentially switching the memory banks of the memory means of said each emulation chip means and changing connections among said plurality of emulation chip means provided by the network means in emulating each of said plurality of sections at the executing step.

17. The method of claim 14, wherein said each emulation chip means is formed by a plurality of programmable emulation elements interconnected by cross-bar switches for interconnecting said plurality of emulation elements in a multi-stage cross-bar connection, each of the cross-bar switches having a memory element with a plurality of banks provided in correspondence to said plurality of sections for registering data specifying the connections among said plurality of emulation elements in emulating each of said plurality of sections, and said each emulation chip means is controlled by sequentially switching the banks of the memory element of said each of the cross-bar switches while sequentially switching the memory banks of said each emulation chip means in emulating each of said plurality of sections at the executing step.

18. The method of claim 14, wherein the network means has a memory element with a plurality of banks provided in correspondence to said plurality of sections for registering data specifying the connections among said plurality of emulation chip means in emulating each of said plurality of sections, and the network means is controlled by sequentially switching the banks of the memory element of the network means in emulating each of said plurality of sections at the executing step.

19. The method of claim 14, wherein said plurality of emulation chip means are interconnected in a multi-stage connection, and the mapping step further comprises the steps of:

converting the simulation target into a primitive graph formed by a plurality of primitives;

level sorting the primitive graph along a signal flow starting from an input side to assign levels to the primitives;

dividing the primitive graph into a plurality of connected components of the primitives in units of a prescribed number of the levels; and determining a mapping of each of said plurality of connected components onto said plurality of emulation chip means.

20. The method of claim 19, wherein at the determining step, the primitives of a large connected component which is larger than a size of each emulation chip means are mapped in an order of the levels of the primitives, starting from a lowest level.

21. The method of claim 19, wherein at the determining step, the primitives of a large connected component which is larger than a size of each emulation chip means are mapped by the steps of:

dividing the large connected component into smaller connected components by duplicating selected primitives of the large connected component; and mapping each smaller connected component onto one of said plurality of emulation chip means.

22. The method of claim 21, wherein at the step of dividing the large connected component, the selected primitives of the large connected component are those which are at a lowest level and having a greatest number of outputs to other primitives of the large connected component among the primitives of the large connected component.

23. The method of claim 21, wherein at the step of dividing the large connected component, the smaller connected components are obtained by separating the large connected component into separated components by replacing each selected primitive with said each selected primitive and said each selected primitive's own duplication, and combining the separated components to form each smaller connected component in a size smaller than the size of each emulator chip means.

24. The method of claim 19, wherein the level sorting step further comprises the steps of:
  separating a combinational circuit portion and a state memory portion of the simulation target logic circuit in the primitive graph obtained at the converting step;
  decomposing the primitive graph of the combinational circuit portion separated at the separating step into strongly connected components;
  detecting those strongly connected components obtained at the decomposing step which are containing more than one primitives as loop circuit portions;
  converting each loop circuit portion detected at the detecting step into an equivalent loopless circuit; and
  level sorting the primitive graph of the equivalent circuit model in which said each loop circuit portion detected at the detecting step is replaced by the equivalent loopless circuit obtained at the step of converting each loop circuit portion, along a signal flow starting from an input side to assign levels to the primitives.

25. The method of claim 24, wherein the step of converting each loop circuit portion into the equivalent loopless circuit further comprises the steps of:
  removing one output branch from a primitive P to a primitive A in said each loop circuit portion to obtain a circuit L1;
  generating a primitive PF for storing a previous output value of the primitive P;
  duplicating the circuit L1 to obtain a circuit L1' having an identical structure as the circuit L1 and containing primitives P' and A' corresponding to the primitives P and A of the circuit L1;
  connecting input branches identical to those of the primitives of the circuit L1 to the primitives of the circuit L1'; and
  connecting an output branch from the primitive P' of the circuit L1' to the primitive A of the circuit L1, an output branch of the primitive PF to the primitive A' of the circuit L1' and an input branch of the primitive PF to the primitive P of the circuit L1 to obtain the equivalent loopless circuit.

26. The method of claim 25, further comprising the step of detecting a loop oscillation by attaching a primitive X for indicating an occurrence of a loop oscillation when output values of the primitives P and P' in the equivalent loopless circuit obtained at the step of converting each loop circuit portion are not equal to each other, to the equivalent loopless circuit obtained at the loop conversion means.

* * * * *